United States Patent
Baarman et al.

(10) Patent No.: US 9,701,212 B2
(45) Date of Patent: Jul. 11, 2017

(54) INDUCTIVE CHARGING SYSTEM FOR ELECTRIC VEHICLE

(71) Applicant: Access Business Group International LLC, Ada, MI (US)

(72) Inventors: David W. Baarman, Fennville, MI (US); Sean T. Eurich, Holland, MI (US); William T. Stoner, Jr., Ada, MI (US); Joshua B. Taylor, Rockford, MI (US); Richard J. Weber, Grand Haven, MI (US)

(73) Assignee: Access Business Group International LLC, Ada, MI (US)

( * ) Notice: Subject to any disclaimer, the term of this patent is extended or adjusted under 35 U.S.C. 154(b) by 7 days.

(21) Appl. No.: 14/547,241

(22) Filed: Nov. 19, 2014

(65) Prior Publication Data

US 2015/0069967 A1 Mar. 12, 2015

Related U.S. Application Data

(62) Division of application No. 12/984,015, filed on Jan. 4, 2011, now Pat. No. 8,937,454.
(Continued)

(51) Int. Cl.
*H02J 7/00* (2006.01)
*H01F 27/42* (2006.01)
(Continued)

(52) U.S. Cl.
CPC ......... *B60L 11/182* (2013.01); *B60L 11/1829* (2013.01); *B60L 11/1833* (2013.01);
(Continued)

(58) Field of Classification Search
CPC ..................................................... H02J 7/025
(Continued)

(56) References Cited

U.S. PATENT DOCUMENTS

| 3,395,861 A | 8/1968 | Kindred |
| 3,596,397 A | 8/1971 | Colletti |

(Continued)

FOREIGN PATENT DOCUMENTS

| CN | 1653669 | 8/2005 |
| DE | 10 2007 033 654 | 4/2008 |

(Continued)

OTHER PUBLICATIONS

International Search Report and Written Opinion of the International Searching Authority for International Application No. PCT/US11/20075 mailed Sep. 20, 2011.

*Primary Examiner* — Edward Tso
*Assistant Examiner* — Ahmed Omar
(74) *Attorney, Agent, or Firm* — Warner Norcross & Judd LLP

(57) ABSTRACT

A charging system for an electric vehicle that assists in aligning a primary charging coil and a secondary coil. The system may include a wheel chock that raises the primary coil into alignment with the secondary coil when a tire enters the wheel chock. The system may include a primary that is recessed below the surface supporting the vehicle and is protected by a cover. The secondary coil may be protected and supported by a skid plate mounted to the vehicle. The system may include a charging circuit that is controlled by signals transmitted by a garage door opener transmitter or a garage door opener. The system may include sensors that detect the presence of an animal or object in the space between the primary coil and the secondary coil.

13 Claims, 57 Drawing Sheets

Related U.S. Application Data

(60) Provisional application No. 61/292,179, filed on Jan. 5, 2010.

(51) Int. Cl.

| | | |
|---|---|---|
| *B60L 11/18* | (2006.01) | |
| *H01F 38/14* | (2006.01) | |
| *H04B 5/00* | (2006.01) | |
| *H02J 7/02* | (2016.01) | |
| *G01R 29/08* | (2006.01) | |
| *H02J 5/00* | (2016.01) | |

(52) U.S. Cl.
CPC ...... *B60L 11/1846* (2013.01); *G01R 29/0814* (2013.01); *H01F 38/14* (2013.01); *H02J 5/005* (2013.01); *H02J 7/0042* (2013.01); *H02J 7/0052* (2013.01); *H02J 7/025* (2013.01); *H04B 5/0037* (2013.01); *H04B 5/0075* (2013.01); *B60L 2200/26* (2013.01); *B60L 2230/16* (2013.01); *B60L 2270/36* (2013.01); *Y02T 10/7005* (2013.01); *Y02T 10/7088* (2013.01); *Y02T 90/121* (2013.01); *Y02T 90/122* (2013.01); *Y02T 90/125* (2013.01); *Y02T 90/128* (2013.01); *Y02T 90/14* (2013.01); *Y02T 90/163* (2013.01); *Y02T 90/169* (2013.01); *Y04S 30/14* (2013.01)

(58) Field of Classification Search
USPC ......................................................... 320/108
See application file for complete search history.

(56) References Cited

U.S. PATENT DOCUMENTS

| | | |
|---|---|---|
| 4,078,799 A | 3/1978 | Lahr |
| 4,347,472 A | 8/1982 | Lemelson |
| 4,438,588 A | 3/1984 | Martin |
| 4,496,896 A | 1/1985 | Melocik et al. |
| 4,817,948 A | 4/1989 | Simonelli |
| 5,157,319 A | 10/1992 | Klontz et al. |
| 5,218,909 A | 6/1993 | Ng |
| 5,264,776 A | 11/1993 | Hulsey |
| 5,323,099 A | 6/1994 | Bruni et al. |
| 5,457,378 A | 10/1995 | Woody |
| 5,461,298 A | 10/1995 | Lara et al. |
| 5,461,299 A | 10/1995 | Bruni |
| 5,498,948 A | 3/1996 | Bruni et al. |
| 5,506,489 A | 4/1996 | Abbott et al. |
| 5,523,666 A | 6/1996 | Hoelzl et al. |
| 5,594,261 A | 1/1997 | Temple |
| 5,596,261 A | 1/1997 | Suyama |
| 5,606,237 A | 2/1997 | Biasotti et al. |
| 5,617,003 A | 4/1997 | Odachi et al. |
| 5,646,500 A | 7/1997 | Wilson |
| 5,654,621 A | 8/1997 | Seelig |
| 5,661,391 A | 8/1997 | Ito et al. |
| 5,703,461 A | 12/1997 | Minoshima et al. |
| 5,710,502 A | 1/1998 | Poumey |
| 5,719,483 A | 2/1998 | Abbott et al. |
| 5,821,731 A | 10/1998 | Kuki et al. |
| 5,850,135 A | 12/1998 | Kuki et al. |
| 6,109,186 A | 8/2000 | Smith et al. |
| 6,154,005 A | 11/2000 | Hyogo et al. |
| 6,157,162 A | 12/2000 | Hayashi et al. |
| 6,459,218 B2 | 10/2002 | Boys et al. |
| 6,525,510 B1 | 2/2003 | Ayano et al. |
| 6,619,342 B2 | 9/2003 | Graham et al. |
| 6,762,586 B2 | 7/2004 | Choi |
| 7,164,368 B1 | 1/2007 | Ireland |
| 7,243,053 B1 | 7/2007 | Small |
| 7,312,590 B1 | 12/2007 | Kovach, II et al. |
| 7,582,979 B2 | 9/2009 | Oyobe et al. |
| 2002/0158512 A1 | 10/2002 | Mizutani et al. |
| 2006/0266564 A1 | 11/2006 | Perlman |
| 2006/0284593 A1 | 12/2006 | Nagy et al. |
| 2007/0131505 A1 | 6/2007 | Kim |
| 2007/0139000 A1* | 6/2007 | Kozuma .................. H02J 5/005 320/108 |
| 2007/0283841 A1 | 12/2007 | Lopatinsky et al. |
| 2008/0011184 A1 | 1/2008 | Lopatinsky et al. |
| 2009/0091291 A1 | 4/2009 | Woody et al. |
| 2010/0117596 A1* | 5/2010 | Cook ..................... B60L 11/182 320/108 |
| 2010/0130096 A1 | 5/2010 | Baarman et al. |
| 2010/0156346 A1* | 6/2010 | Takada .................. B60L 11/182 320/108 |
| 2010/0174629 A1 | 7/2010 | Taylor et al. |
| 2011/0057606 A1* | 3/2011 | Saunamaki ............. H02J 7/025 320/108 |
| 2013/0300364 A1 | 11/2013 | Baier et al. |

FOREIGN PATENT DOCUMENTS

| | | |
|---|---|---|
| DE | 10 2007 059 046 | 4/2009 |
| EP | 1 849 508 | 10/2007 |
| EP | 1 944 851 | 7/2008 |
| EP | 2 105 179 | 9/2009 |
| EP | 2 196 351 | 6/2010 |
| EP | 2 345 553 | 7/2011 |
| EP | 2 412 560 | 2/2012 |
| EP | 2 431 214 | 3/2012 |
| JP | H06-153411 | 5/1994 |
| JP | H08-000838 | 1/1996 |
| JP | H08-502640 | 3/1996 |
| JP | H09-213378 | 8/1997 |
| JP | H09-215211 | 8/1997 |
| JP | 2000-152512 | 5/2000 |
| JP | 2008-087733 | 4/2008 |
| JP | 2008-120239 | 5/2008 |
| JP | 2008-172873 | 7/2008 |
| JP | 2008-172874 | 7/2008 |
| JP | 2008-220130 | 9/2008 |
| JP | 2009-106136 | 5/2009 |
| JP | 2009-112153 | 5/2009 |
| WO | 92/17929 | 10/1992 |
| WO | 00/54387 | 9/2000 |
| WO | 2005/053806 | 6/2005 |
| WO | 2008/140333 A2 | 11/2008 |
| WO | 2008/140333 A3 | 11/2008 |
| WO | 2009/054221 | 4/2009 |
| WO | 2009/150969 | 12/2009 |
| WO | 2011/117714 | 9/2011 |
| WO | 2012/028797 | 3/2012 |
| WO | 2012/058466 | 5/2012 |
| WO | 2012/084099 | 6/2012 |

\* cited by examiner

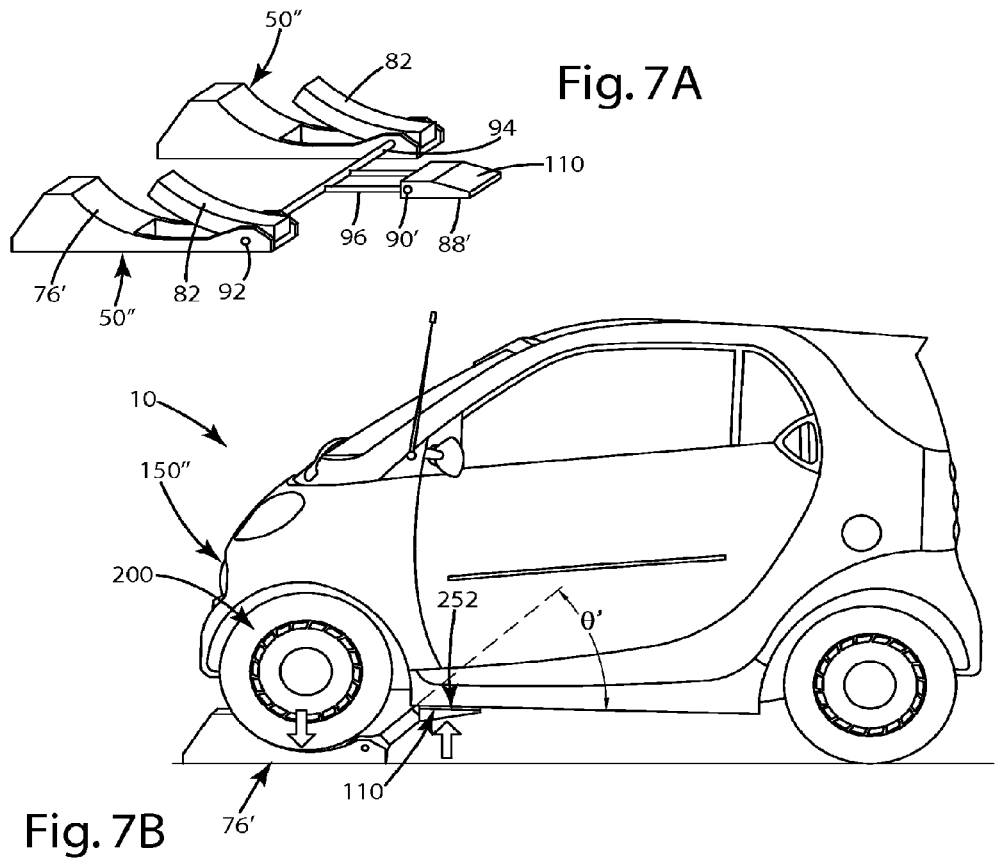
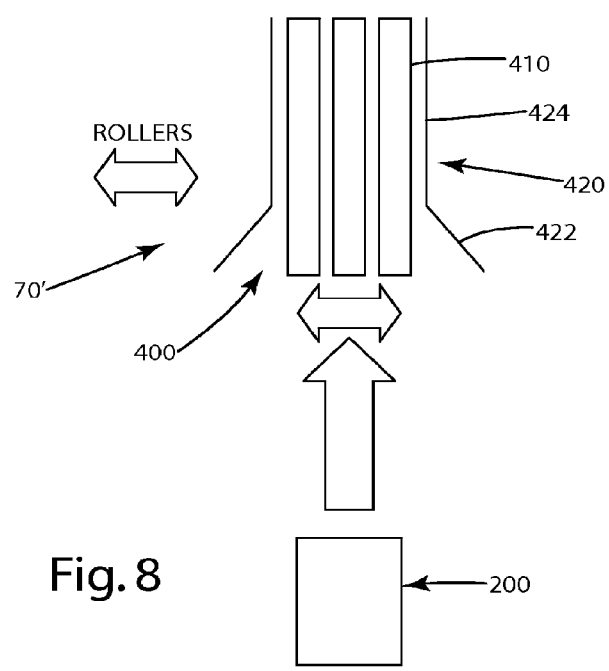

SECONDARY TEMPERATURE BOARD

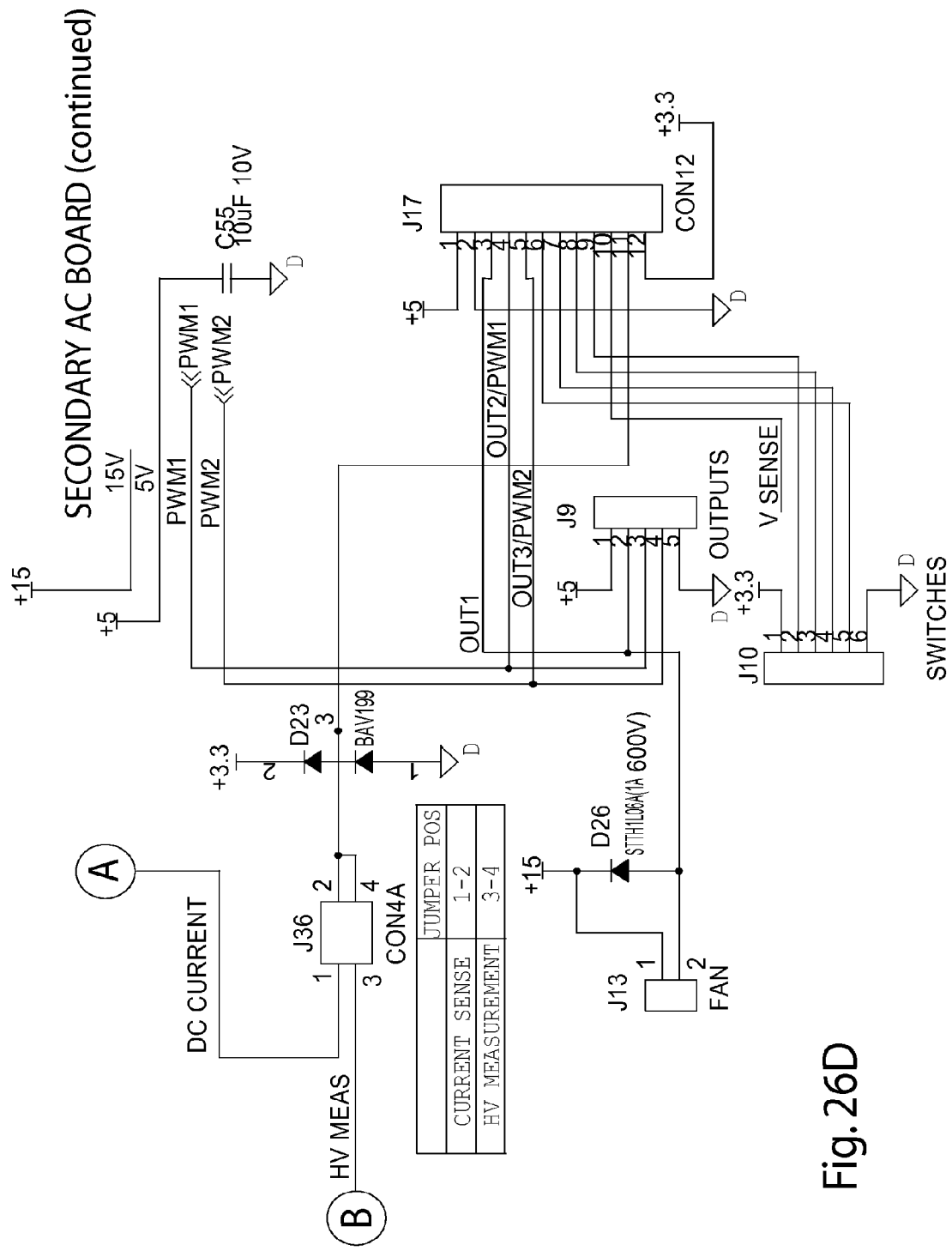

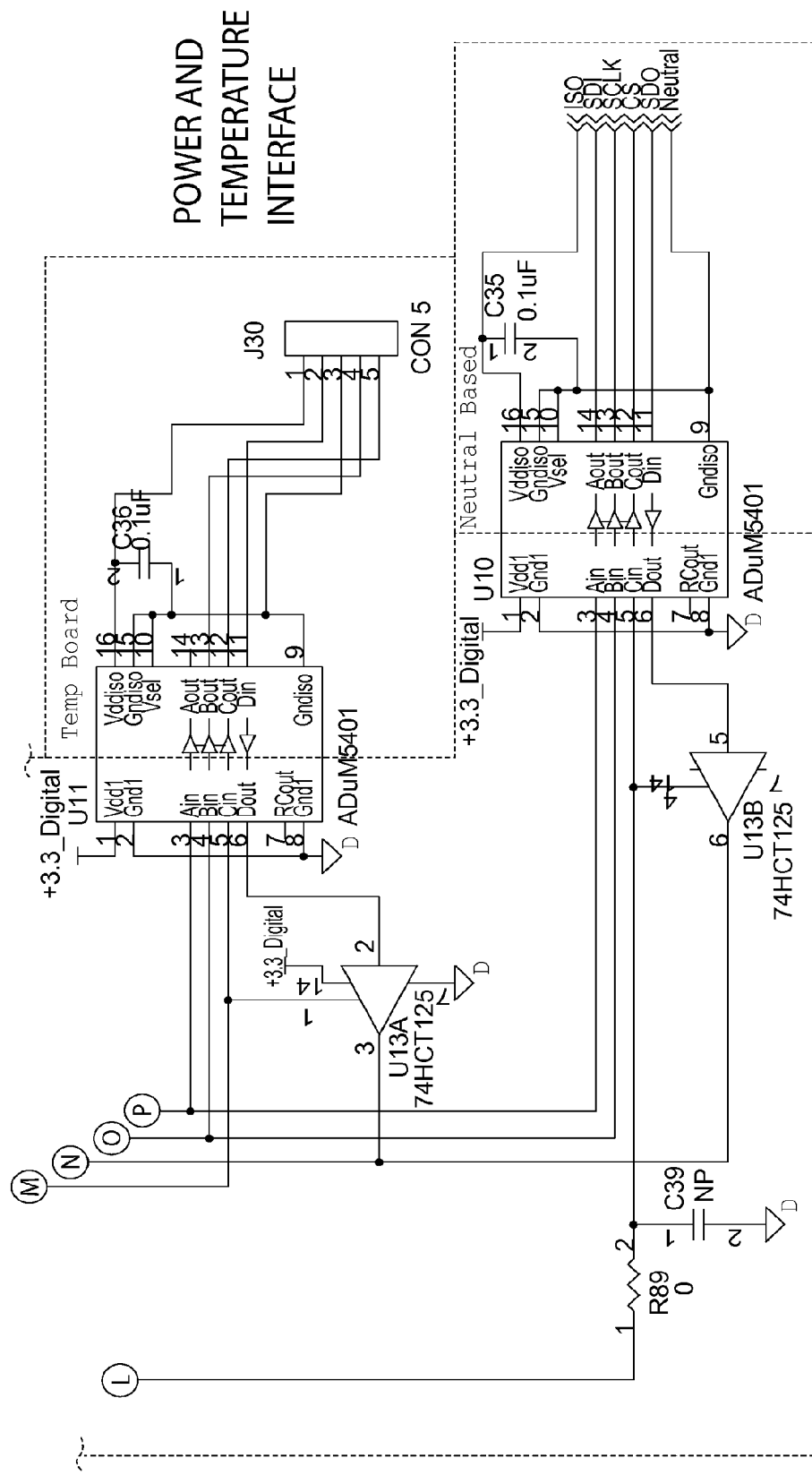

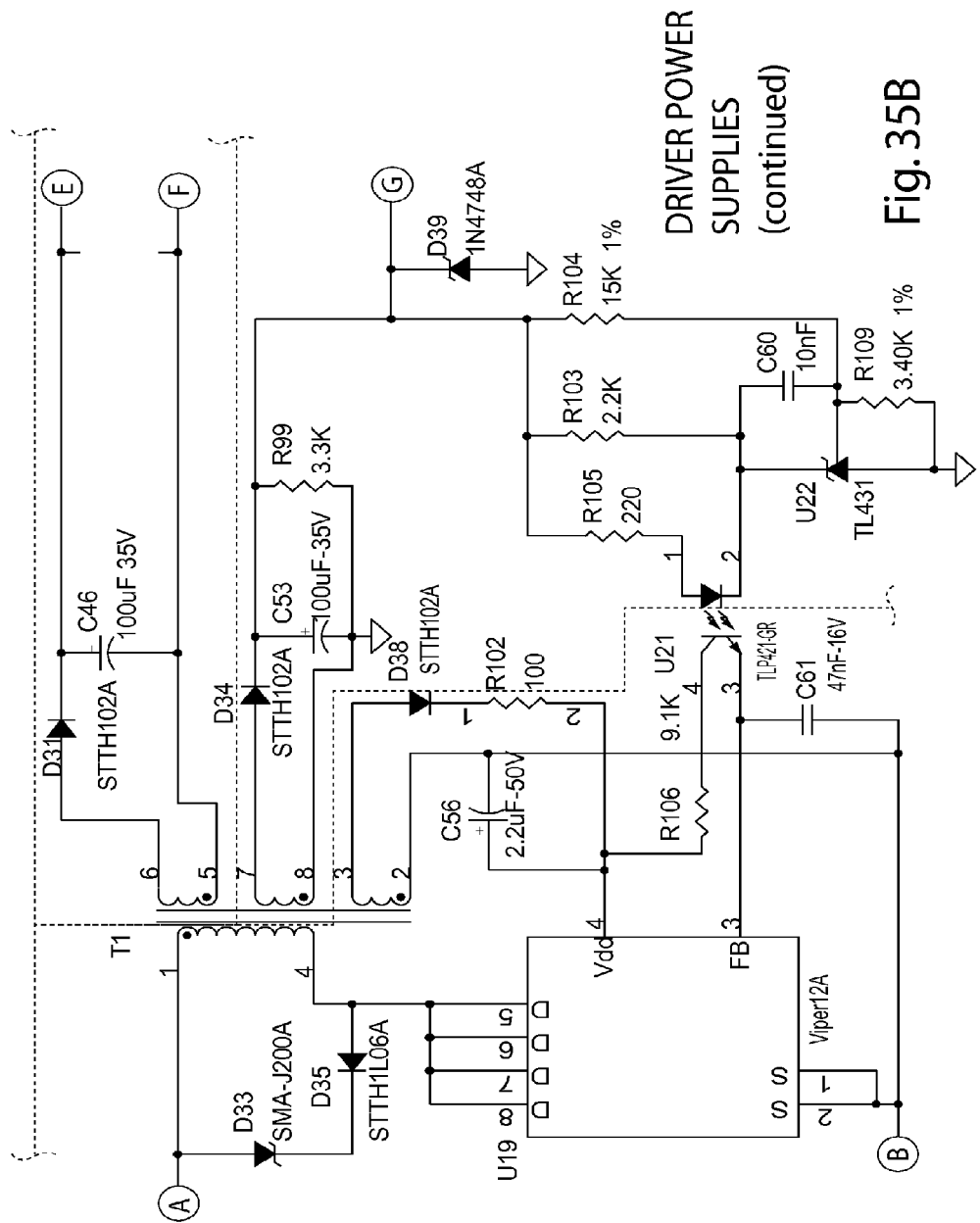

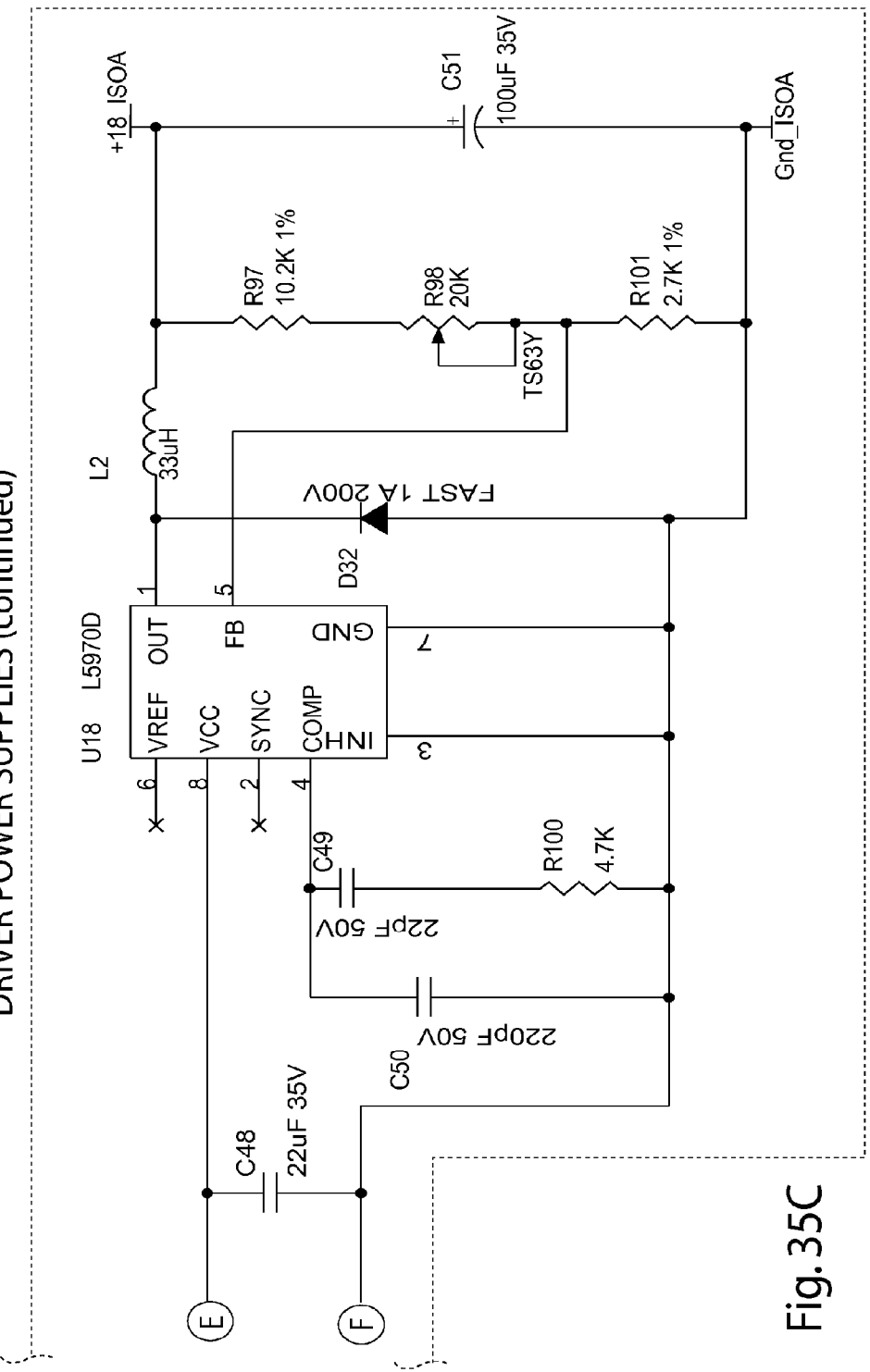

INDUCTIVE CHARGING SYSTEM FOR ELECTRIC VEHICLE

BACKGROUND OF THE INVENTION

The present invention relates to charging systems for electric vehicles and more particularly to charging system that provide improved alignment between the primary coil and the secondary coil.

Inductive power is used in a variety of vehicle charging applications. These systems include a primary charging coil connected to a power source and a secondary coil within the vehicle connected to a battery. Power is applied to the primary charging coil, which induces a current in the secondary coil to charge the battery. Inductive charging systems can experience efficiency issues if 1) the primary coil and secondary coil are not adequately aligned with one another and/or 2) the coils are not sufficiently proximate one another. Prior art designs include a variety of techniques for aligning the coils and/or moving the coils into physical proximity. Unfortunately, those designs are relatively complex and often include relatively delicate sensing and movement systems, which may require calibration and maintenance over time. Further, an animal or other moving object may wander between the primary and secondary coils, which may interfere with the efficiency of the coupling between the primary and secondary coil.

SUMMARY OF THE INVENTION

The aforementioned problems are overcome in the present invention in which an inductive charging system provides for safe, simple, and efficient charging of electric vehicles. In a first aspect of the invention, the charging system includes a primary coil within a wheel chock structure. When the wheels of the vehicle enter the wheel chock structure, a primary coil is moved automatically into position with respect to a secondary coil within the vehicle. For example, the wheel chock may include a lifting mechanism connected to the primary charging coil. As a vehicle enters the wheel chock, the weight of the wheel pushes a pedal forward. The movement of the pedal raises the primary charging coil into closer proximity to the secondary coil. The two coils are placed in position for inductive coupling and charging commences. When charging is complete, the vehicle exits the chock, the pedal pivots rearward and the primary charging coil uncouples from the secondary coil.

In a second aspect of the invention, the vehicle includes a mechanism for moving the secondary coil into position with respect to the primary charging coil.

In a third aspect of the invention, the primary charging coil is in fixed longitudinal registration with the wheel chock. The primary coil is located such that, when the wheels of the vehicle contact the wheel chock, the primary coil is aligned with the secondary coil in the vehicle. Additionally, the primary and secondary coils are generally horizontal or angled from horizontal to facilitate damage-free coupling and decoupling of the coils during movement of the vehicle into and out of the charging system.

In a fourth aspect of the invention, the charging system is controlled at least partially in response to signals sent from a garage door opener or a garage door opener transmitter. For example, the charger transitions into sleep mode to save power after a vehicle exits the wheel chock. When the vehicle returns, the user activates the garage door opener to open the garage door. The receiver in the charger receives the signal from either the garage door opener or the garage door opener transmitter, awakens, and readies for charging. The vehicle enters the chocks and the user activates the garage door opener to close the garage door. The receiver in the charger receives the signal from the garage door opener or the garage door opener transmitter and commences charging. When the user is ready to exit the garage, the user activates the garage door opener to open the garage door. The signal from the garage door opener or the garage door opener transmitter is received by the charger and charging is ceased.

In a fifth aspect of the invention, the wheel chock structure includes a lateral alignment mechanism for the vehicle wheel. The alignment mechanism includes rollers and wheel guides that automatically laterally align the wheels as the wheel enters the chock.

In a sixth aspect of the invention, the primary charging coil may be positioned within a protective non-conductive cover within the pavement or surface supporting the vehicle, for example, to facilitate snow-plowing over the primary coil. Additionally or as an alternative, the secondary charging coil may be positioned within a protective skid plate mounted to the vehicle.

In a seventh aspect of the invention, an animal detection and deterrent system may be incorporated into the charging system. The system may detect when an animal or other object has entered the charging area and may emit an audible alarm or other signal to encourage the animal to exit the charging area or to alert the vehicle owner of the interfering object.

These and other advantages and features of the invention will be more fully understood and appreciated by reference to the description of the current embodiments and the drawings.

BRIEF DESCRIPTION OF THE DRAWINGS

FIG. 7A is a perspective view of a fourth embodiment of the present invention;

FIG. 7B is a side view of a vehicle docked in the charger of the fourth embodiment;

FIG. 8 is a top plan view of a lateral wheel alignment mechanism;

FIG. 26D is a fourth part of a circuit diagram of a secondary AC board;

FIG. 30F is a sixth part of a circuit diagram of a digital interface;

FIG. 35B is a second part of a circuit diagram of a power supply for the switch drivers;

FIG. 35C is a third part of a circuit diagram of a power supply for the switch drivers;

DESCRIPTION OF THE CURRENT EMBODIMENTS

I. First Embodiment

Figure 1:
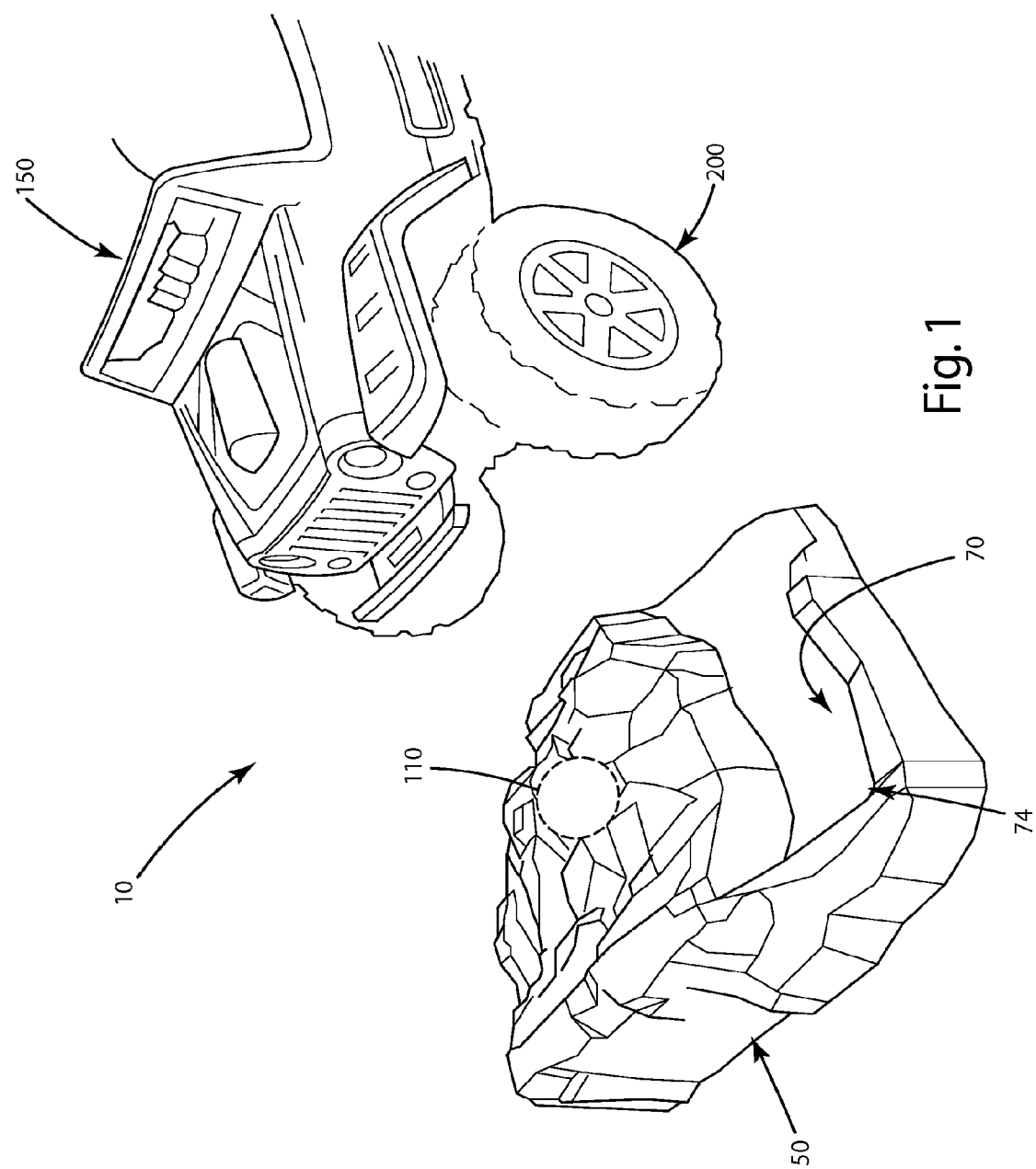
FIG. 1 is a perspective view of a first embodiment of the charging system of the present invention with a vehicle approaching the system.

A first embodiment of the inductive vehicle charging system of the present invention is illustrated in the drawings and generally designated 10. The charging system 10 includes wheel chocks 50 and a vehicle 150. The wheel chocks 50 include alignment tracks 70 and a charging circuit 100. The vehicle 150 includes wheels 200 that align with the alignment tracks 70. The vehicle 150 includes a battery circuit 250.

Figure 2:
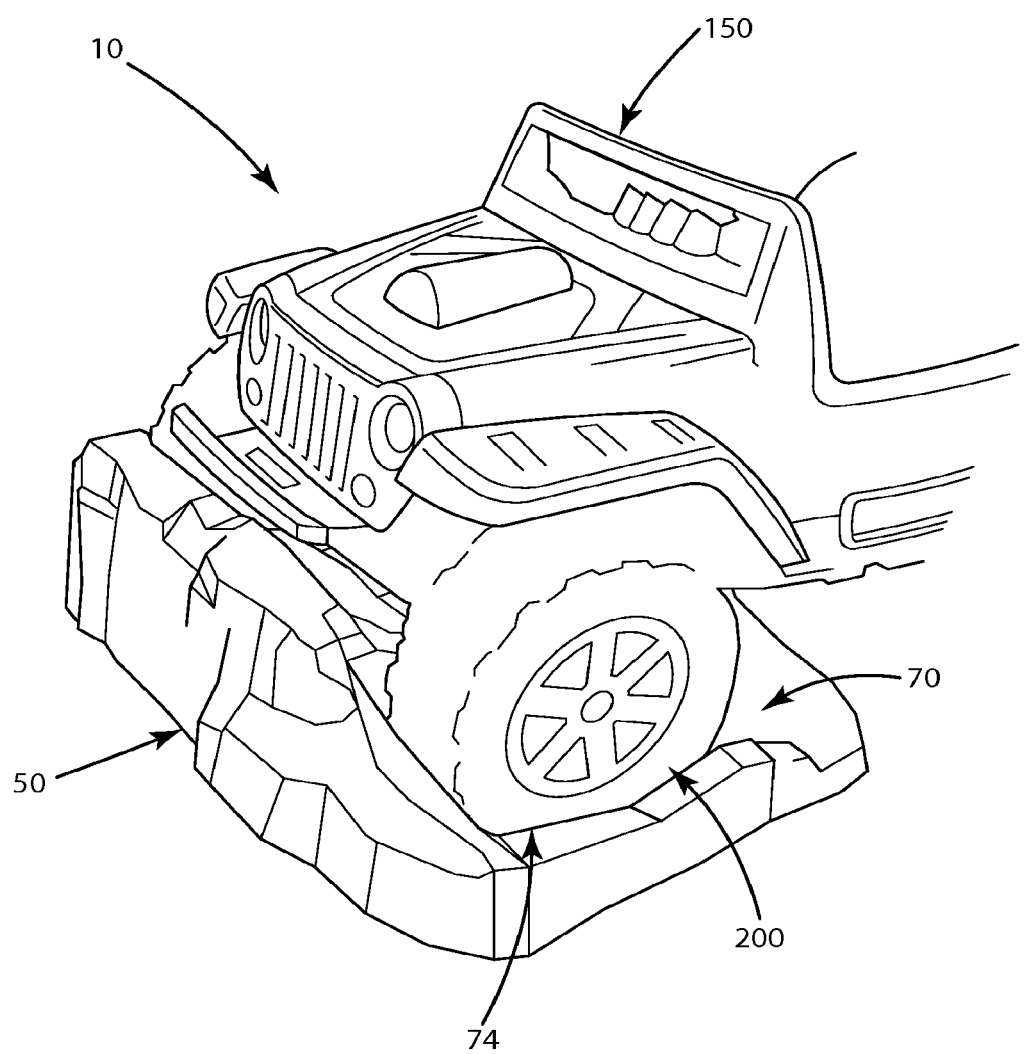
FIG. 2 is a perspective view of the charging system of FIG. 1 showing the vehicle in the chock.
Figure 3:
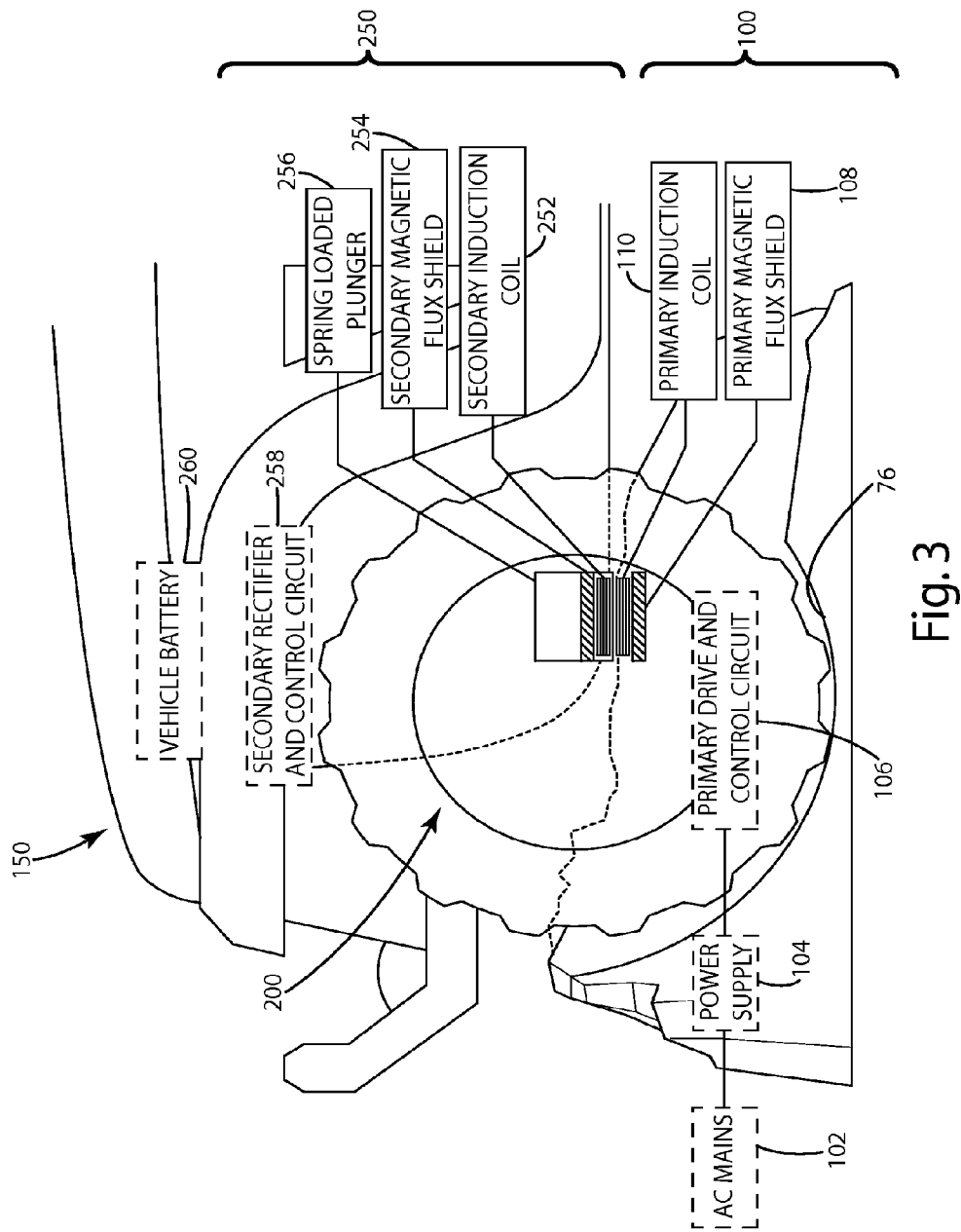
FIG. 3 is an enlarged side view of the charging system of FIG. 1.

As shown in FIGS. 1-3, the charging system 10 includes wheel chocks 50, alignment tracks 70, a primary charging coil 110, and a secondary coil 252. In FIG. 1, a toy vehicle 150 is shown with the wheels 200 aligned with the alignment tracks 70 as the toy vehicle 150 approaches the wheel chocks 50. The wheels 200 of the toy vehicle 150 enter the alignment tracks 70 and the toy vehicle 150 proceeds forward. The alignment tracks 70 terminate at front walls 74. After the wheels 200 contact the front walls 74 of the alignment tracks 70, the forward movement of the toy vehicle 150 is impeded. Optionally, as shown in FIG. 3, the alignment tracks 70 may include wells 76 such that a driver of the vehicle 150 may be able to feel when the wheels 200 are within the wells 76.

Further optionally, as shown in FIG. 8, the alignment tracks 70' may include an automatic wheel lateral alignment mechanism 400. Wheel alignment mechanism 400 includes lateral rollers 410 and wheel guides 420. Lateral rollers 410 rotate about axes that are parallel to the direction of travel of the wheels 200. As the wheels 200 enter the wheel chock 50, the wheels 200 ride on the lateral rollers 410. The lateral rollers 410 permit the wheels 200 to move laterally. Wheel guides 420 include angled portions 422 and straight portions 424. As the vehicle 150 moves forward, the angled portions 424 of wheel guides 420 urge the wheels 200 toward the middle of the wheel guides 420. As vehicle 150 continues to move forward, the straight portions 424 of the wheel guides 420 maintain the wheels 200 in the middle of the wheel guides 420.

As shown in FIG. 3, the wheel chock 50 is designed such that, when the wheels 200 are against front walls 74 and/or within wells 76, the primary charging coil 110 is longitudinally and laterally aligned with the secondary coil 252 within vehicle 150. The wells 76 allow the secondary coil 252 to approach the primary charging coil 110 from an elevation above the primary charging coil 110 and gradually lower into an alignment position. Optionally, the wheel chock 50 may provide alignment of the coils 110, 252 only in the two lateral directions of vehicle travel. As shown in FIG. 3, after the wheel 200 is securely in the wheel chock 50, a spring loaded plunger 256 connected to the secondary coil 252 may lower the secondary coil 252 to a proper vertical alignment with the primary charging coil 110. Further optionally, the plunger 256 may be lowered using pneumatic power, hydraulic power or any other method suitable for the application. Further optionally, the primary coil may be raised using a corresponding plunger powered by any of the above methods. Charging may commence after the primary charging coil 110 and secondary coil 252 are in proper alignment. When charging is complete, the vehicle 150 may back out of the wells 76 and exit the wheel chock 50. As shown in FIGS. 1 and 2, the wheel chock 50 may be designed to imitate natural terrain and hide the primary charging coil 110.

The electrical components of the charging circuit 100 and the battery circuit 250 are shown in FIG. 3. An AC mains 102 is electrically connected to a power supply 104. The power supply 104 is electrically connected to a primary drive and control circuit 106. The power supply 104 and the primary drive and control circuit 106 may be located within the wheel chock 50 or in any other suitable location. The power supply 104 converts the power coming from the AC mains 102 to a useable power source for the primary drive and control circuit 106. The primary drive and control circuit 106 is electrically connected to the primary charging coil 110. The primary charging coil 110 is inductively coupled with the secondary coil 252. The primary charging coil 110 transfers electrical power to the secondary coil 252 by electromagnetic induction when a voltage is applied across the primary charging coil 110. The secondary coil 252 is electrically connected to a secondary rectifier and control circuit 258. The secondary rectifier and control circuit 258 is electrically connected to a battery 260 within the vehicle 150. The secondary rectifier and control circuit 258 converts the electrical power transferred from the primary charging coil 110 to the secondary coil 252 into useable power for the battery 260. The primary magnetic flux shield 108 is located adjacent the primary charging coil 110 and the secondary magnetic flux shield 254 is located adjacent the secondary coil 252. The primary and secondary shields 108, 254 protect the components of the charging circuit 100 and battery circuit 250 from magnetic interference from the coils 110, 252 and limit losses during charging.

Figure 4:
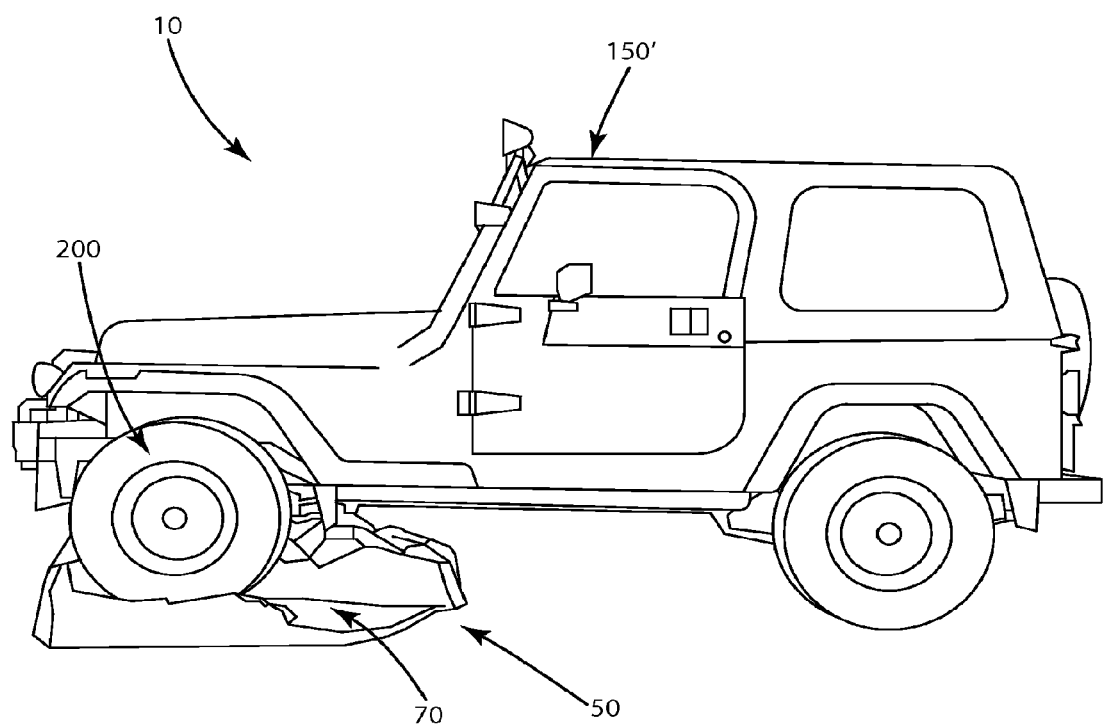
FIG. 4 is a side view of the charging system of FIG. 1 and a docked vehicle.

As shown in FIG. 4, the charging system 10 described above with regard to a toy vehicle 150 may be used with virtually any size or type of vehicle, including a conventional automobile 150'. Optionally, the charging system may be used for any vehicle including but not limited to a bus, a taxi, an airplane, a golf cart, a scooter or a recreational vehicle. Further optionally, the charging electronics may communicate with the vehicle electrical system to accomplish various functions such as shutting off the vehicle, placing the vehicle in park, or locking out vehicle operation. Vehicle lock out may be for the purpose of preventing theft, tampering by a child, or preventing operation of the vehicle before a desired charge level is achieved. A lockout override could be provided for example through a key, an electronic key fob, or electronic keypad.

II. Second Embodiment

Figure 5:
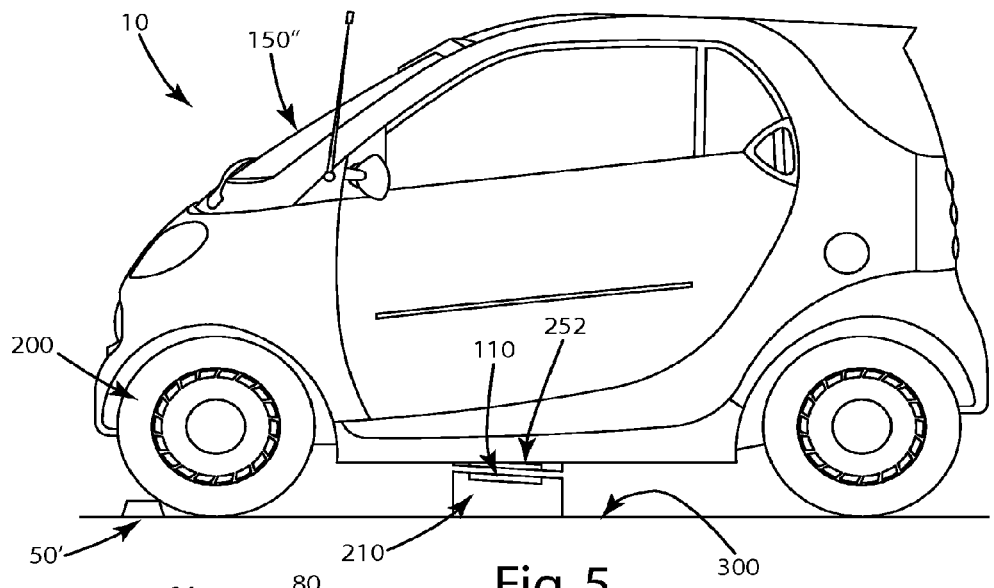
FIG. 5 is a side view of a second embodiment of the present invention.

A second embodiment of the present invention is shown in FIG. 5. In this embodiment, the primary charging coil 110 is separated from the wheel chocks 50' and mounted on a charging block 210. The vehicle 150" moves forward until the wheels 200 contact the wheel chocks 50' and the forward movement of the vehicle 150" is impeded. This embodiment is designed such that, when the wheels 200 contact the wheel chocks 50', the primary charging coil 110 and secondary coil 252 are in proper inductive charging alignment relative to one another. As shown in FIG. 5, the primary charging coil 110 and secondary coil 252 are generally horizontal, but at a slight angle relative to the road surface 300. This allows the secondary coil 252 to couple with and uncouple from the primary charging coil 110 during relative longitudinal movement of the vehicle and the charger. This arrangement also prevents damage to the coils 110, 252 if the vehicle 150" unexpectedly moves rearward during charging.

III. Third Embodiment

Figure 6A:
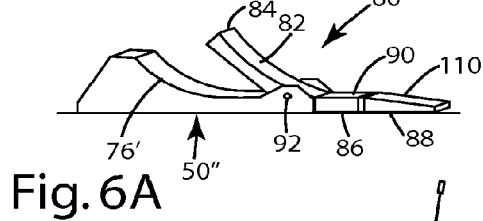
FIG. 6A is a perspective view of a third embodiment of the present invention.
Figure 6B:
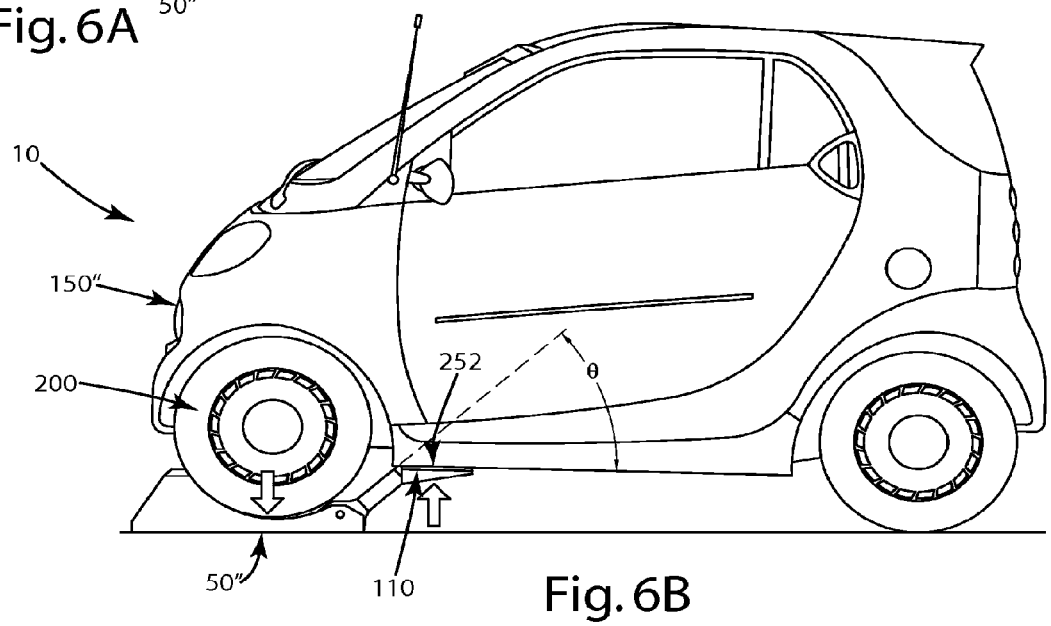
FIG. 6B is a side view of a vehicle docked in the charger of the third embodiment.

A third embodiment of the invention is shown in FIGS. 6a and 6b. In this embodiment, the wheel chock 50" includes a well 76' and a hinge pin 92. A charging pedal 80 is hingedly connected to wheel chock 50" at hinge pin 92. The charging pedal 80 includes a curved, rigid lever 82 with a forward portion 84 and a rearward portion 86. A primary coil platform 88 is hingedly connected to the lever 82 with hinge 90. Within hinge 90 is a hinge stop that prohibits the primary coil platform 88 from pivoting about hinge 90 past a predetermined platform angle $\theta$ relative to the rearward portion 86 of lever 82. Optionally, any other suitable device to prohibit platform 88 from pivoting about hinge 90 past platform angle $\theta$ may be used. Platform angle $\theta$ will be further described below. The primary charging coil 110 is positioned on the top surface of primary coil platform 88.

If a vehicle 150" is not present, the wheel chock 50" will have the orientation shown in FIG. 6a. As the wheel 200 of a vehicle 150" enters the well 76', the weight of the vehicle 150" causes the forward portion 84 of the lever 82 to pivot about hinge pin 92 and rotate forward and downward relative to the wheel chock 50". As the forward portion 84 moves forward and downward, the rearward portion 86 pivots about hinge pin 92, moving forward and upward relative to the wheel chock 50". As the rearward portion 86 of the lever 82 pivots about hinge pin 92, the rearward portion 86 elevates primary coil platform 88 off the ground. The primary coil platform 88 pivots about hinge 90 and forms a platform angle $\theta$ relative to the rearward portion 86.

The vehicle 150" moves forward until the wheels 200 are centered in the well 76' and the forward movement of the vehicle 150" is impeded.

The predetermined platform angle θ is calculated such that, when the wheel 200 is centered in the well 76', the rearward portion 86 of the lever 82 will position the primary charging coil 110 at the proper alignment with respect to the secondary coil 252. This orientation is shown in FIG. 6*b*. At this point, charging may commence. Charging may be activated manually or, optionally, may be automatic based on a sensor (not illustrated) detecting the rotational movement of lever 82, the linear position of the vehicle 150", or any other motion or physical location suitable to activating charging.

Alternatively, the platform angle θ may be self aligning for example using a spring-loaded hinge (not shown). As the platform is lifted up, the platform will contact the bottom of the vehicle. As the lever continues to push the platform up, the platform pivots on the spring-loaded hinge. The self-aligning spring-loaded hinge option facilitates close contact between the surface of the platform and the receiving location on the vehicle.

When charging is complete, the vehicle 150" may back out of the well 76', which transfers the weight of the vehicle from the forward portion 84 of the lever 82 to the rearward portion 86 of the lever 82. This causes the rearward portion 86 to pivot about hinge pin 92, moving rearward and downward relative to the wheel chock 50". At the same time, the forward portion 84 of the lever 82 pivots about hinge pin 92, moving rearward and upward relative to the wheel chock 50". After the wheel 200 of the vehicle 150" has completely exited the well 76', the wheel chock 50" will return to the orientation shown in FIG. 6*a*. Optionally, hydraulic linkages may raise the primary charging coil 110 into alignment with the secondary coil 252 after the wheel 200 enters the wheel chock 50" and exerts force on a hydraulic piston. Further optionally, pneumatic linkages may raise the primary charging coil 110 into alignment with the secondary coil 252 after the wheel 200 enters the wheel chock 50" and exerts force on a hydraulic piston.

IV. Fourth Embodiment

A fourth embodiment is shown in FIGS. 7*a* and 7*b*. This embodiment includes two wheel chocks 50" aligned to receive the two front wheels 200 of a vehicle 150". A cross bar 94 rigidly connects the two pedals 82. The cross bar 94 is rigidly connected to a primary coil extension 96. In the embodiment shown in FIG. 7*a*, the primary coil extension 96 is located at the approximate midpoint between the pedals 82. Optionally, the primary coil extension 96 may be located at any point between the pedals 82. Further optionally, the primary coil extension 96 may be aligned with a pedal 82 or may be located outside of the space between pedals 82. The primary coil extension 96 is hingedly attached to the primary coil platform 88' with hinge 90'. The hinge 90' includes a hinge stop to prohibit the primary coil platform 88' from pivoting past a predetermined platform angle θ' relative to the primary coil extension 96. Optionally, any other suitable device to prohibit the primary coil platform 88' from pivoting past the platform angle θ' may be used. The primary charging coil 110 is located on the top surface of the primary coil platform 88'.

When the front wheels 200 of a vehicle 150" enter the wheel chocks 50", levers 82 pivot about hinge pin 92. The pivoting of the levers 82 causes the cross bar 94 to rotate. The rotation of the cross bar 94 causes the primary coil extension 96 to rotate. As the primary coil extension 96 rotates, the primary coil platform 88' pivots about hinge 90.

After the platform angle θ' reaches the predetermined value, the hinge stop engages and prohibits further pivoting of the primary coil platform 88' relative to primary coil extension 96. As the levers 82 continue to pivot about the hinge pin 92 under the weight of the wheels 200, the primary coil platform 88' is raised off the ground. The platform angle θ' and the length of primary coil extension 96 are calculated such that, when the wheels 200 are centered in the wells 76', the primary charging coil 110 is brought into proper charging alignment with the secondary coil 252. This orientation is shown in FIG. 7*b*. At this point, charging may commence. As described with regard to FIGS. 6*a* and 6*b*, charging may be activated manually or automatically. When charging is complete, the vehicle 150" may back out of the wells 76'. This will return the wheel chocks 50" to the orientation shown in FIG. 7*a*, as described with regard to FIGS. 6*a* and 6*b*. The previously described self-aligning platform including a spring-loaded hinge may be used in this embodiment as well.

The inductive charging system 10 may be positioned at any location where vehicles come to a stop for a period of time. For example, the chocks may be located in a parking spot and require the user to provide a method of payment to commence charging. The charging system may also be located in a residential garage.

V. Fifth Embodiment

A fifth embodiment includes a charging circuit receiver that controls the readying, activation, and deactivation of the charging system 10 with signals sent from the garage door opener or the garage door opener transmitter. The charging circuit 100 may transition into a sleep mode to save power after a vehicle 150 exits the wheel chocks 50 and exits the garage. For example, after a vehicle exits the garage, a radio frequency or other signal from the garage door opener transmitter may simultaneously activate the garage door opener to close the garage door and deactivate the charging circuit, placing it in a low power sleep mode. Optionally, a signal from the garage door opener transmitter to open the garage door when the vehicle 150 is in the garage may deactivate the charger and a separate signal from the garage door opener transmitter to close the garage door after the vehicle 150 has exited the garage may place the charger in a low power sleep mode. The charging circuit receiver may also wake up the charger when it receives a signal. For example, when a vehicle is approaching from outside of the garage, the user may activate the garage door by sending a signal from a garage door opener transmitter. The receiver in the charging circuit 100 may receive the signal and wake the charging circuit 100 to prepare for charging. After the vehicle 150 is inside the garage, the garage door may be closed in response to a signal sent by the garage door opener transmitter. The receiver in the charging circuit 100 may detect the signal sent by the garage door opener transmitter and activate charging based on this signal. Optionally, sensors detecting the presence of the vehicle 150 may be used in combination with the garage door opener transmitter signal to prevent activation of the charger in error or to activate and deactivate charging. For example, if the garage door is opened, but no vehicle 150 enters, the charger may only activate upon receiving confirmation from a sensor that a vehicle has entered the garage. Further optionally, the garage door opener itself may include a transmitter that emits a signal received by the charging circuit receiver whenever the garage door opener opens or closes the garage door. The charging circuit 100 may include a receiver that receives and uses these signals to awaken, activate, deactivate, and transition the charger to a low power sleep mode.

VI. Sixth and Seventh Embodiments

Figure 9:
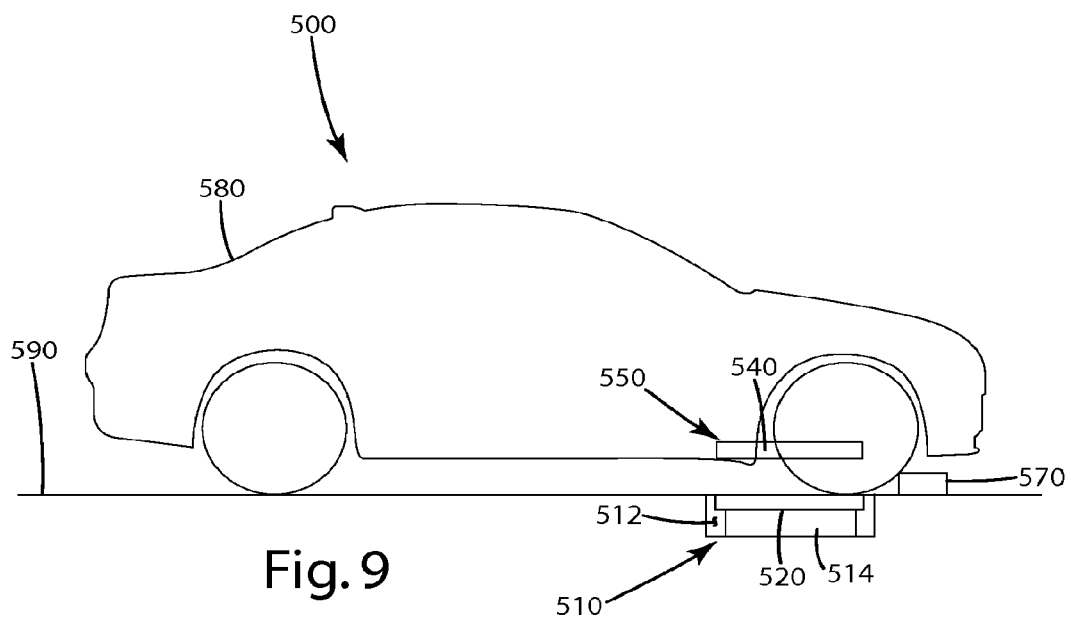
FIG. 9 is a side view of a sixth embodiment of the present invention.
Figure 10:
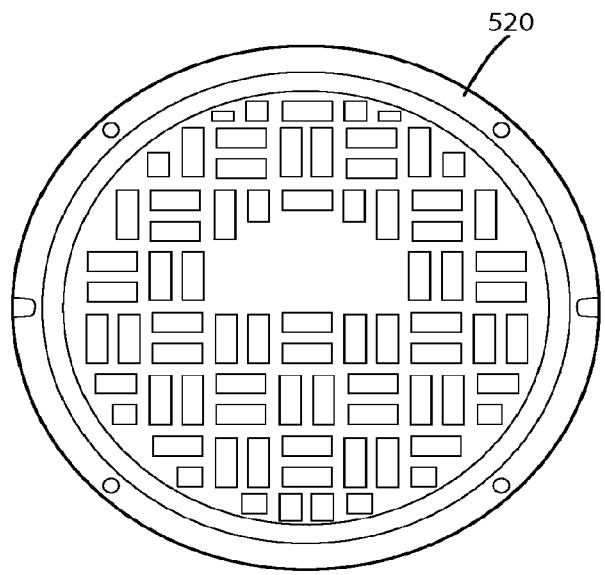
FIG. 10 is a top view of a cover in accordance with the sixth embodiment.

A sixth embodiment of the inductive vehicle charging system of the present invention is illustrated in FIGS. 9-18 and is generally designated 500. The charging system generally includes structures for supporting the primary charging coil 530 and the secondary coil 540. The charging system 500 includes primary charging coil housing 510, primary charging coil cover 520, secondary coil housing 550 and wheel chock 570. As shown in FIG. 9, primary charging coil housing 510 is positioned within recess 512, which is recessed into the surface 590 supporting the vehicle 580. The top surface of the primary charging coil cover 520 may be positioned in approximately the same plane as the surface 590, as shown in FIG. 9, such that the wheel of the vehicle 580 will generally be in the same horizontal plane if the vehicle drives over the primary charging coil housing 510. Optionally, the top surface of the primary charging coil cover 520 may be smooth to allow snow plowing or similar clearing of the surface 590, while protecting the primary and enabling wireless charging.

Figure 16:
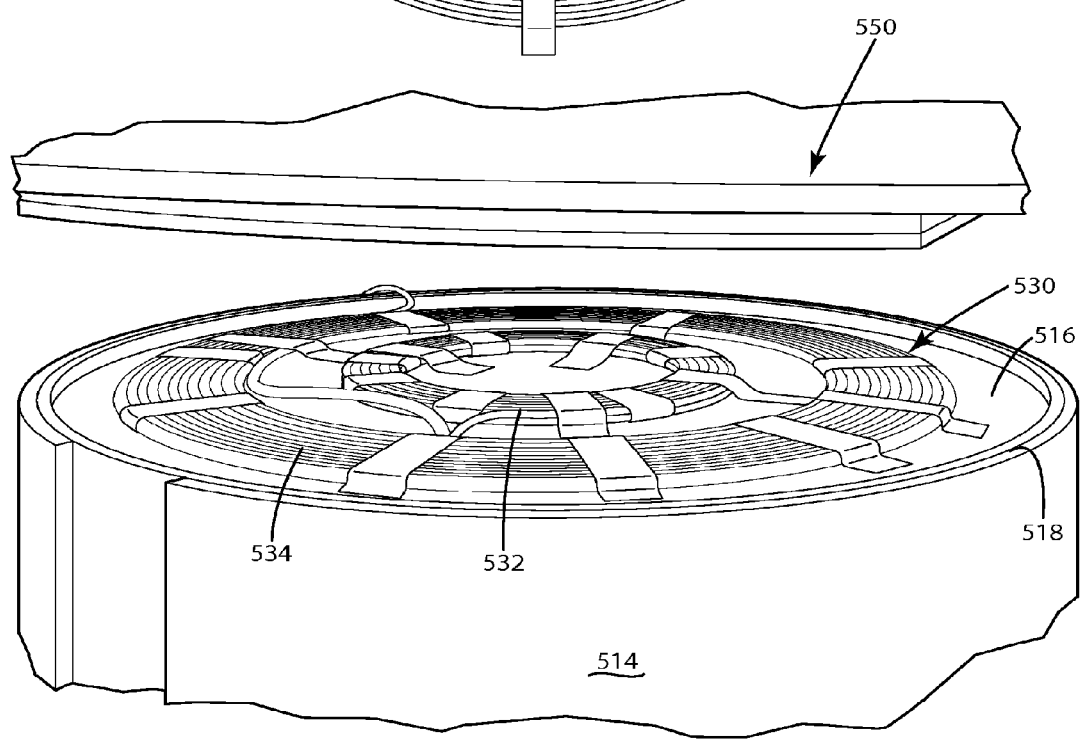
FIG. 16 is a perspective view of a primary coil and primary coil housing with the cover removed in accordance with the sixth embodiment.

As shown in FIG. 16, the primary charging coil housing 510 may include a cylinder 514, top surface 516 and a lip 518. Primary charging coil 530 may be supported by housing top surface 516 and may engage lip 518. Other primary charging coil housing configurations are contemplated. For example, primary charging coil housing 510 may optionally include a simple recess, with the lower surface of the recess supporting the primary charging coil 530. In this configuration, the primary charging coil cover 520 may engage the lower surface of the recess.

Figure 14:
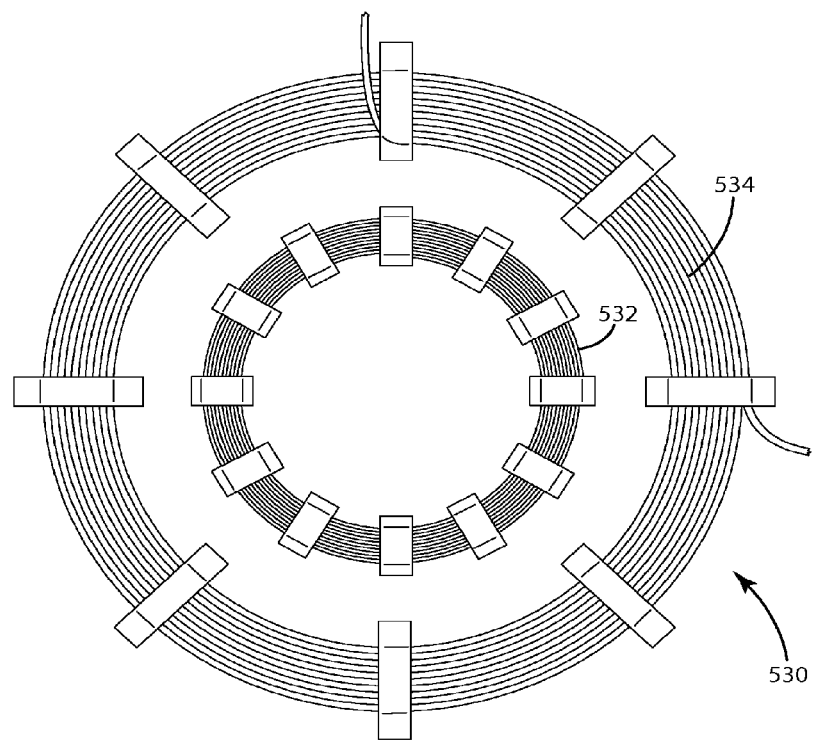
FIG. 14 is a top view of a primary coil arrangement in accordance with the sixth embodiment.

The primary charging coil 530 may include an inner primary drive coil 532 and an outer primary free resonating coil 534, which is shown in FIG. 14. The outer primary free resonating coil 534 may be connected to one or more coupling capacitors. This configuration may improve the power transfer from the primary charging coil 530 to the secondary coil 540. Returning to FIG. 9, the primary charging coil housing 510 may be configured at various heights with respect to the secondary coil housing 550. The primary charging coil housing 510 may be adapted to be raised out of the ground once a vehicle is in place for charging to improve coupling between the primary coil 530 and secondary coil 540. The movement of the primary charging coil housing 510 may be accomplished by pneumatics, hydraulics, mechanical linkages or any other suitable method.

Figure 11:
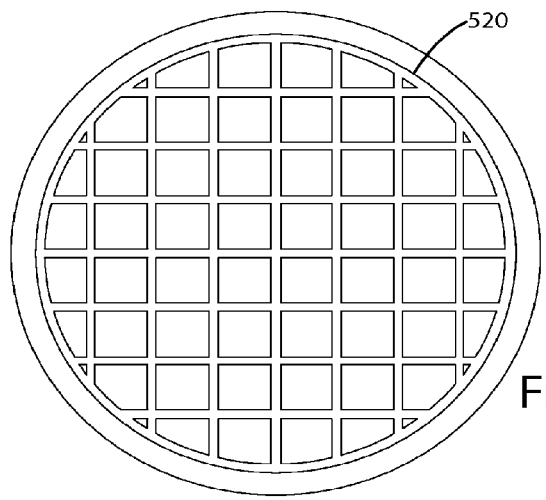
FIG. 11 is bottom view of the cover.
Figure 12:
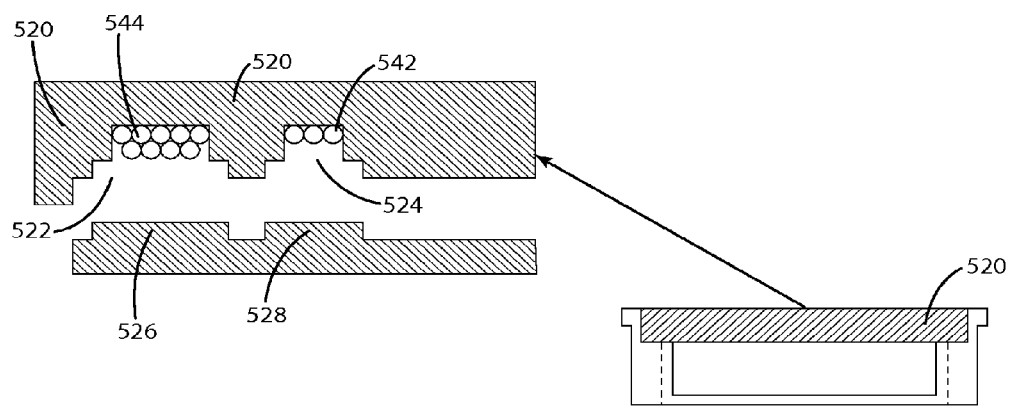
FIG. 12 is a cross-sectional view of a primary coil, cover and housing in accordance with the sixth embodiment.
Figure 20:
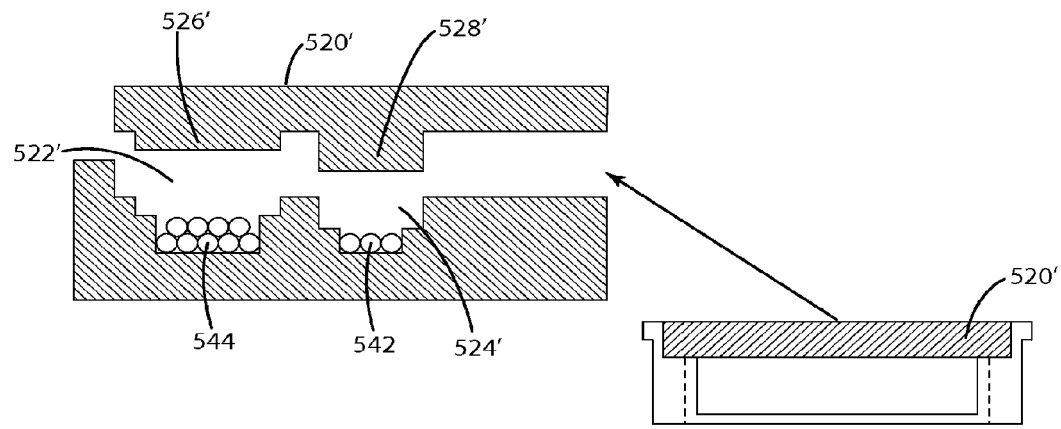
FIG. 20 is a cross-sectional view of a primary coil, cover and housing in accordance with a seventh embodiment of the present invention.
Figure 36:
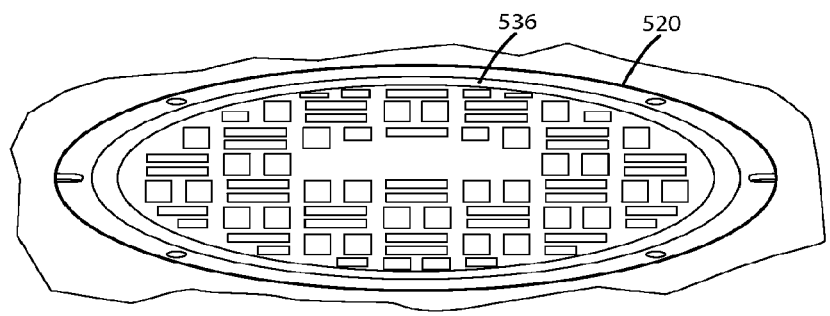
FIG. 36 is a perspective view of a cover with an indicator light.

As shown in FIGS. 9-12, a primary charging coil cover 520 may be positioned over the primary charging coil 530 and may engage the top surface 516 and/or lip 518 of the primary charging coil housing 510 to protect primary coil 530. The cover may also include one or more recesses 522, 524 that may receive and protect the primary charging coil 530. The recesses 522, 524 may also align with and engage protrusions 526, 528 on the top surface 516, which may further protect the primary charging coil 530. The protrusions 526, 528 may optionally be defined in a second portion of the primary charging coil cover 520, such that the primary charging coil 530 is contained within cover 520. As shown in FIG. 11, the underside of cover 520 may include a rib support structure to provide increased strength to the cover 520 and increased protection for primary coil 530. In a seventh embodiment, shown in FIG. 20, the coils may be received in recesses 522', 524' and the protrusions may be on the bottom surface of cover 520'. The recesses 522', 524' may be defined in the primary charging coil housing 510. The recesses 522', 524' may optionally be defined in a second portion of the primary charging coil cover 520', such that the primary charging coil 530 is contained within cover 520'. The cover 520 and other elements of the primary charging coil housing 510 may be manufactured from any suitable material, including a non-conductive composite or plastic. This may include glass filled epoxies, plastics or layers of fiberglass to provide the strength and structure needed to support vehicles driving over the covers. Optionally, as shown in FIG. 36, the cover 520'' may include one or more indicator lights 536. The indicator light 536 may be in the form of a glowing ring, as shown in FIG. 36, and may indicate the location of a charging primary, that payment was accepted/approved, that charging has commenced, that a fault has occurred, or any other information useful to the user or service company.

Figure 13:
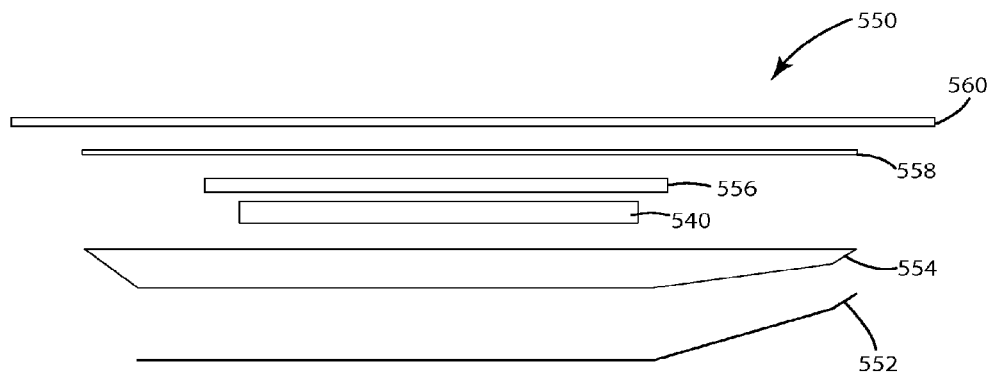
FIG. 13 is an exploded view of a skid plate in accordance with the sixth embodiment.
Figure 15:
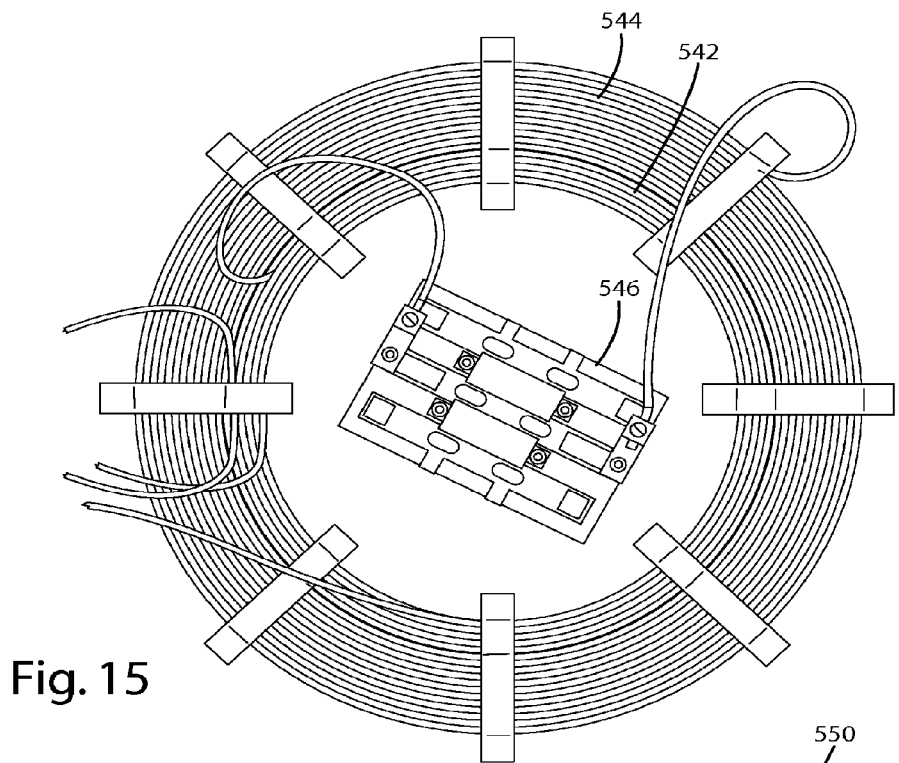
FIG. 15 is a top view of a secondary coil arrangement in accordance with the sixth embodiment.
Figure 17:
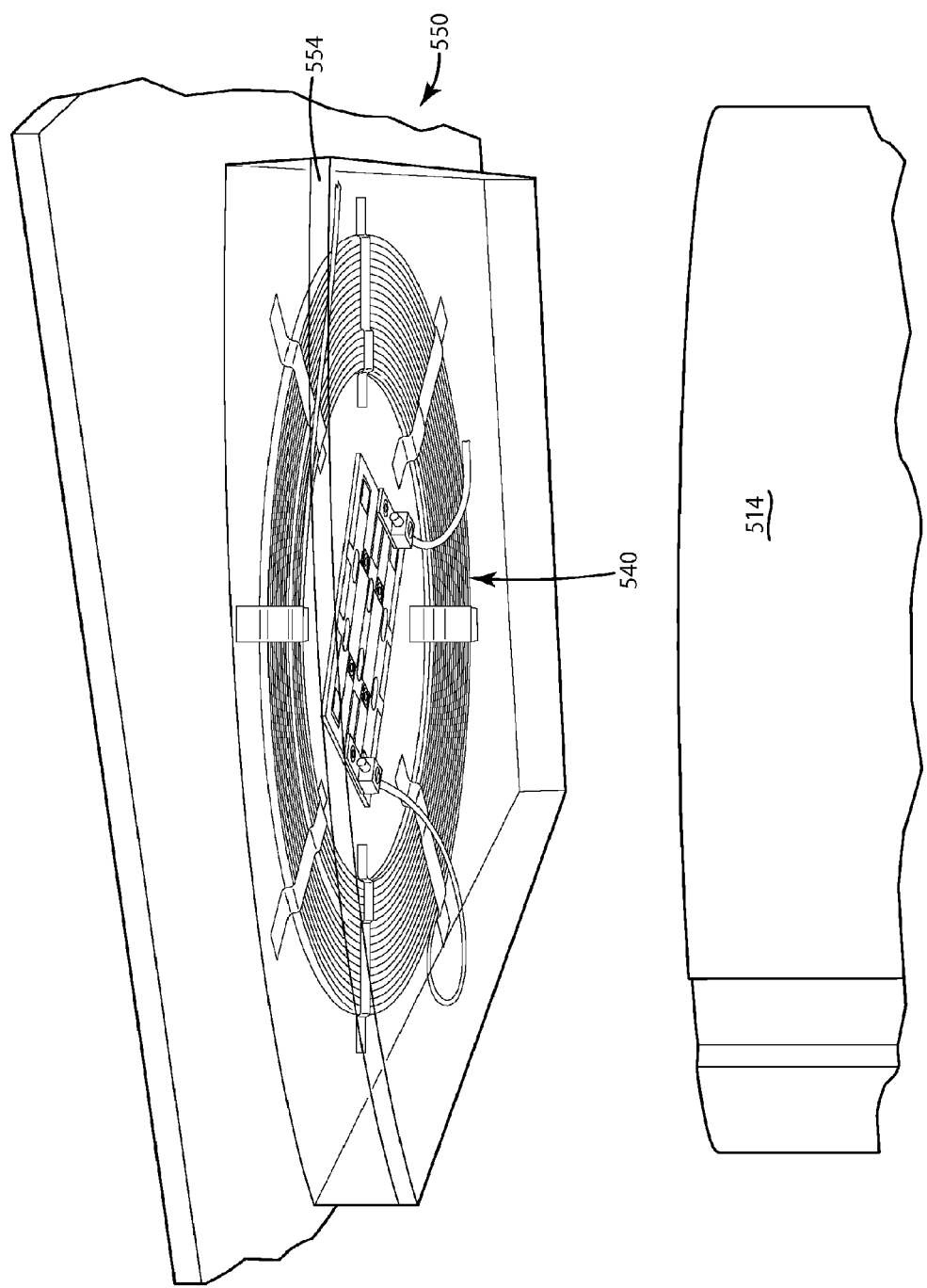
FIG. 17 is a perspective view of a secondary coil and a skid plate in accordance with the sixth embodiment.

The secondary coil housing or skid plate 550 is shown in FIG. 13 and may be adapted to mount to the underside of a vehicle. The secondary coil housing 550 may include an outer layer 552 made of any suitable material, including a non-conductive, wear-resistant material such as a Kevlar® composite. The outer layer 552 may provide a protective wear-resistant layer for the secondary coil housing 550. An inner layer 554 may be positioned adjacent the outer layer 552 or other layers may be positioned between the inner layer 554 and the outer layer 552. The inner layer 554 may be made of any suitable material, including a non-conductive fiberglass, plastic or composite. The inner layer 554 may generally support and protect the secondary coil 540. Optionally, the secondary coil 540 may be generally supported by a surface above the secondary coil 540. Further optionally, the secondary coil 540 may be supported by any surface suitable to the application. The secondary coil 540 may include an inner secondary receiver coil 542 and an outer secondary free resonating coil 544, as shown in FIG. 15. The outer secondary free resonating coil 544 may be connected to one or more capacitors 546 that may be switched in parallel or series with relays for tuning controlled by the power monitor and controller. This configuration may improve the power transfer between the primary coil 530 and the secondary coil 540. FIG. 17 shows the inner layer 554 supporting the secondary coil 540 in a configuration without an outer layer 552. Returning to FIG. 13, a mail shielding layer 556 may be positioned above the secondary coil 540 to shield the electronics from the magnetic field generated by the inductive power transfer. A secondary shielding layer 558 may be positioned above the mail shielding layer 556 to further shield the electronics from the magnetic field. The mail shielding layer 556 and the secondary shielding layer 558 may be made of any conventional shielding material, including any ferromagnetic material. The secondary coil housing 550 may be adapted to lower the secondary coil 540 once a vehicle is in place for charging to improve coupling between the primary coil 530 and secondary coil 540. The movement of the secondary coil housing 550 may be accomplished by pneumatics, hydraulics, mechanical linkages or any other suitable method. This movement is a tuning method that allows the system to adjust for the proper coupling based on best efficiency.

In use, a vehicle may enter a charging area. The wheels of the vehicle may roll over primary charging coil housing 510 because the primary charging coil 530 is protected by the cover 520 as described above. The forward progress of the vehicle may be impeded by the chock 570, which is positioned to provide alignment between the primary charging coil 530 and the secondary coil 540 in a longitudinal (forward-rearward) direction, as shown in FIG. 9. The lateral alignment of the wheels of the vehicle may also be guided and/or adjusted using all or a portion of any embodiment described in this application. Once the vehicle is in the proper position, the primary charging coil 530 and the secondary coil 540 may be aligned. The primary charging coil housing 550 and/or the secondary coil housing 510 may move in a vertical direction, meaning toward/away from each other to position the coils at the optimum spacing for inductive coupling. At this point, the vehicle may be charged. It should be noted that if additional freedom is desired, additional shielding may be added to prevent losses into the chassis. This additional shielding may extend past the area shown in the figures.

VII. Eighth Embodiment

Figure 24:
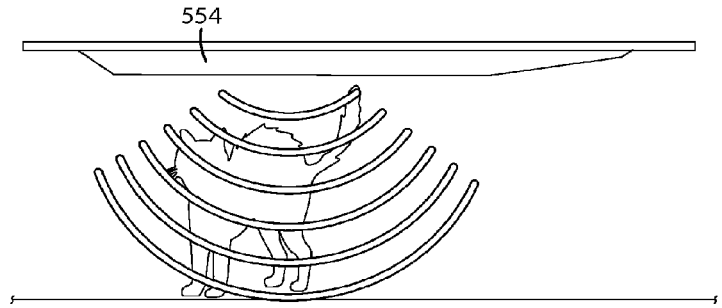
FIG. 24 is a side view of an animal detection system in accordance with an eighth embodiment of the present invention.

In an eighth embodiment, shown in FIG. 24, an animal detection system and alarm or other deterrent may be incorporated into the system. It is undesirable for animals or other moving objects to move into the space between the primary charging coil 530 and the secondary coil 540. Among other things, this can reduce the efficiency of the coupling between the primary coil 530 and secondary coil 540. Incorporating sensors into the charging system may detect when something has moved into the charging area. This may trigger an alarm, a vibration and/or any other deterring means. The sensors may be any conventional type of motion-detecting sensors, including passive infrared, ultrasonic and microwave. Optionally, the sensors may be connected to the charging circuit such that, if the sensors detect a moving object, the charging circuit may be prevented from activating. The sensors may also trigger an alarm, vibration and/or other deterrent.

VIII. Circuitry and Network

Figure 18:
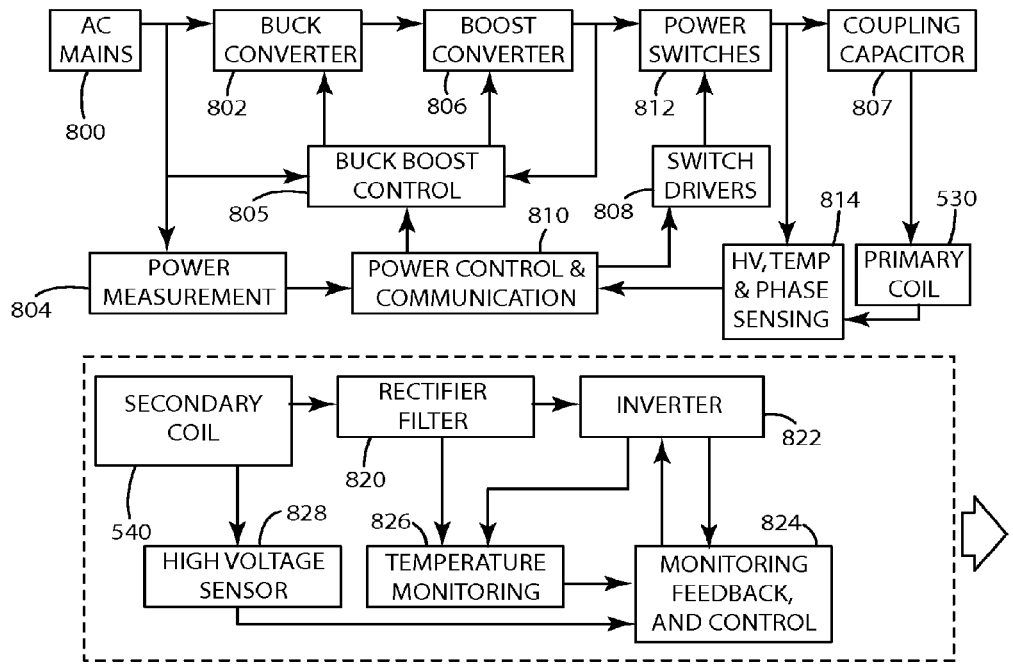
FIG. 18 is a schematic diagram of circuitry associated with the sixth embodiment.
Figure 29:
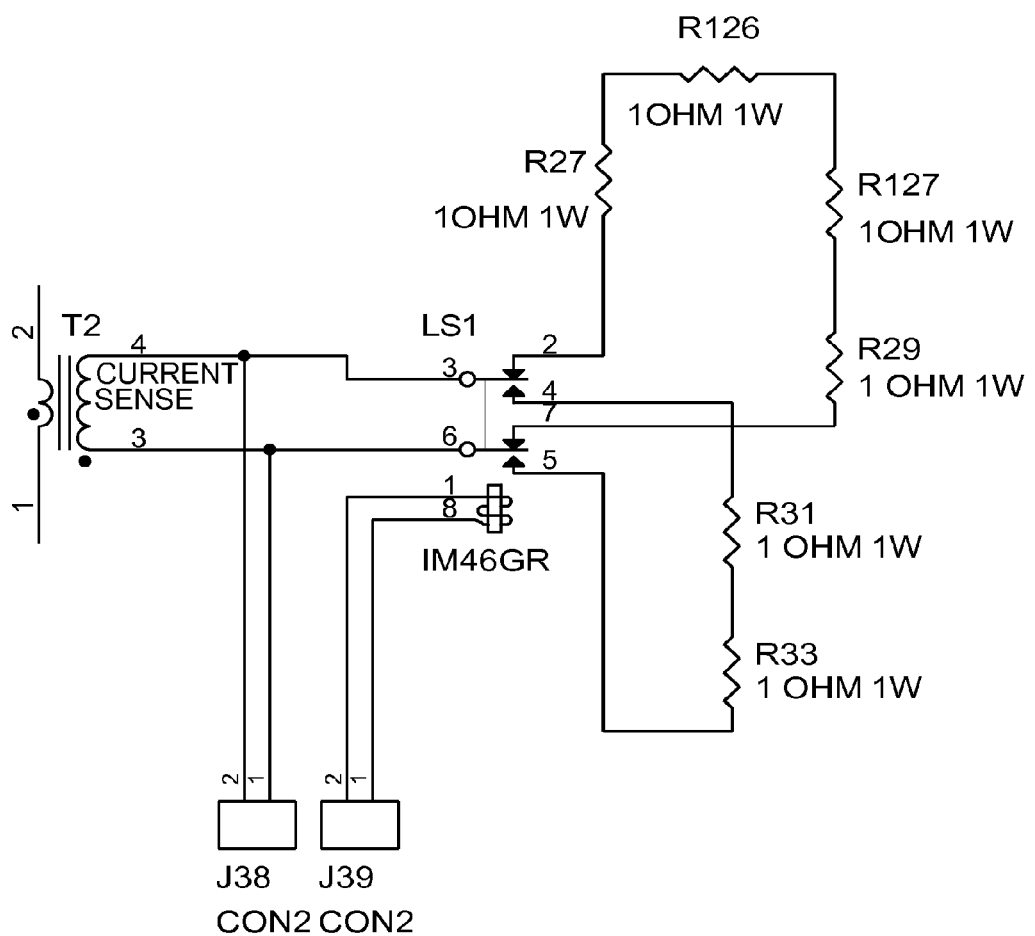
FIG. 29 is a circuit diagram of a select switch.
Figure 30A:
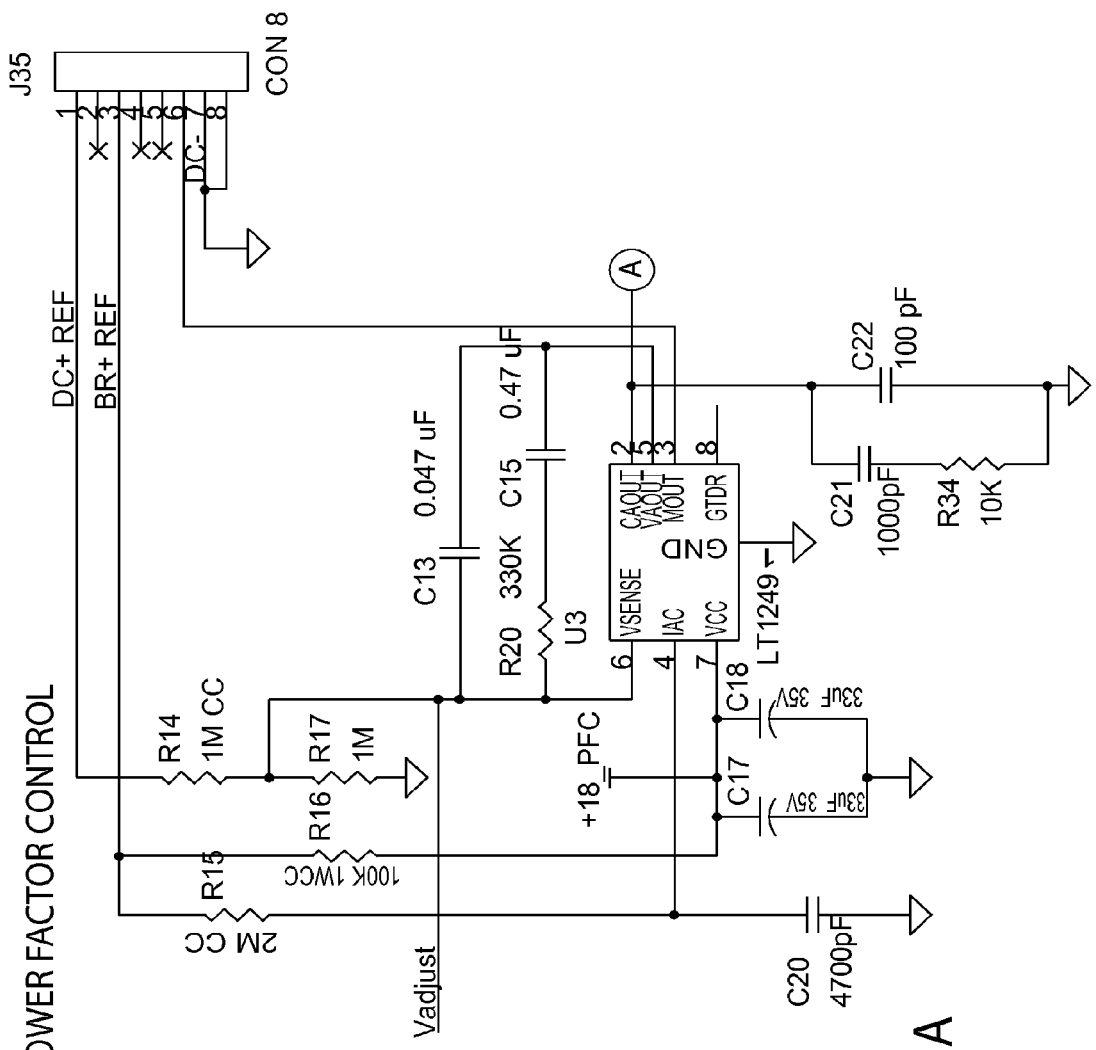
FIG. 30A is a first part of a circuit diagram of a digital interface.
Figure 30B:
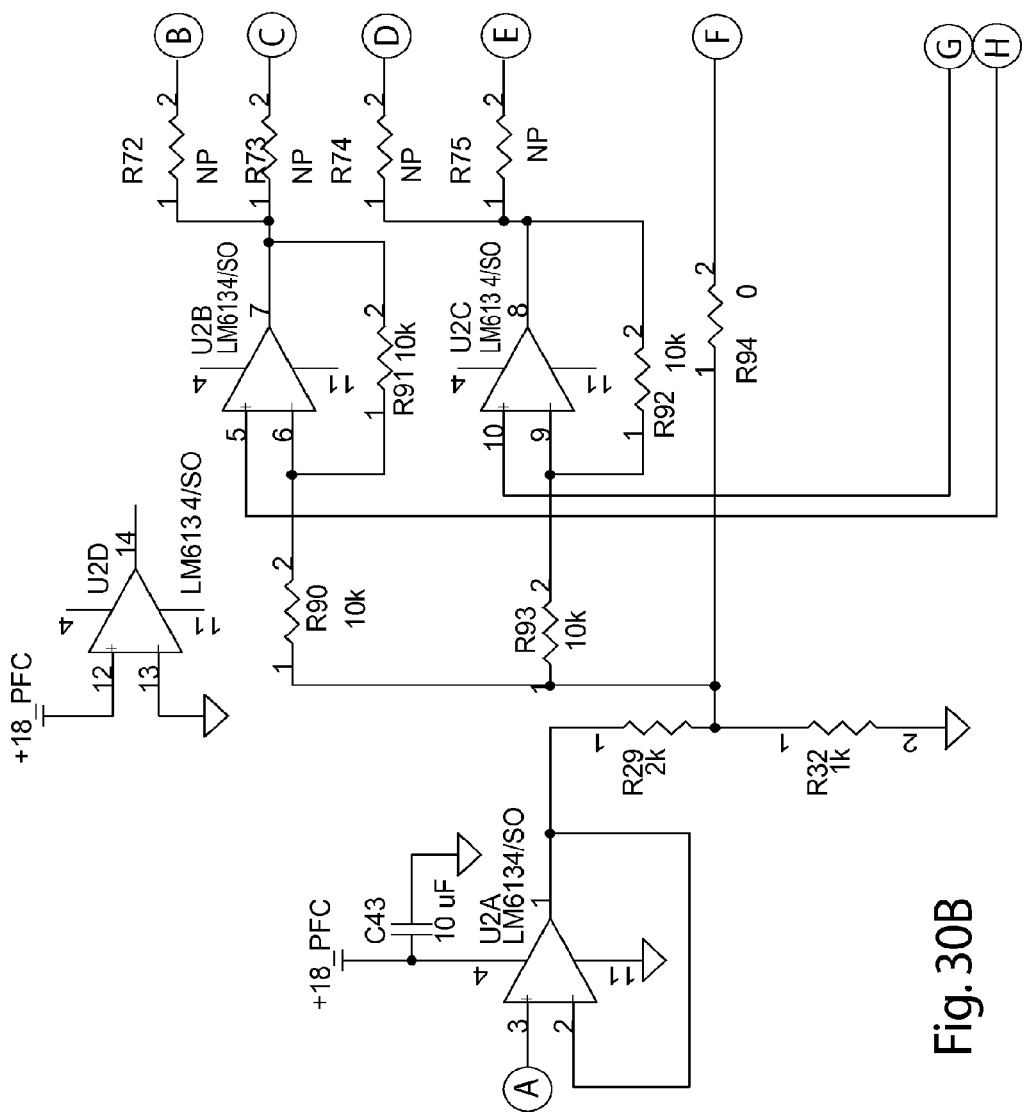
FIG. 30B is a second part of a circuit diagram of a digital interface.
Figure 30C:
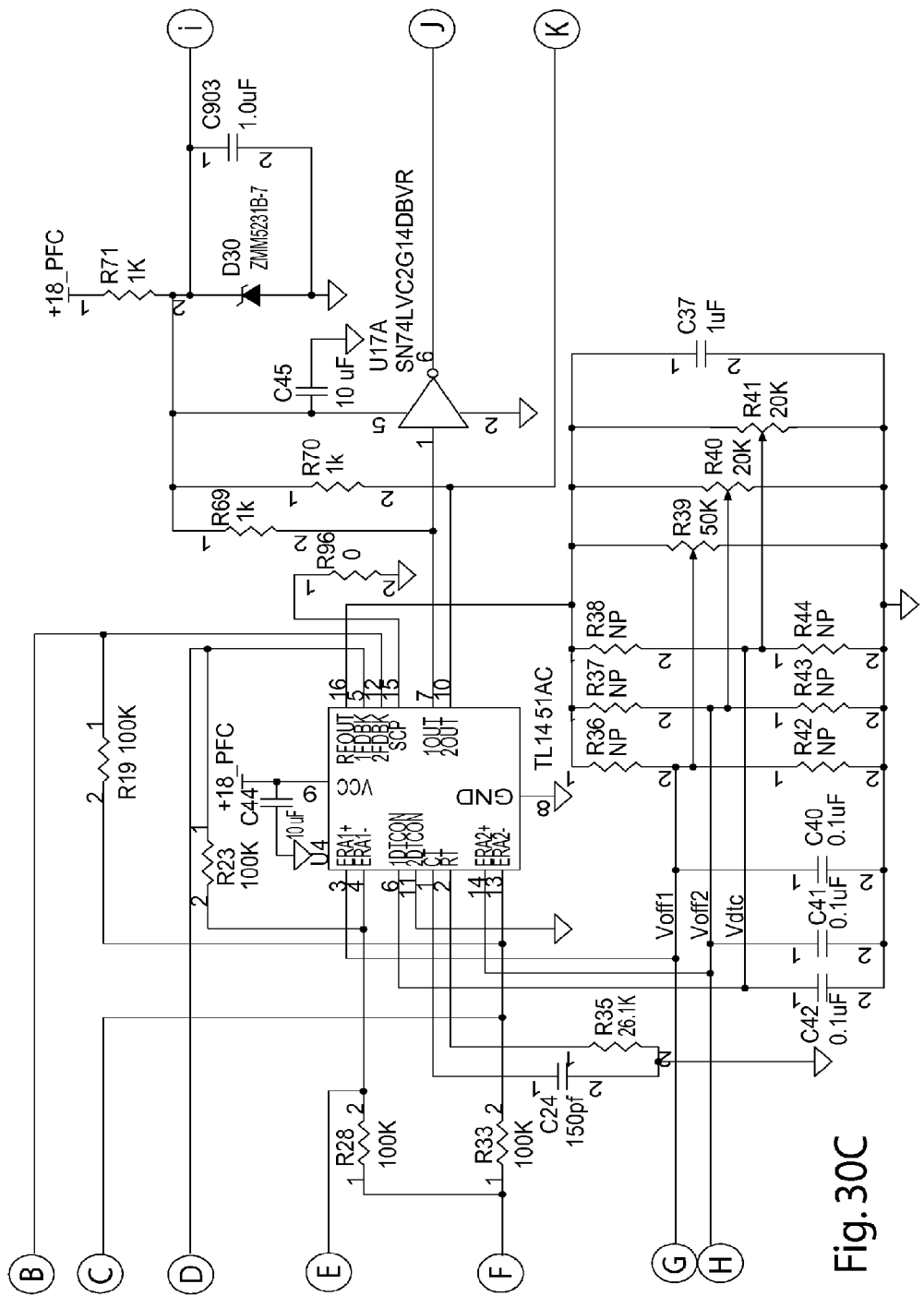
FIG. 30C is a third part of a circuit diagram of a digital interface.
Figure 30D:
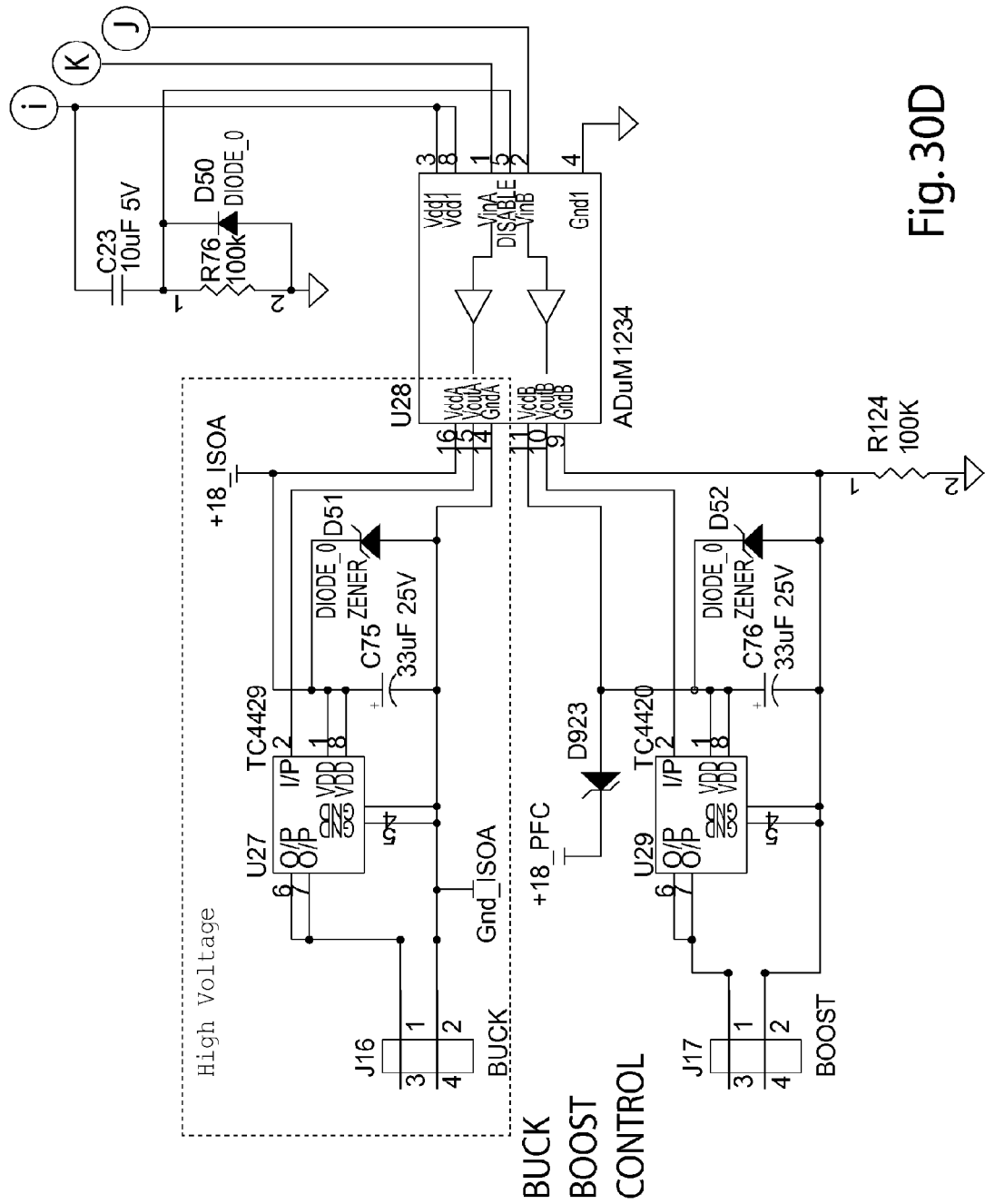
FIG. 30D is a fourth part of a circuit diagram of a digital interface.
Figure 30E:
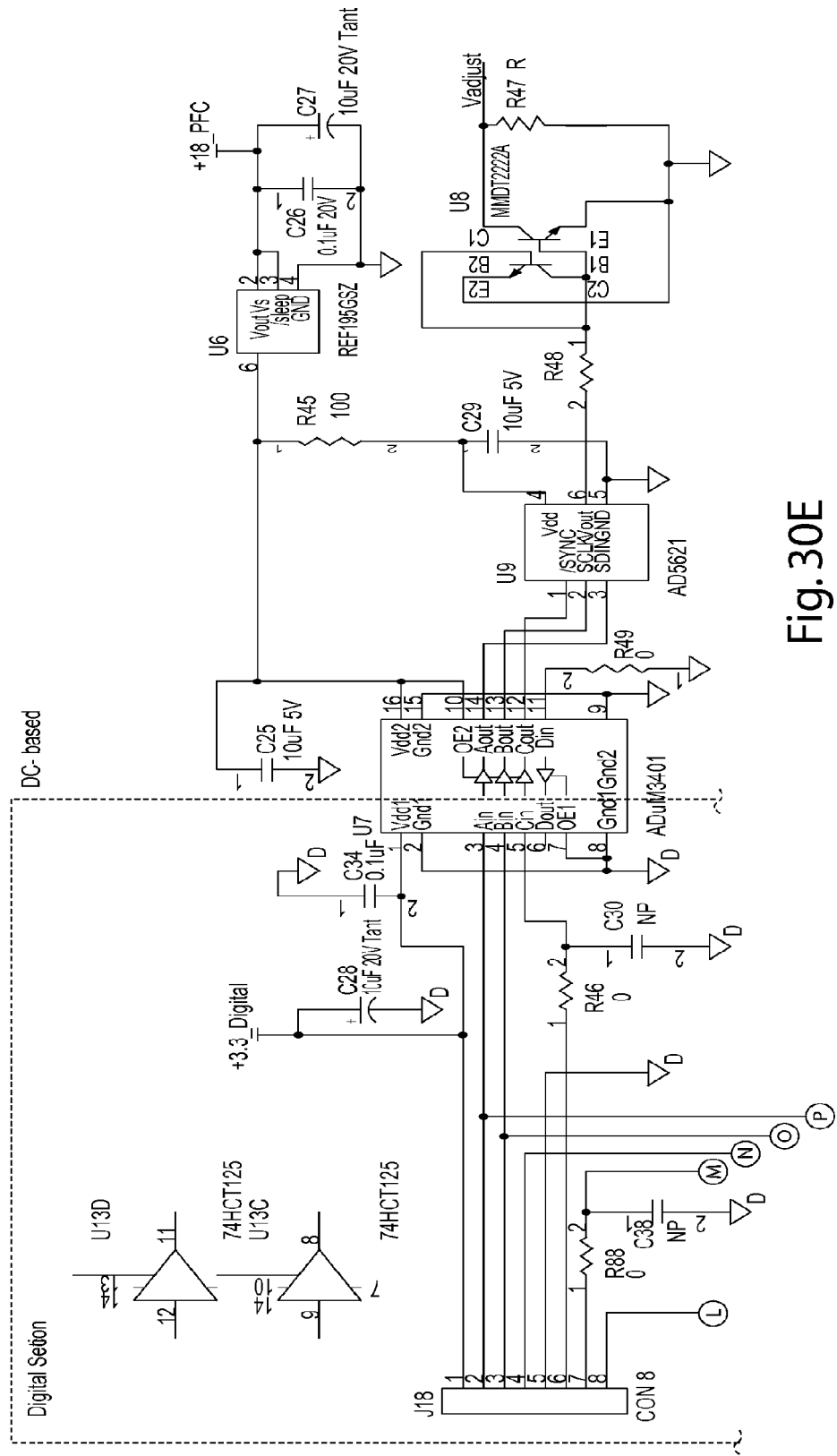
FIG. 30E is a fifth part of a circuit diagram of a digital interface.
Figure 31A:
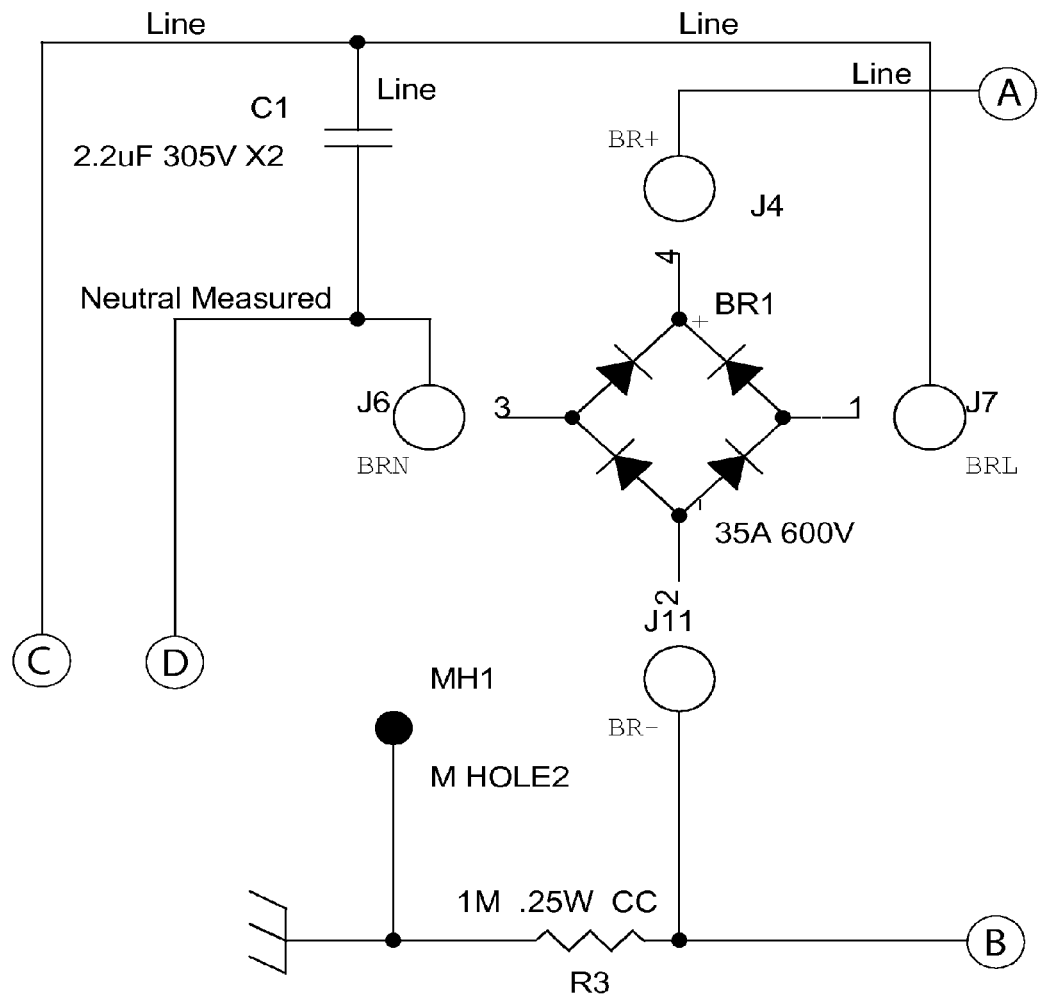
FIG. 31A is a first part of a circuit diagram of an AC power management and measurement circuit.
Figure 31B:
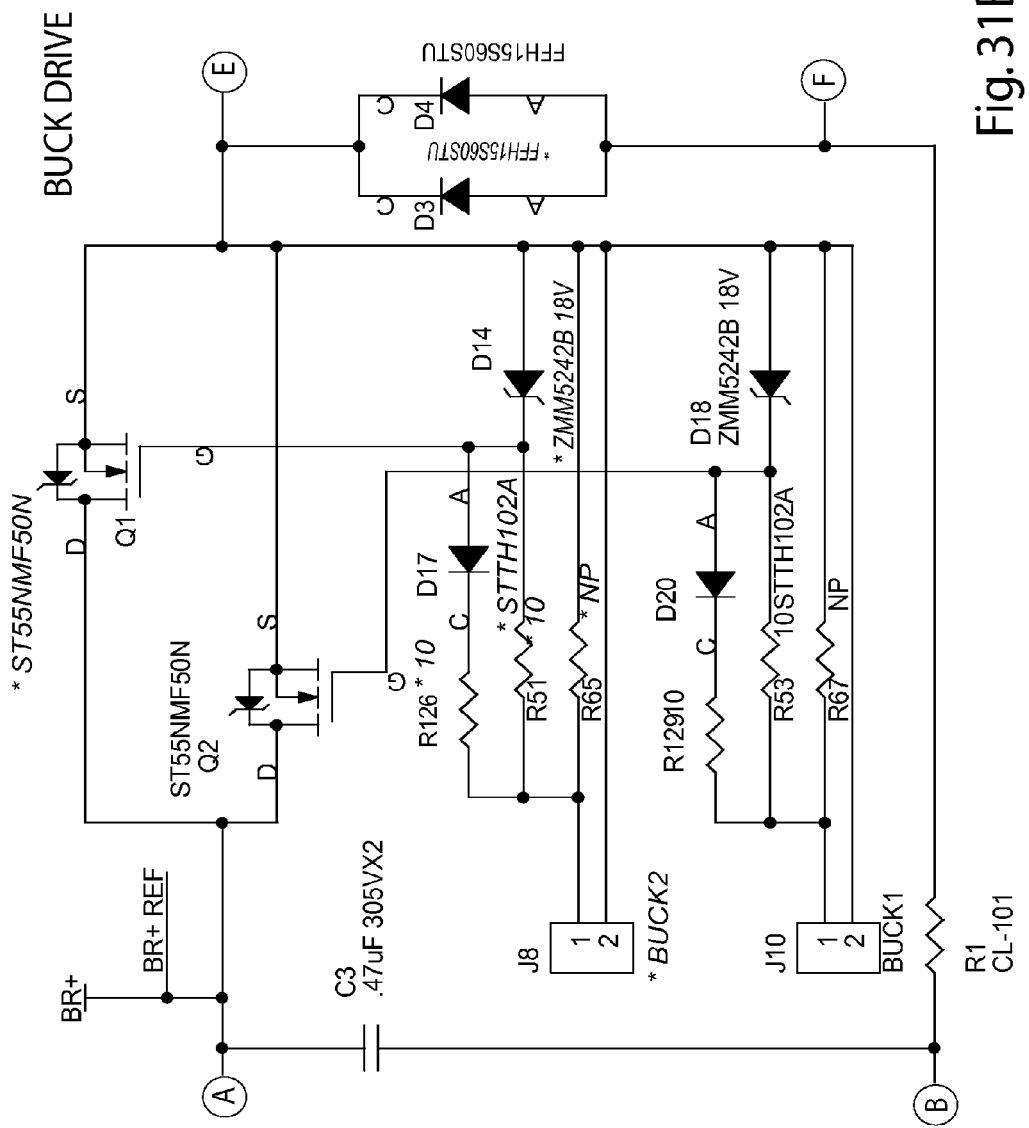
FIG. 31B is a second part of a circuit diagram of an AC power management and measurement circuit.
Figure 31C:
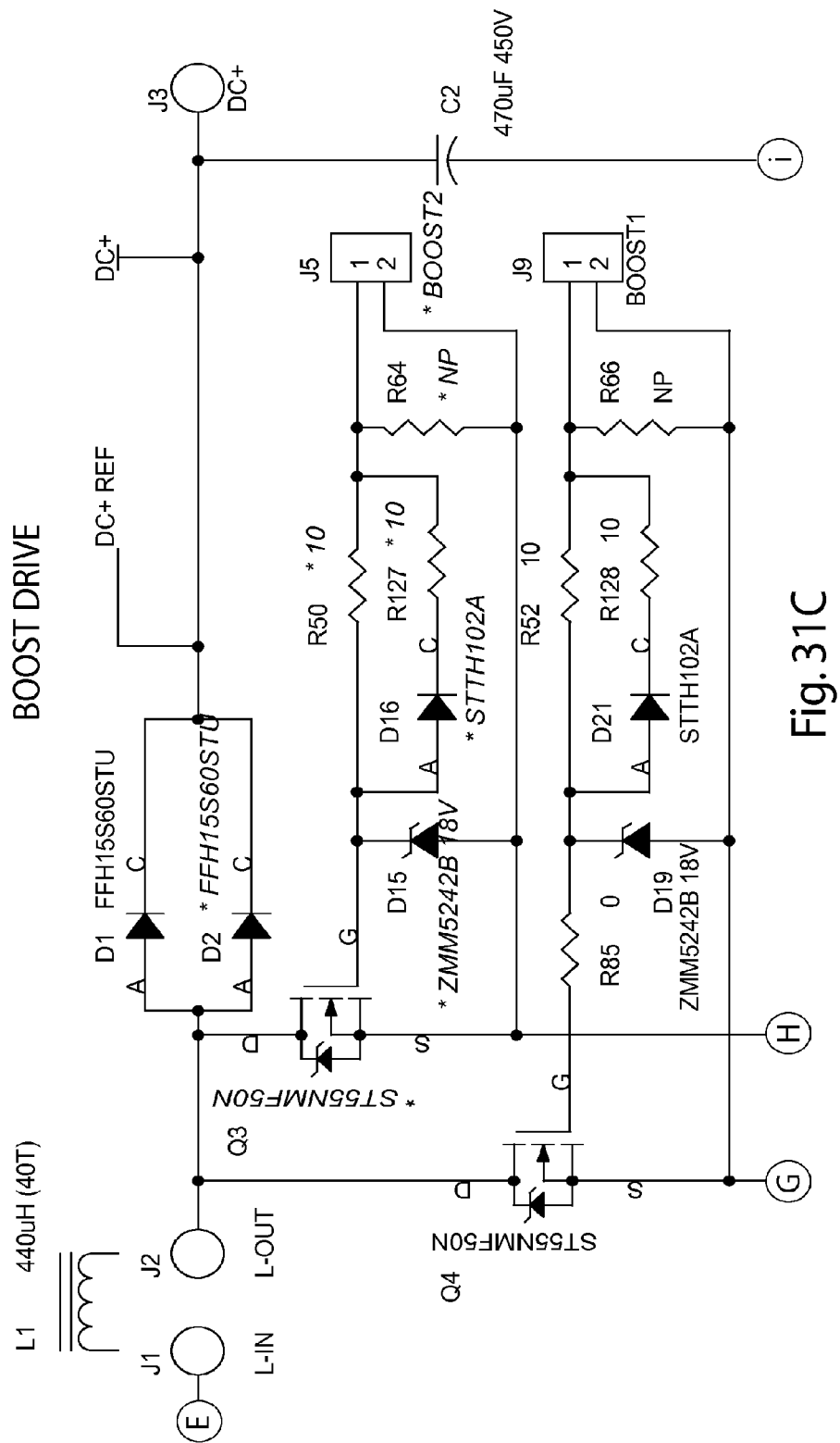
FIG. 31C is a third part of a circuit diagram of an AC power management and measurement circuit.
Figure 31D:
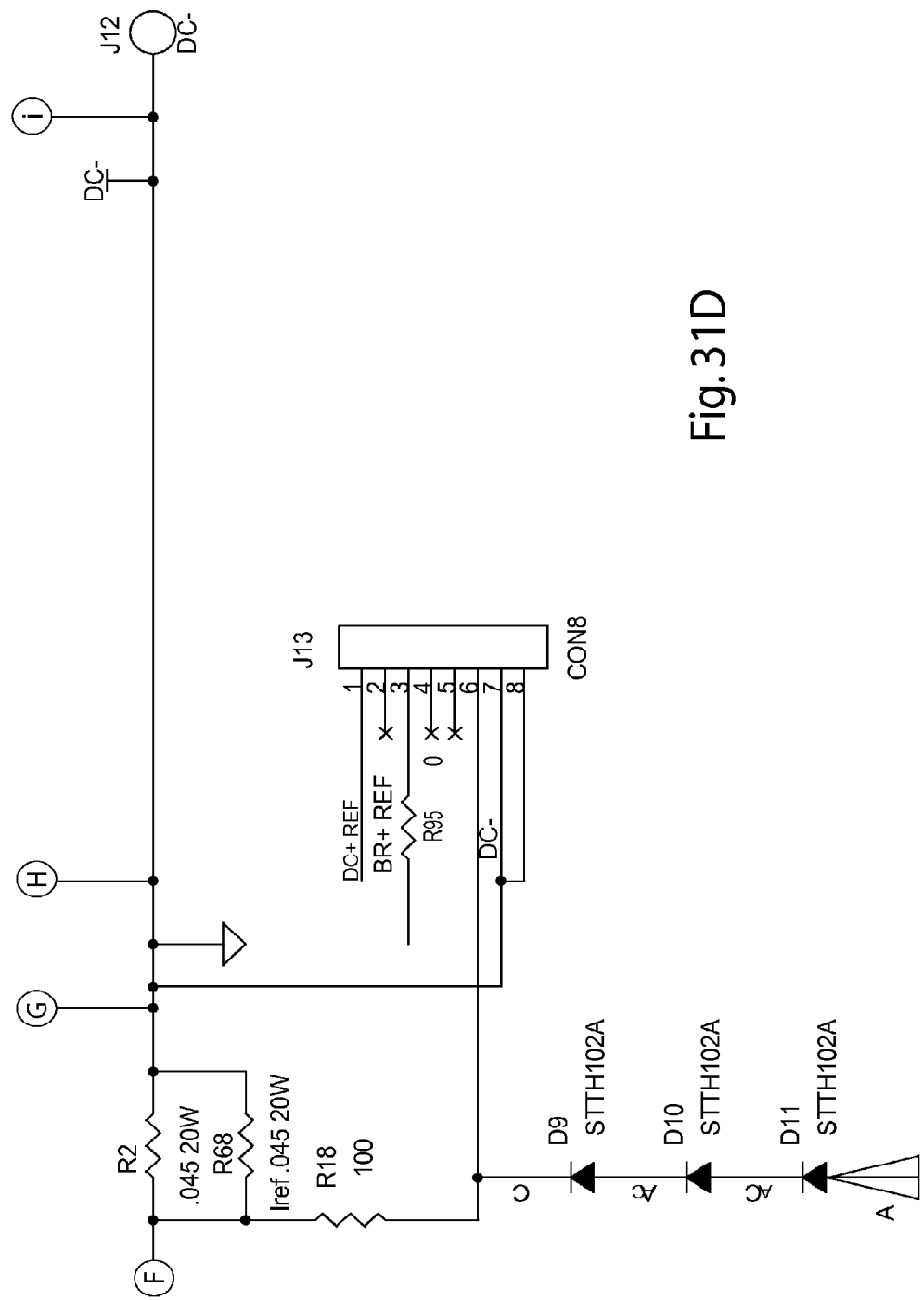
FIG. 31D is a fourth part of a circuit diagram of an AC power management and measurement circuit.
Figure 31E:
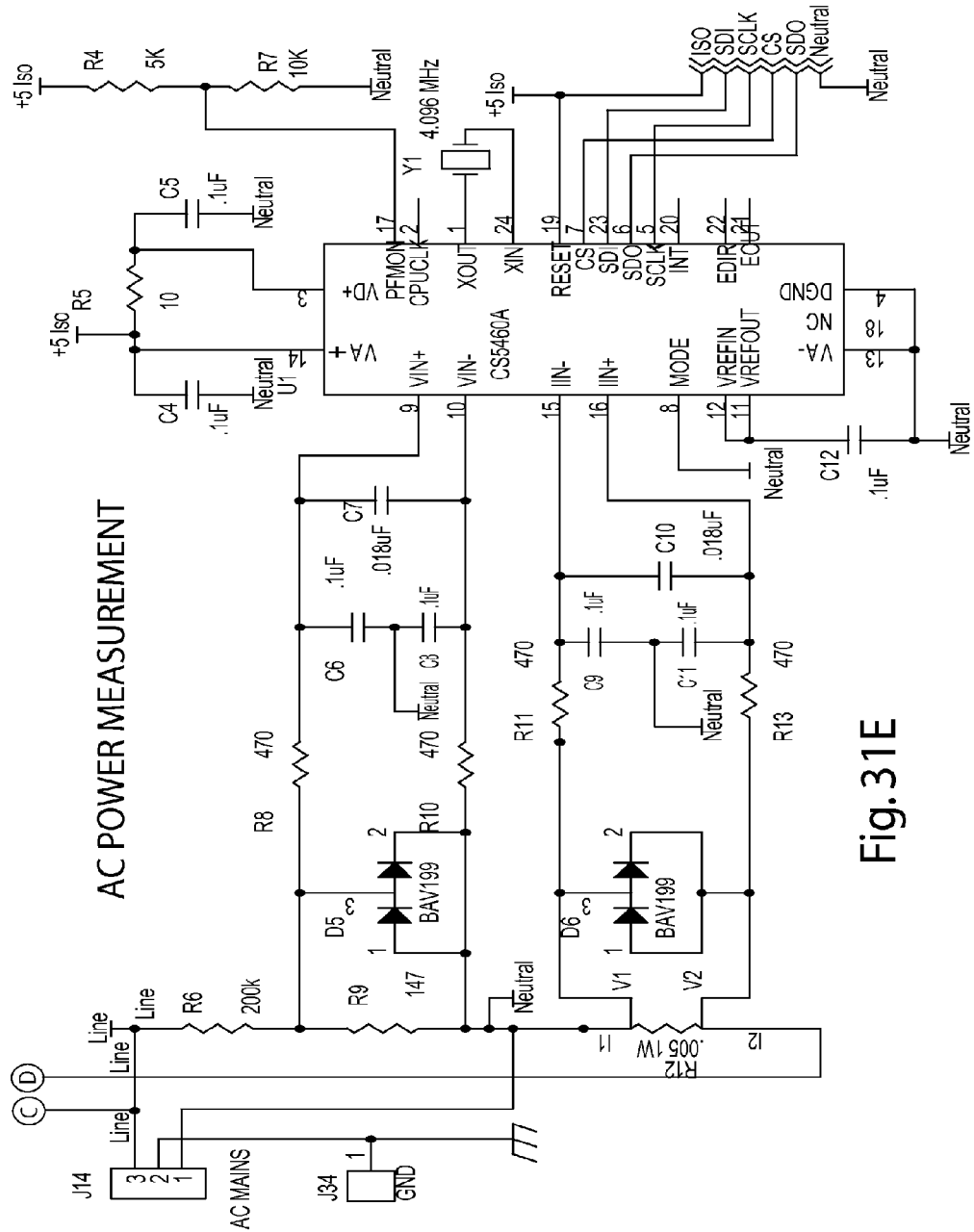
FIG. 31E is a fifth part of a circuit diagram of an AC power management and measurement circuit.
Figure 32A:
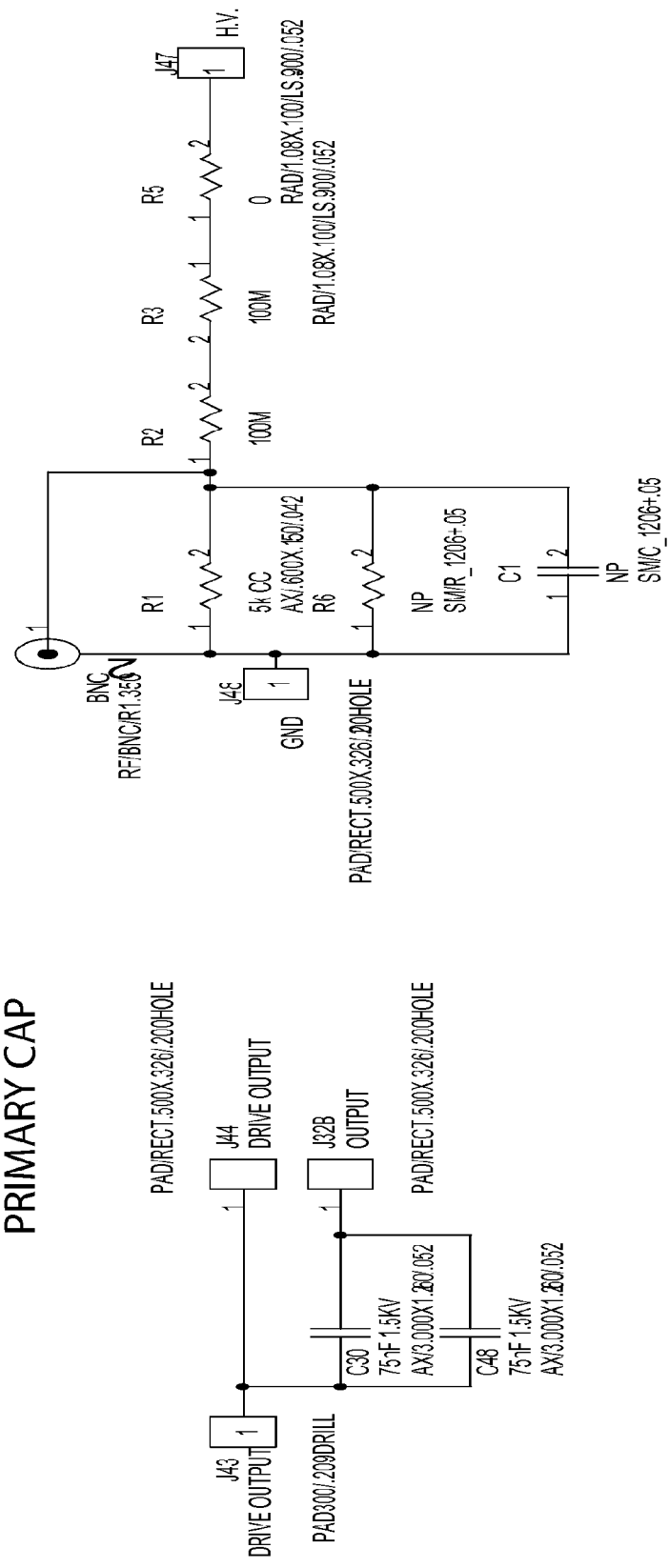
FIG. 32A is a first part of a circuit diagram associated with various power supplies.
Figure 32B:
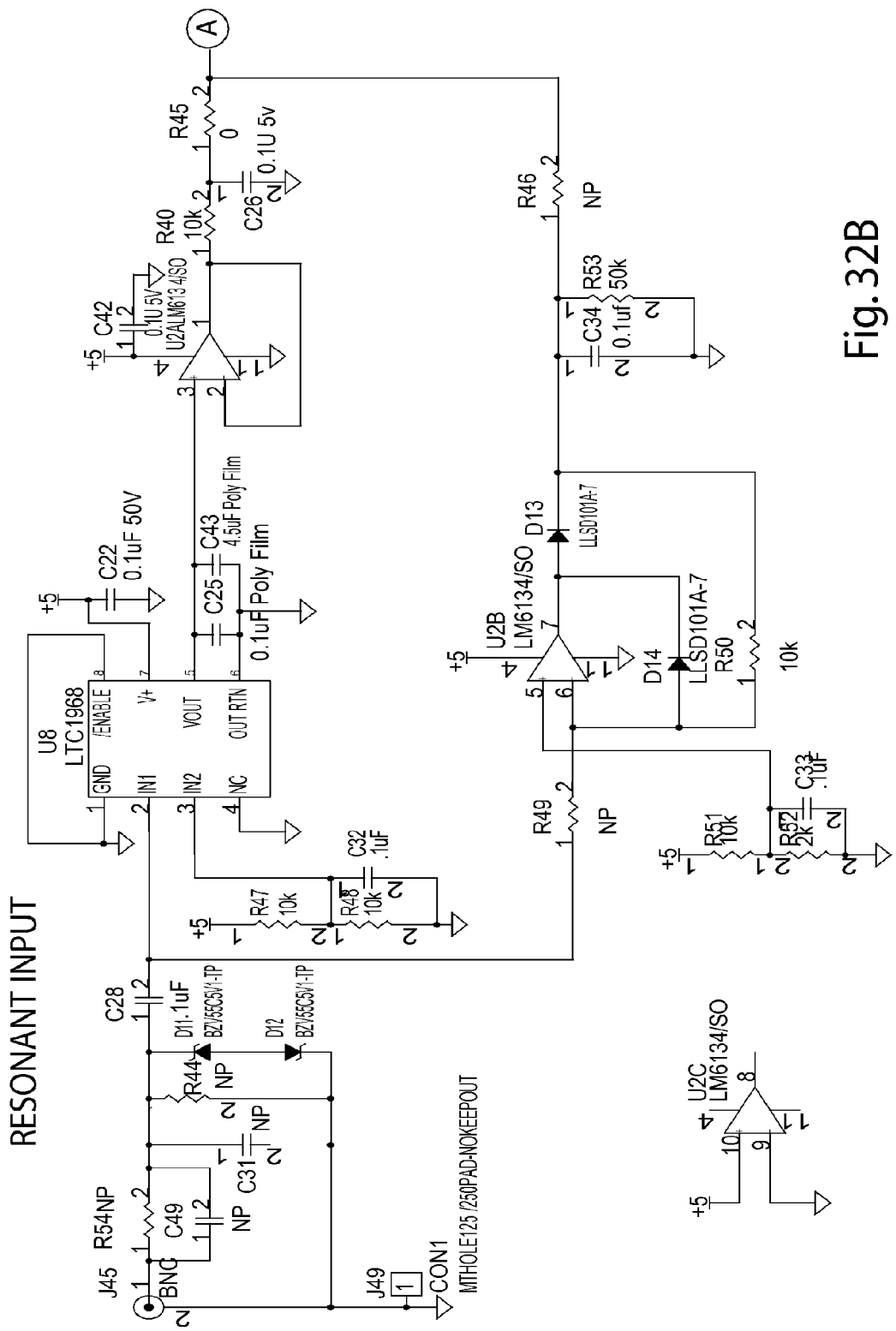
FIG. 32B is a second part of a circuit diagram associated with various power supplies.
Figure 32C:
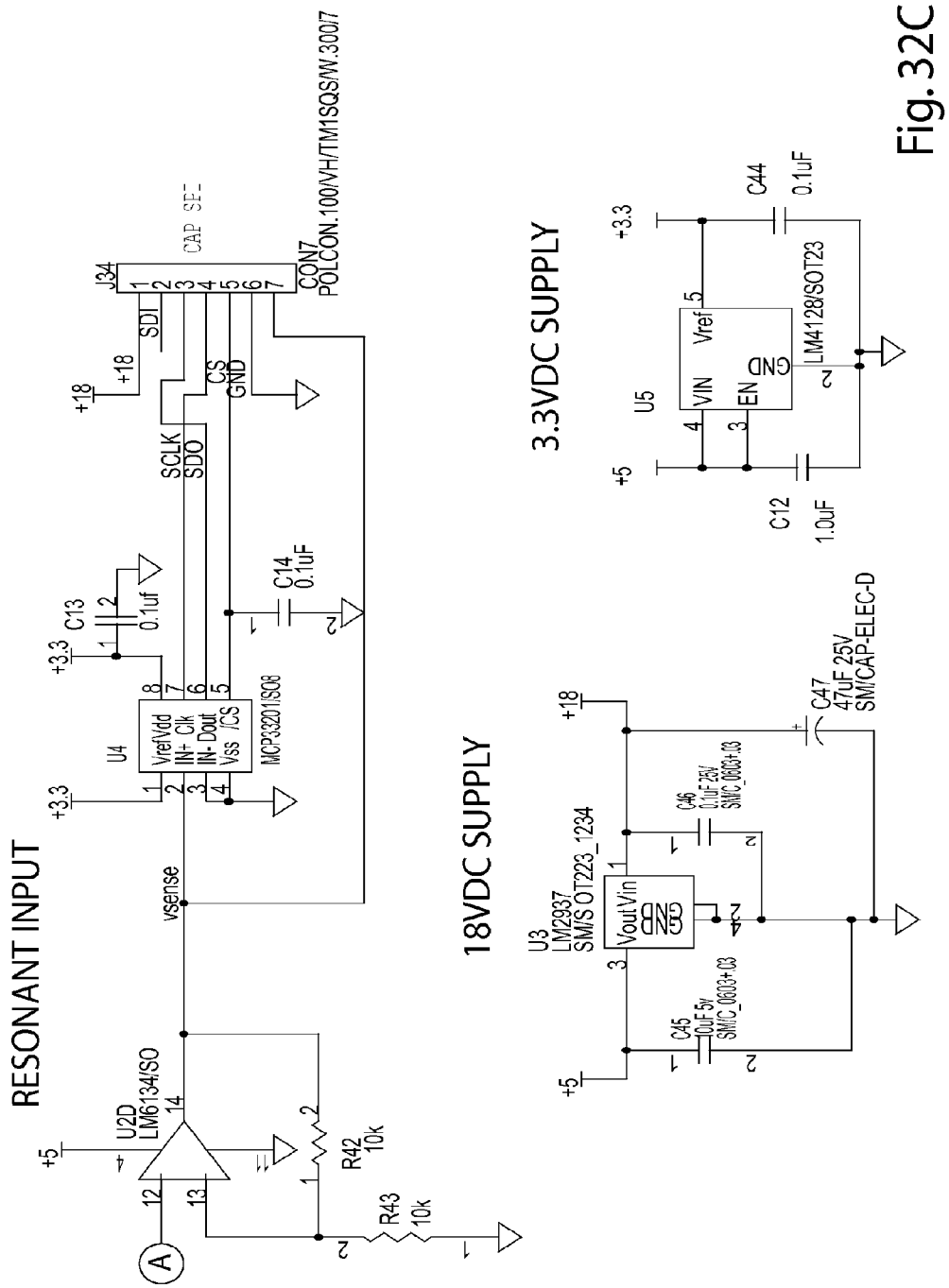
FIG. 32C is a third part of a circuit diagram associated with various power supplies.
Figure 34A:
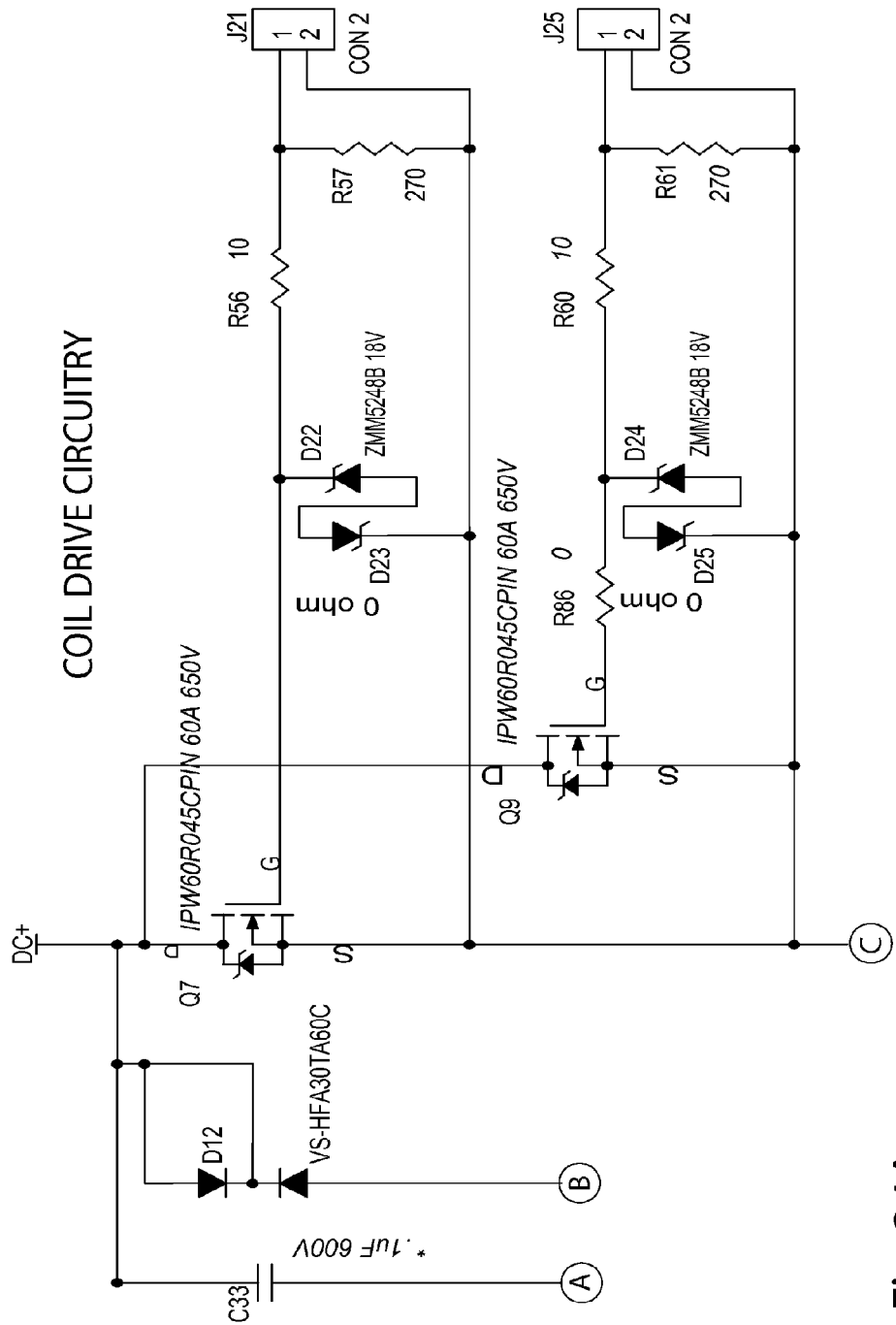
FIG. 34A is a first part of a circuit diagram of a coil drive.
Figure 34B:
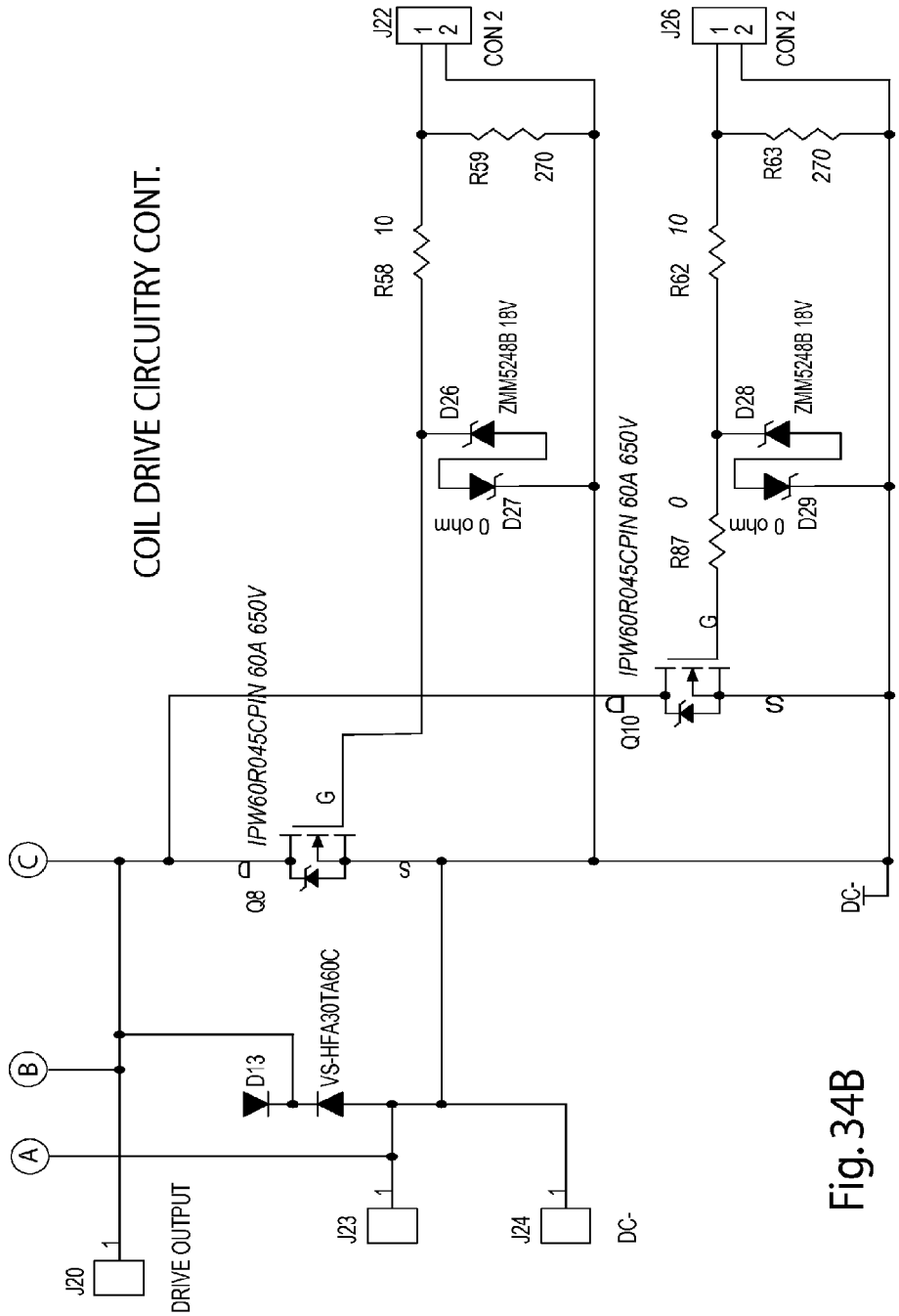
FIG. 34B is a second part of a circuit diagram of a coil drive.
Figure 35A:
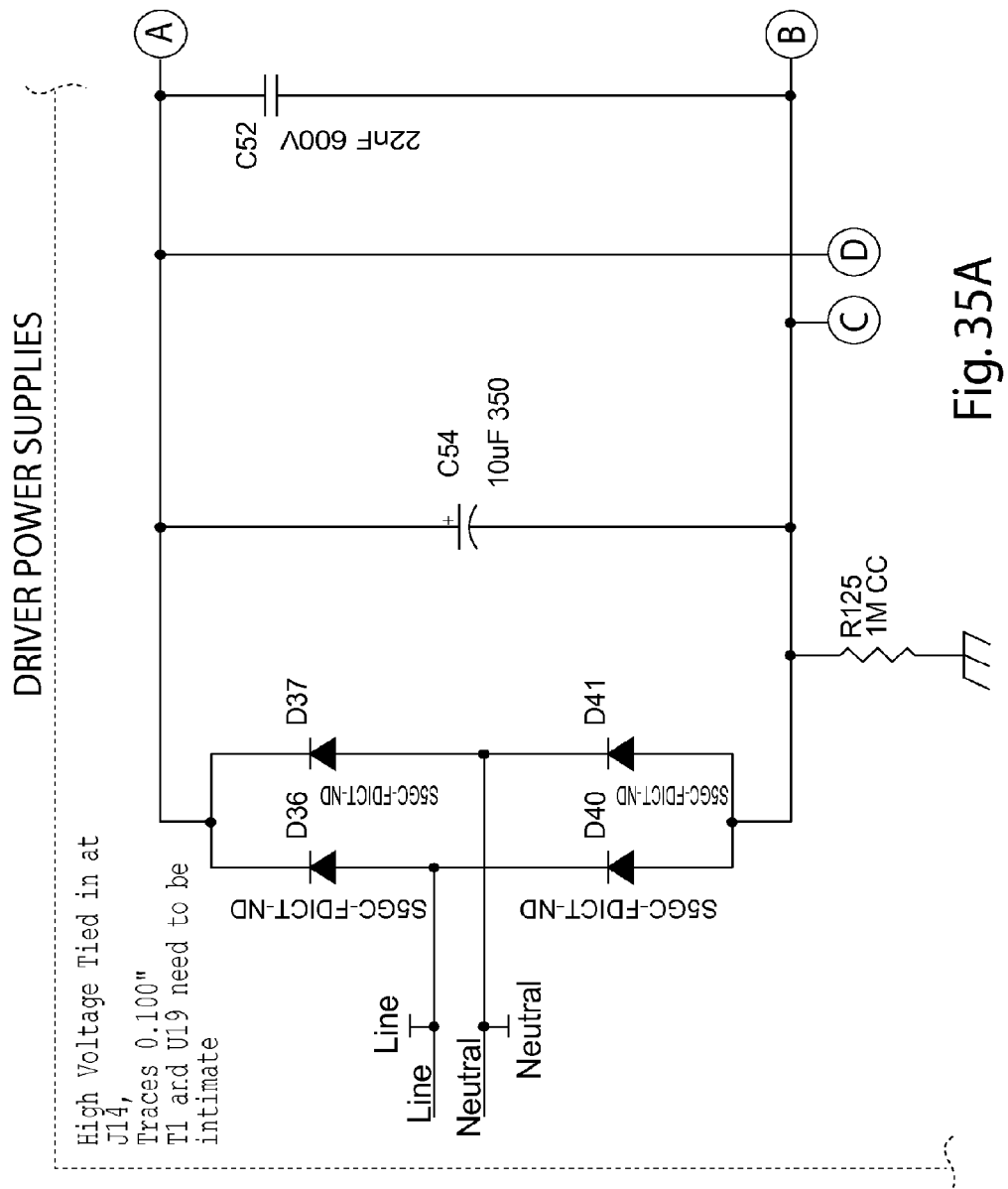
FIG. 35A is a first part of a circuit diagram of a power supply for the switch drivers.
Figure 35D:
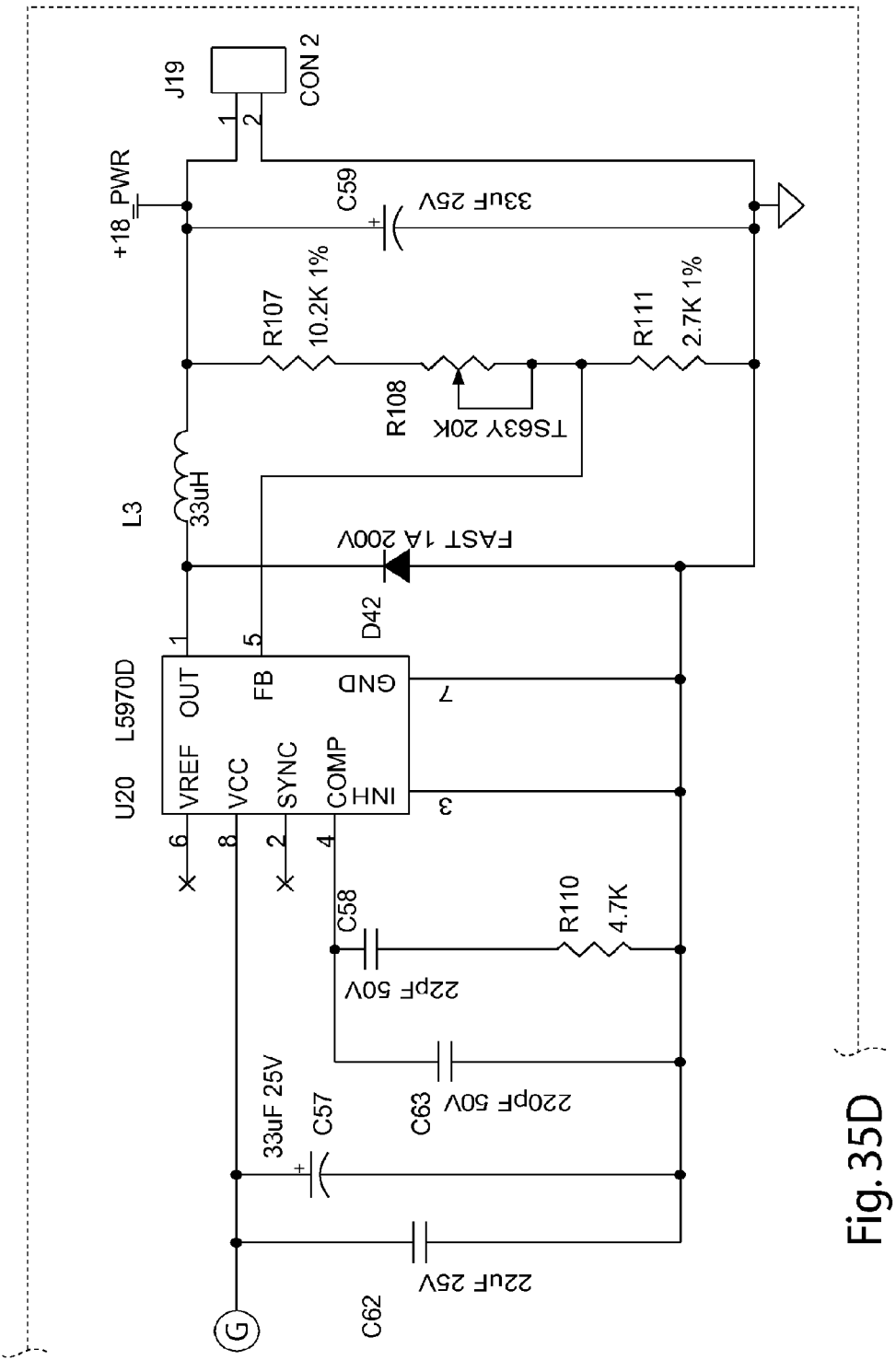
FIG. 35D is a fourth part of a circuit diagram of a power supply for the switch drivers.
Figure 35E:
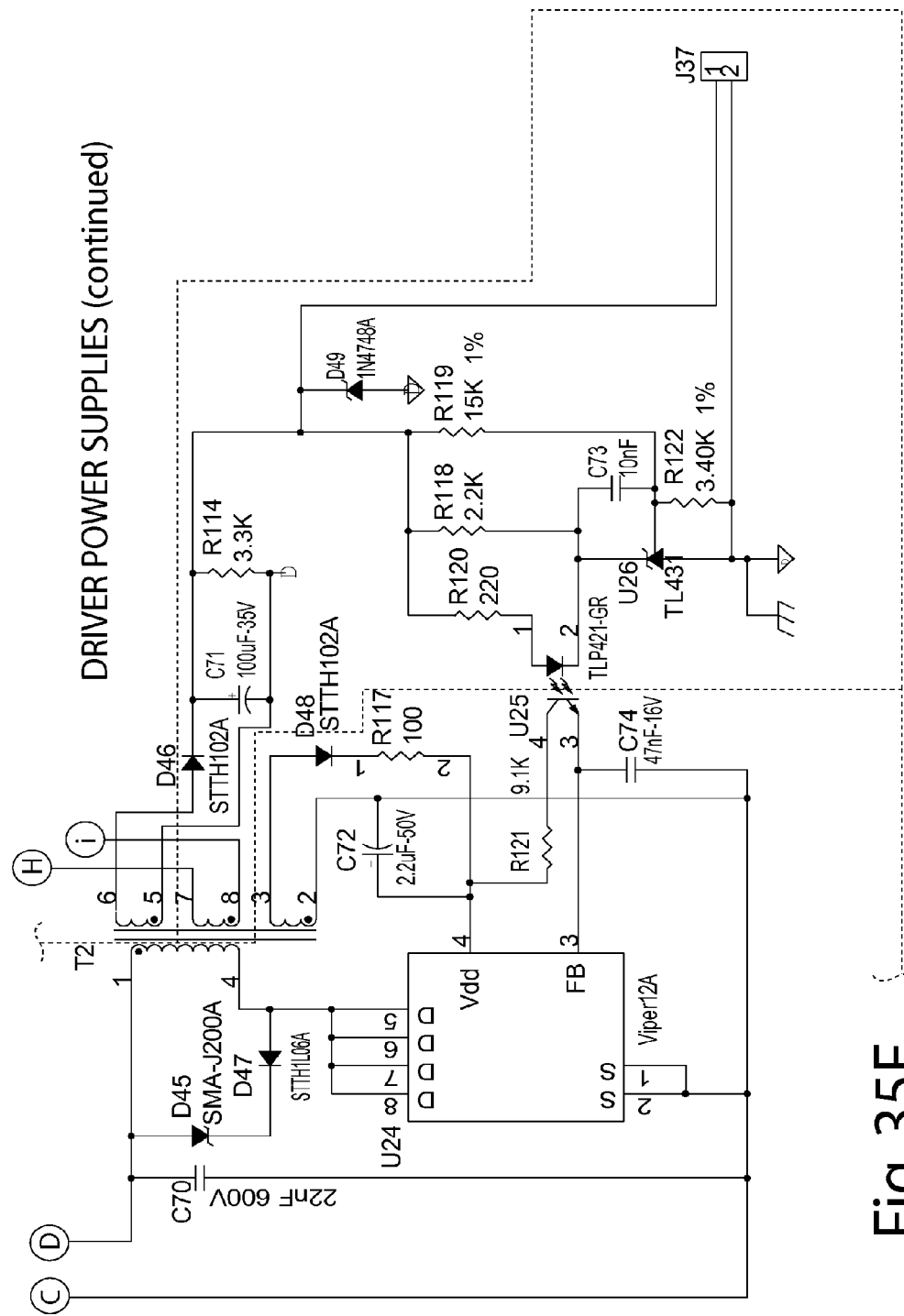
FIG. 35E is a fifth part of a circuit diagram of a power supply for the switch drivers.
Figure 35F:
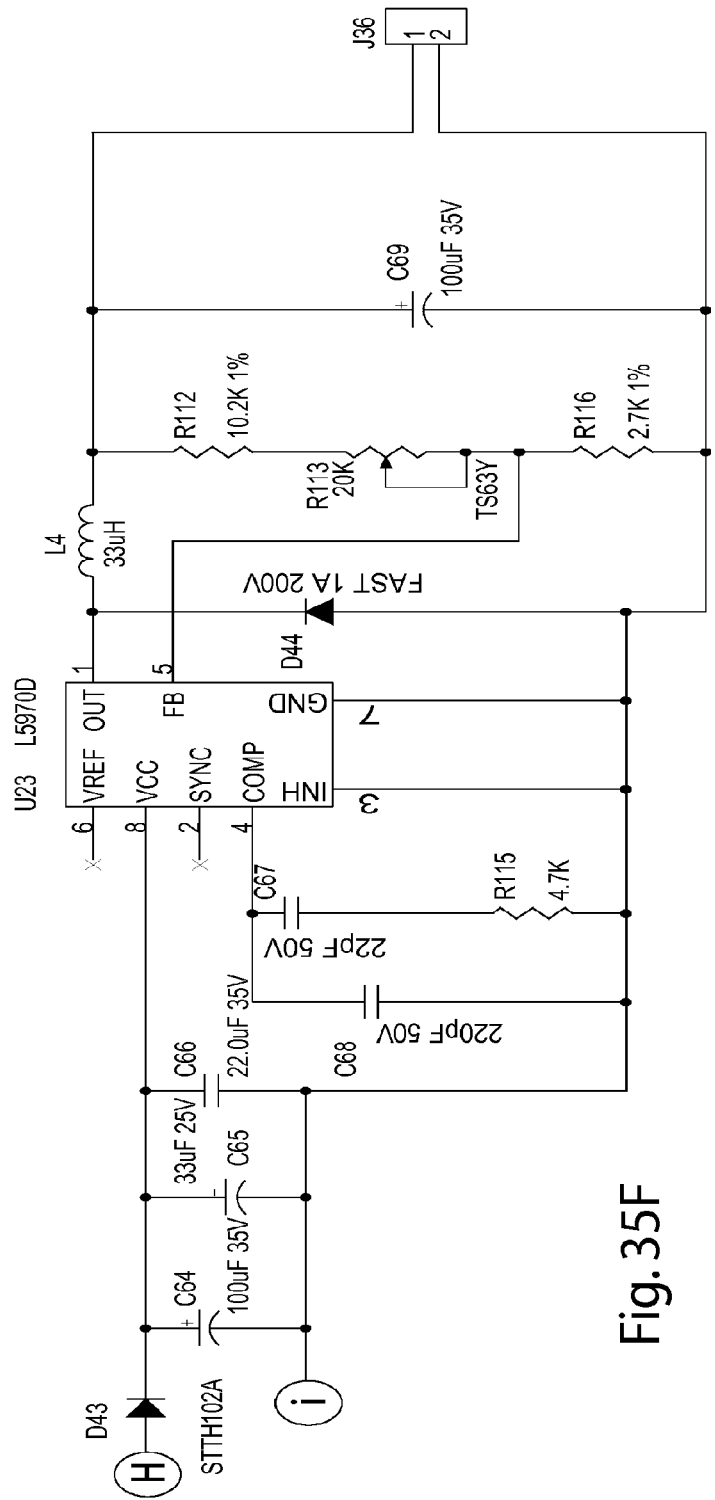
FIG. 35F is a sixth part of a circuit diagram of a power supply for the switch drivers.
Figure 35G:
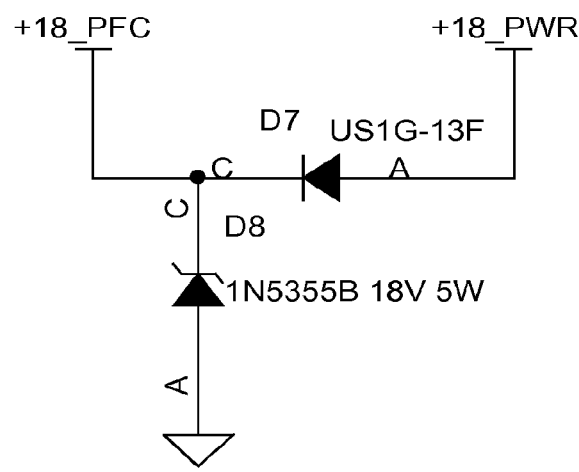
FIG. 35G is a seventh part of a circuit diagram of a power supply for the switch drivers.

FIG. 18 shows a schematic of the circuitry that may be used with any embodiment of the invention. The AC mains input is shown in FIG. 18 and generally designated 800. Examples of power supply circuits are shown in FIGS. 32A-C. AC mains 800 may be connected to a buck converter 802 and a boost converter 806 in conjunction with a buck boost controller 805. The buck converter 802 and boost converter 806 manage the input power and control the DC rail or amplitude as needed to provide the proper power. Examples of drive circuits for a buck converter 802 and a boost converter 806 are shown in FIGS. 31A-D. The power factor correction may be managed using the buck boost system. An example of a buck boost controller 805 for a buck converter 802 and a boost converter 806 is shown in FIGS. 30A-D. A power measurement circuit 804 and a high voltage, temperature and phase sensing circuit 814 may be connected to a power control and communication circuit 810, that in turn regulates the power delivered to the primary coil 530 via the buck boost control 805 and power switch drivers 808. The system uses data from the primary and secondary to tune, reconcile and measure proper operating data and power information. The power measurement circuit 804 and the high voltage sensing, power, temperature and phase circuit 814 allow the system to dynamically adjust to deliver the precise amount of power at the optimum efficiency while enhancing safe operation by monitoring the inner primary drive coil 532 and the outer primary free resonating coil 534. It should be noted that the control circuit is designed to allow a sweep of the operating frequency to adjust for changes in system resonant frequency relative to the selected operating frequency for optimal performance. System resonant frequency may be intentionally changed using switched capacitance controlled by the control systems that can be adjusted on either or both the primary or secondary side of the control system. An example of a power control and communication circuit 810 and a power, temperature and phase sensing circuit is shown in FIGS. 28A-I. An example of a power measurement circuit 804 is shown in FIG. 31E. The switch driver circuit 808 drives the power switches 812 to provide power to the primary coil 530. An example of a switch circuit is shown in FIGS. 28A-G. An example of a power supply for the switch drivers is shown in FIGS. 35A-G. An example of drive circuitry for the primary coil 530 is shown in FIGS. 34A-B. The system may include one or more coupling capacitors 807 positioned between the power switches 812 and the primary coil 530. The system may also include a digital interface and a power and temperature interface to display data for the user. Examples of circuits for these features are shown in FIGS. 30E-F. An example of a primary current monitor range select switch is shown in FIG. 29.

Figure 25A:
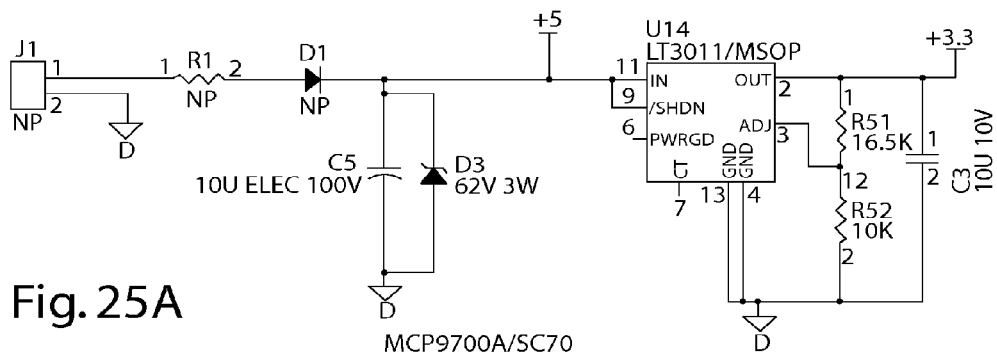
FIG. 25A is a first part of a circuit diagram of a secondary temperature board.
Figure 25B:
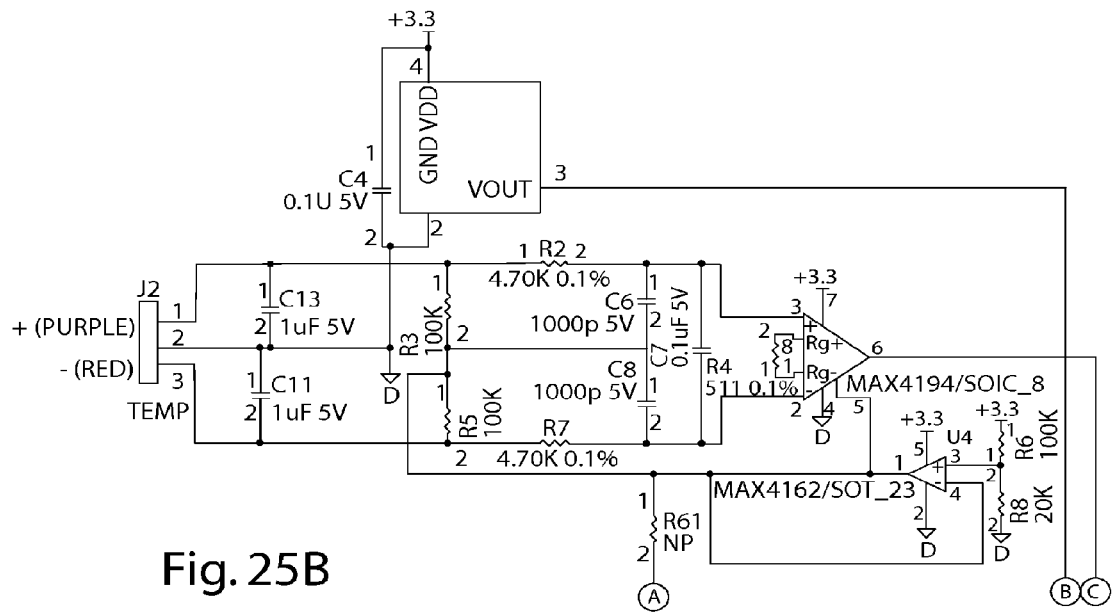
FIG. 25B is a second part of a circuit diagram of a secondary temperature board.
Figure 25C:
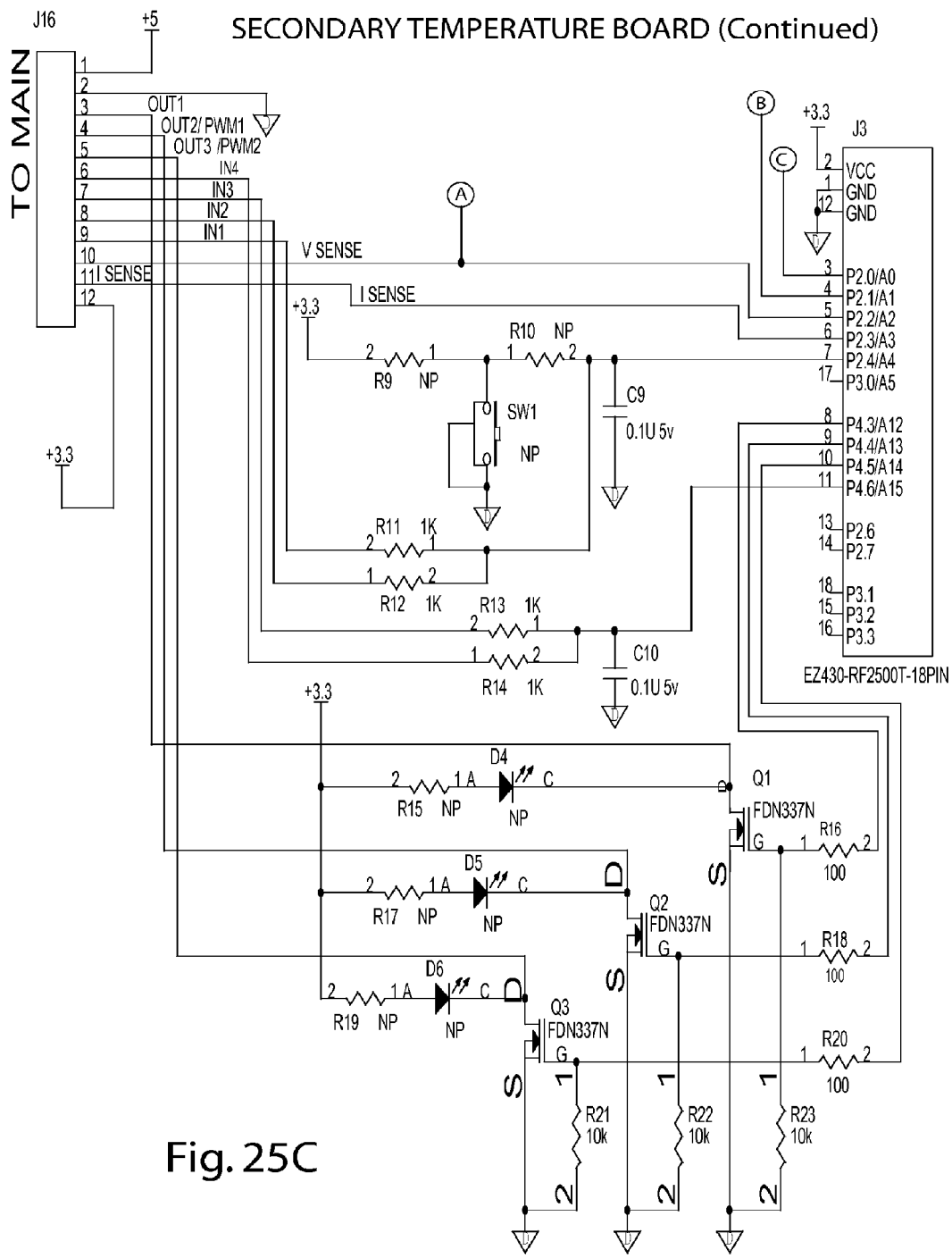
FIG. 25C is a third part of a circuit diagram of a secondary temperature board.
Figure 26A:
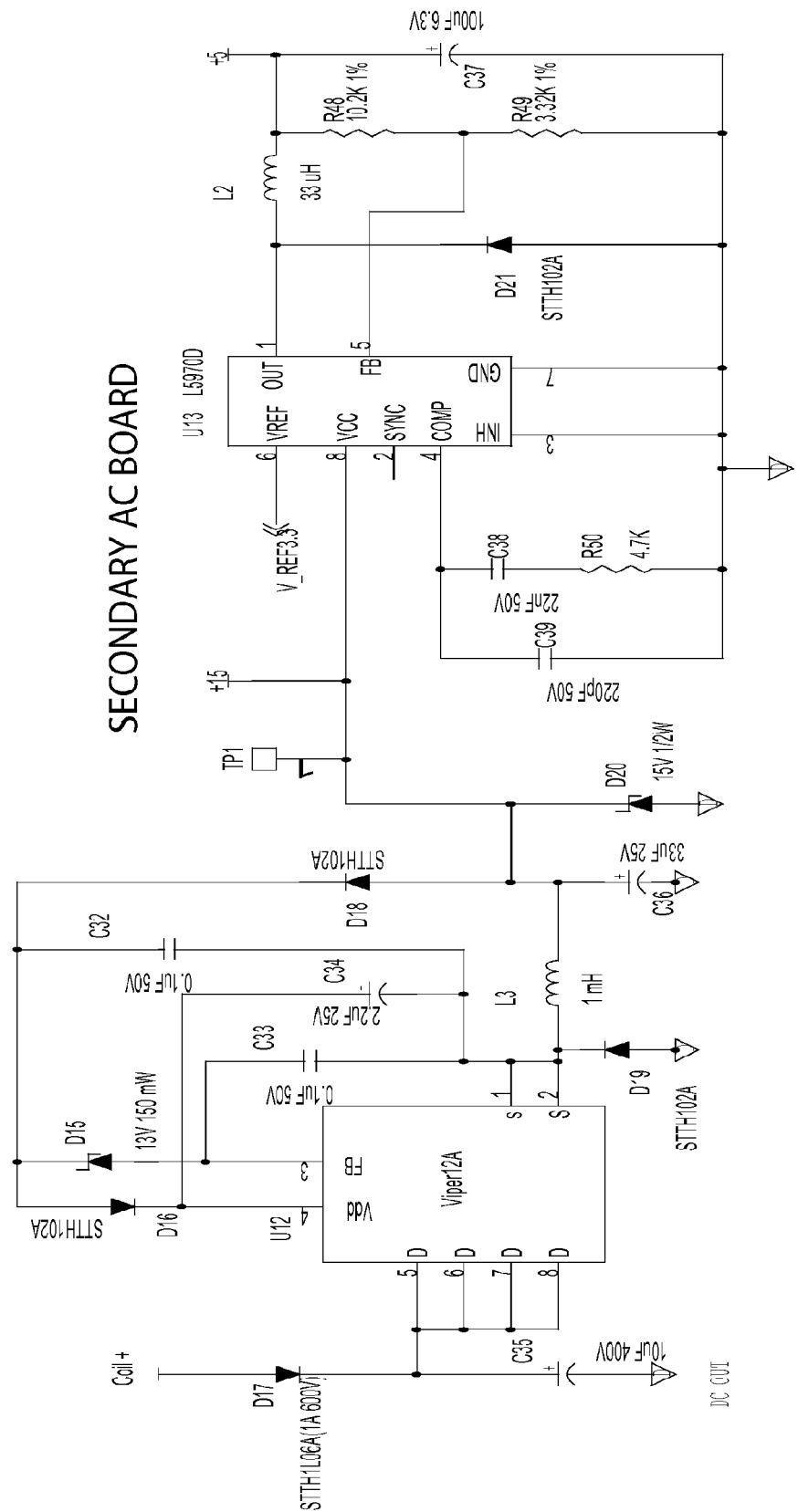
FIG. 26A is a first part of a circuit diagram of a secondary AC board.
Figure 26B:
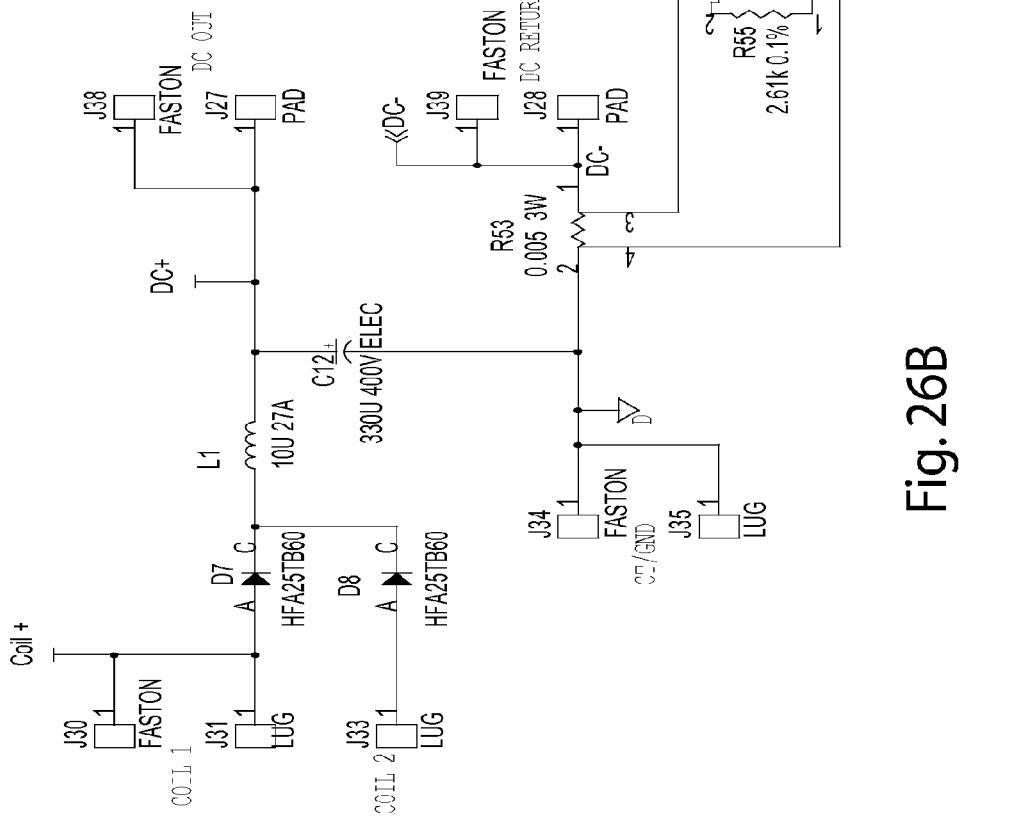
FIG. 26B is a second part of a circuit diagram of a secondary AC board.
Figure 26C:
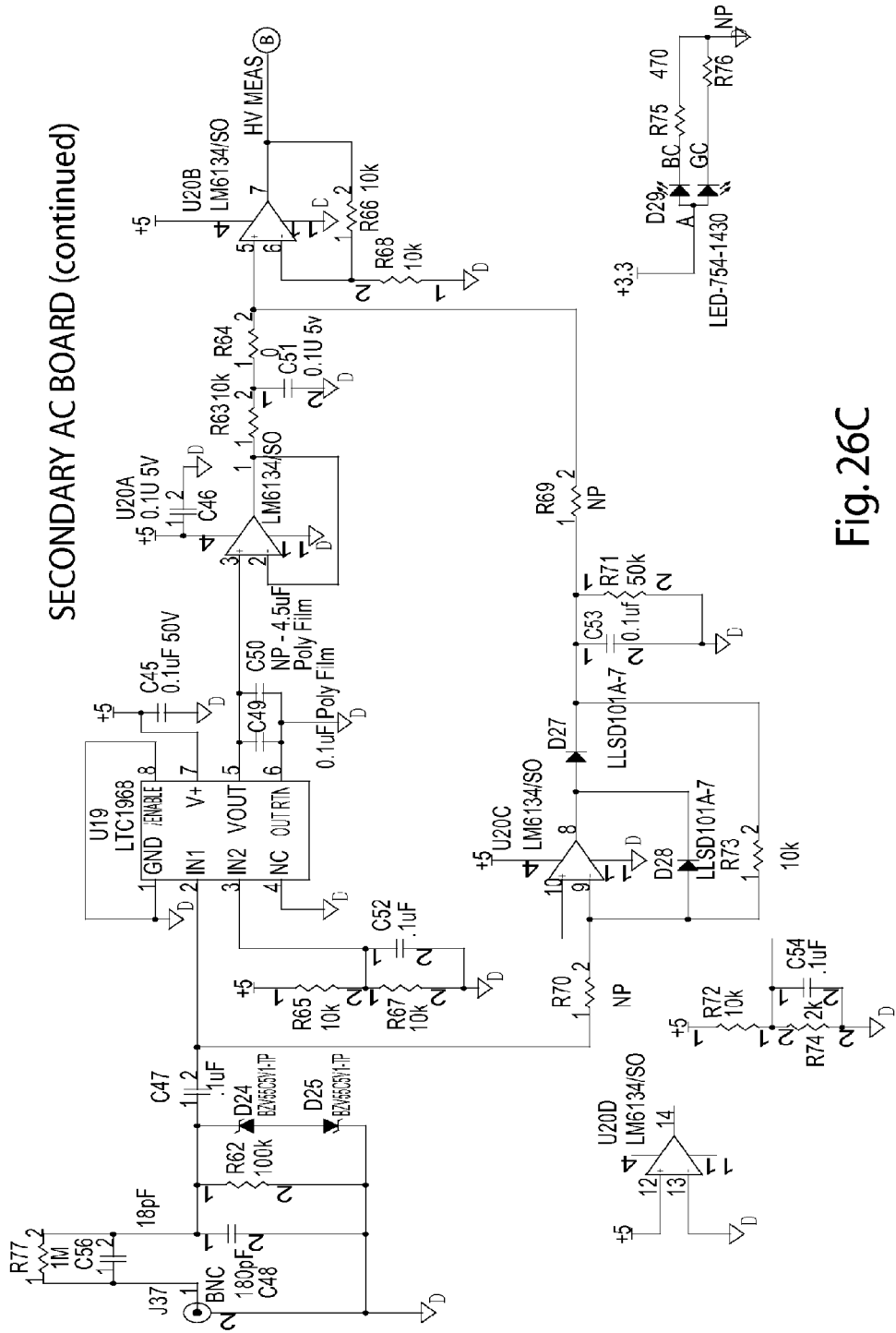
FIG. 26C is a third part of a circuit diagram of a secondary AC board.
Figure 26E:
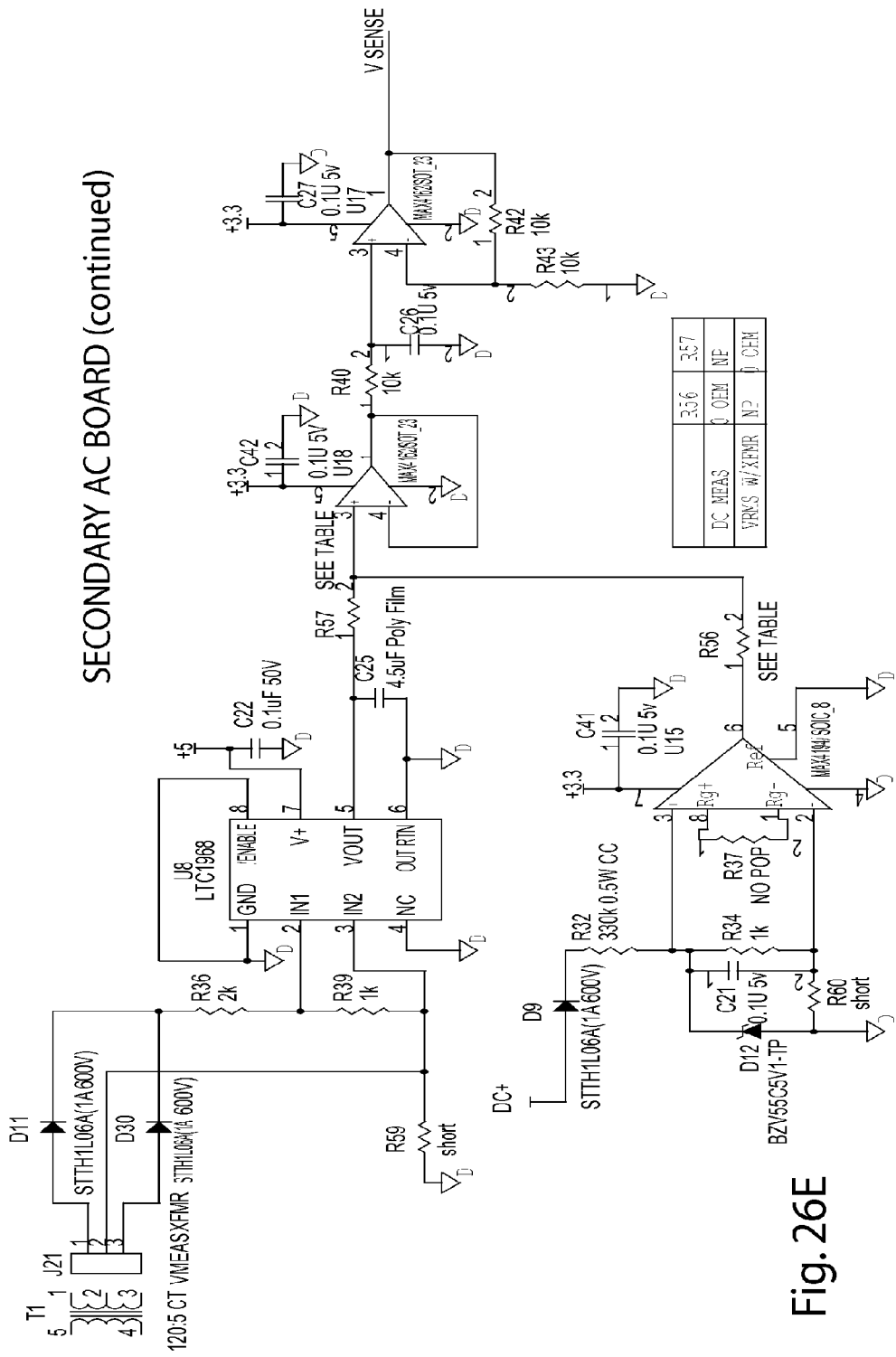
FIG. 26E is a fifth part of a circuit diagram of a secondary AC board.
Figure 27A:
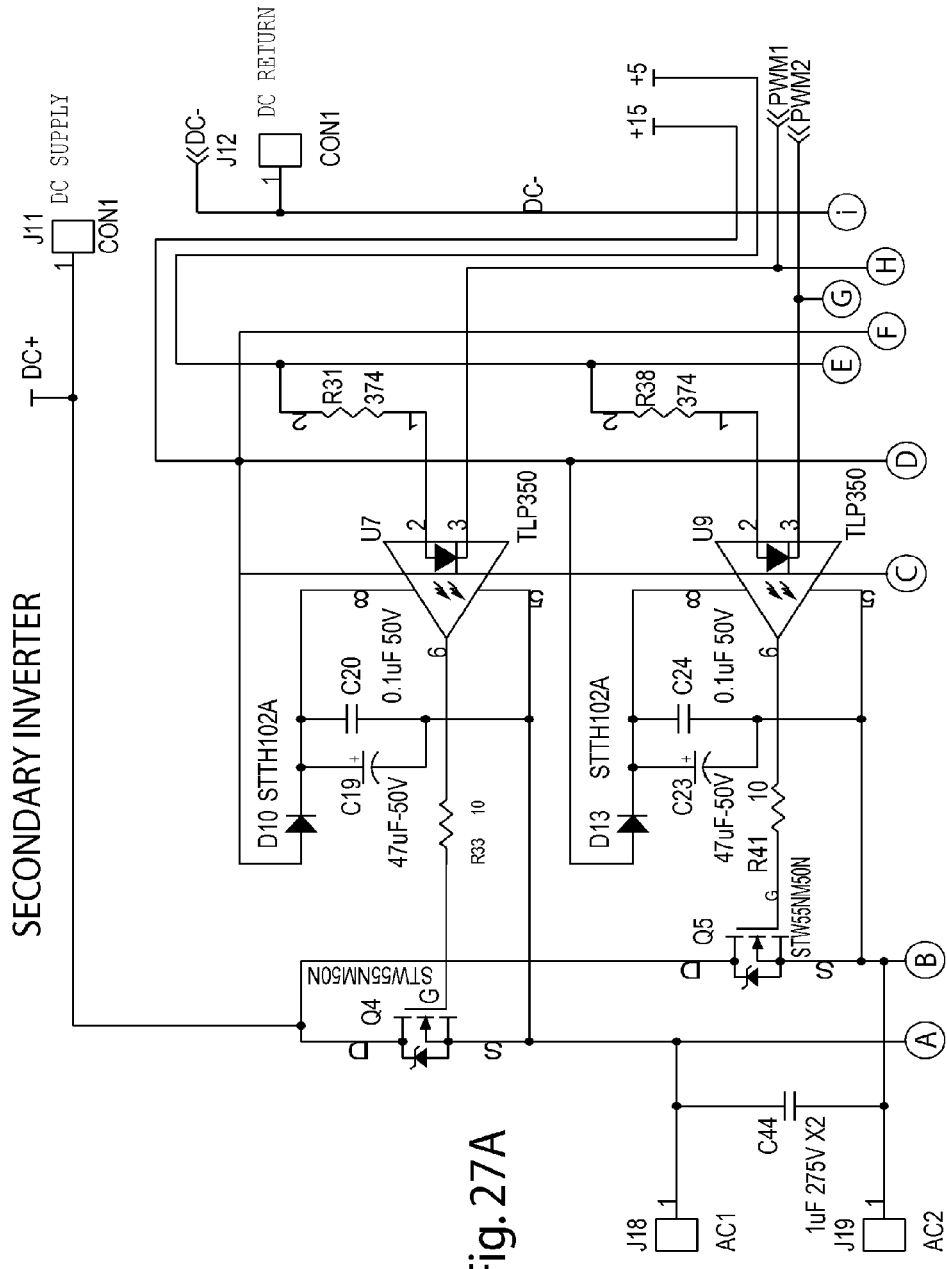
FIG. 27A is a first part of a circuit diagram of a secondary inverter.
Figure 27B:
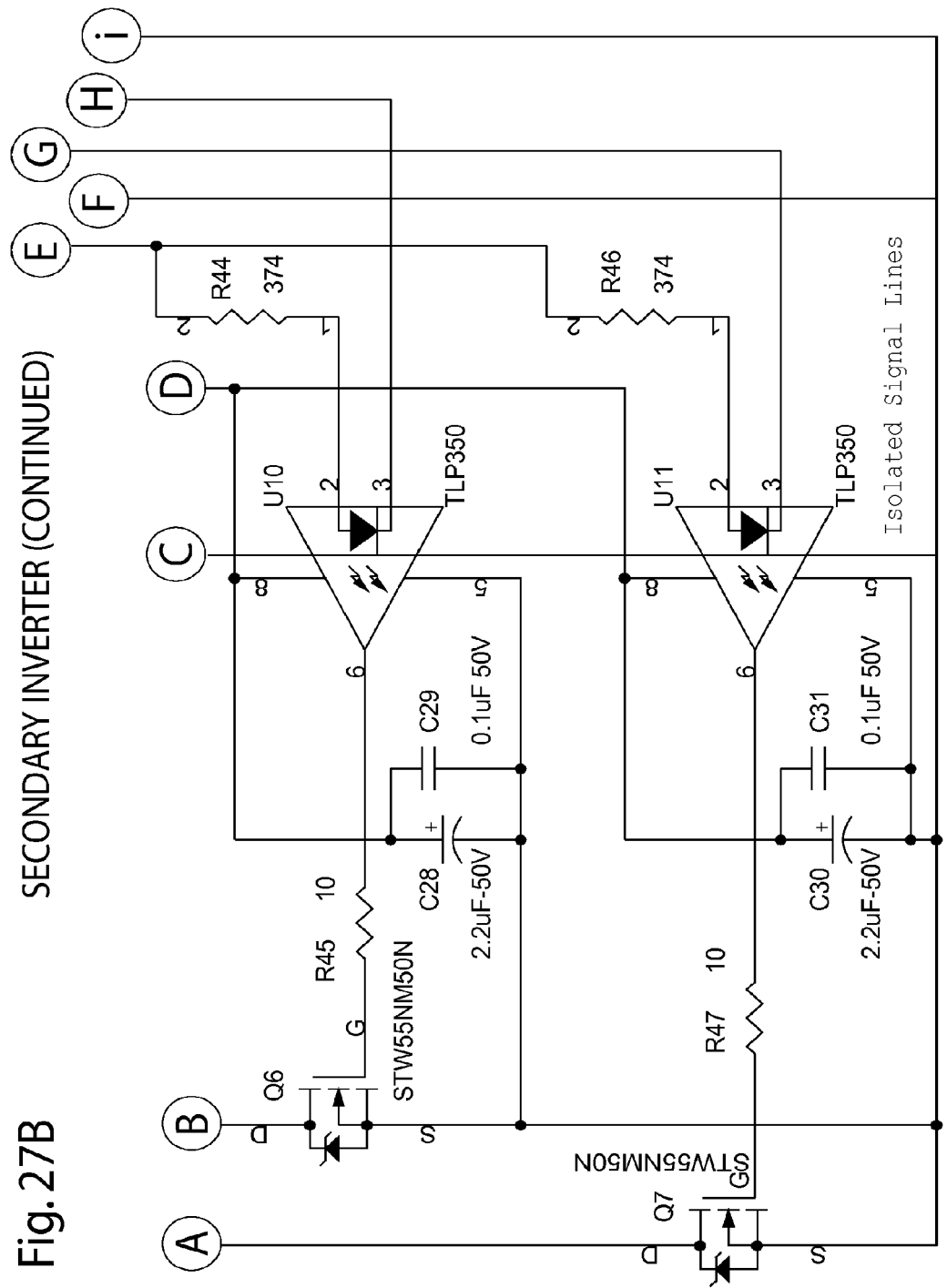
FIG. 27B is a second part of a circuit diagram of a secondary inverter.
Figure 28A:
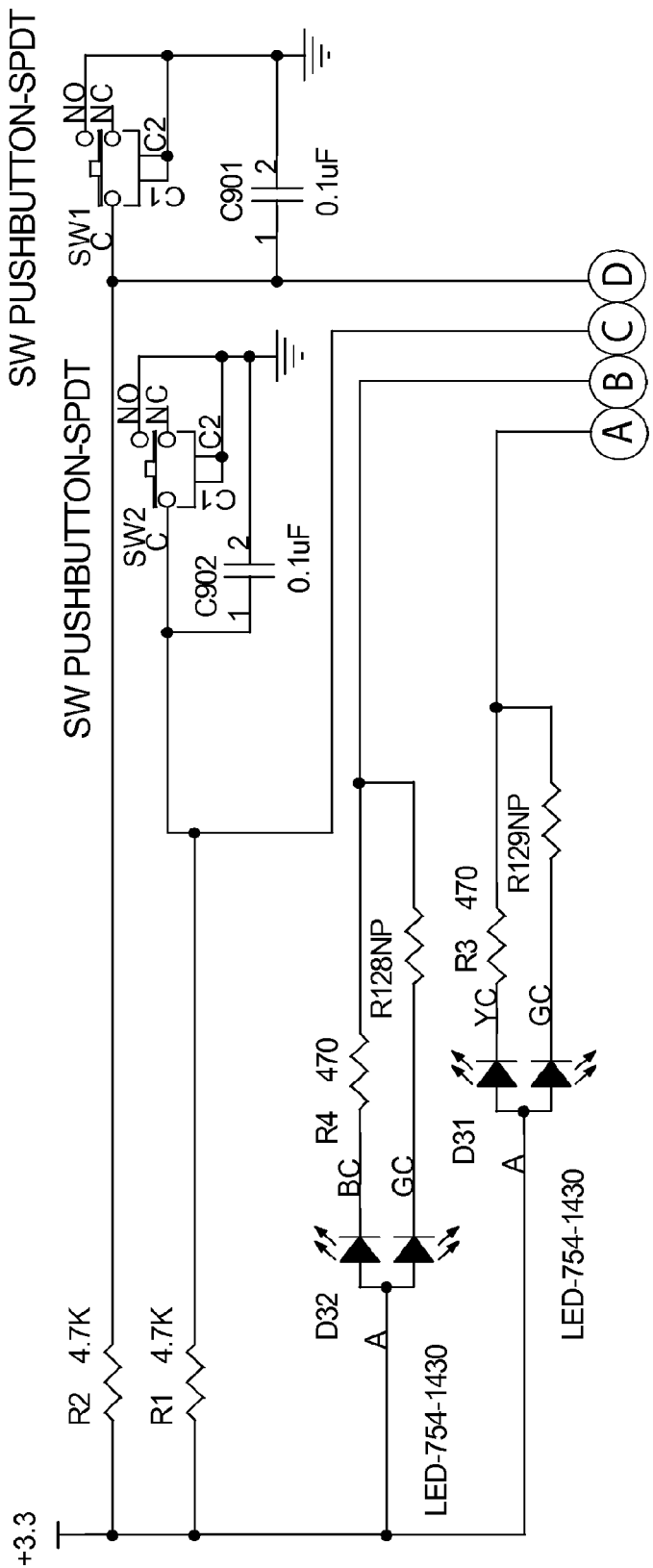
FIG. 28A is a first part of a circuit diagram of a primary controller.
Figure 28B:
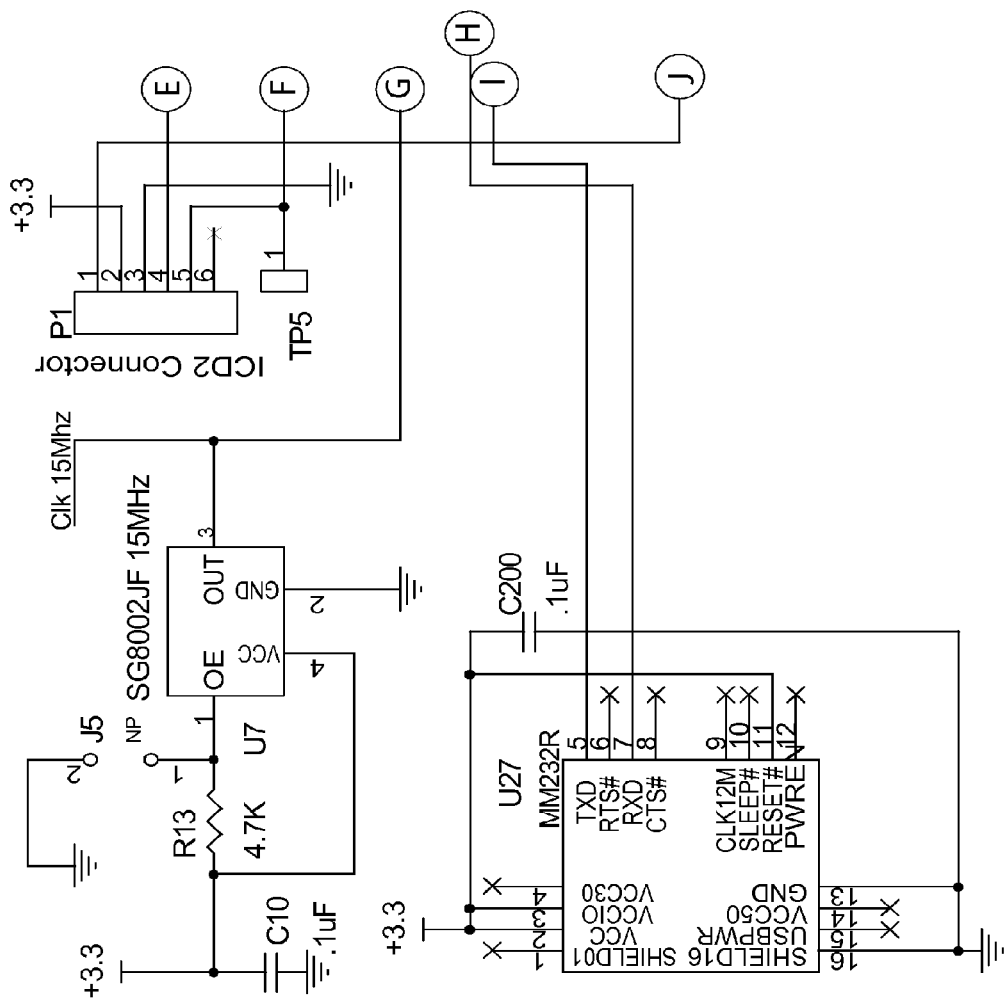
FIG. 28B is a second part of a circuit diagram of a primary controller.
Figure 28C:
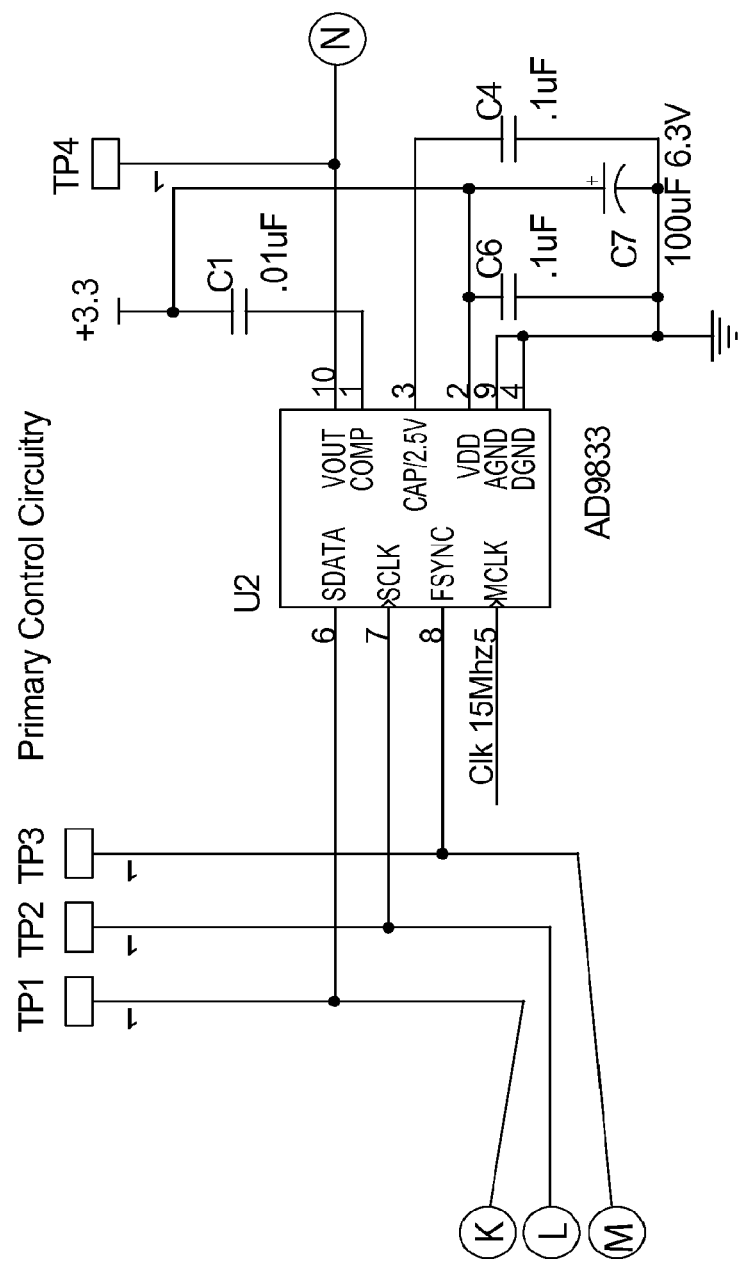
FIG. 28C is a third part of a circuit diagram of a primary controller.
Figure 28D:
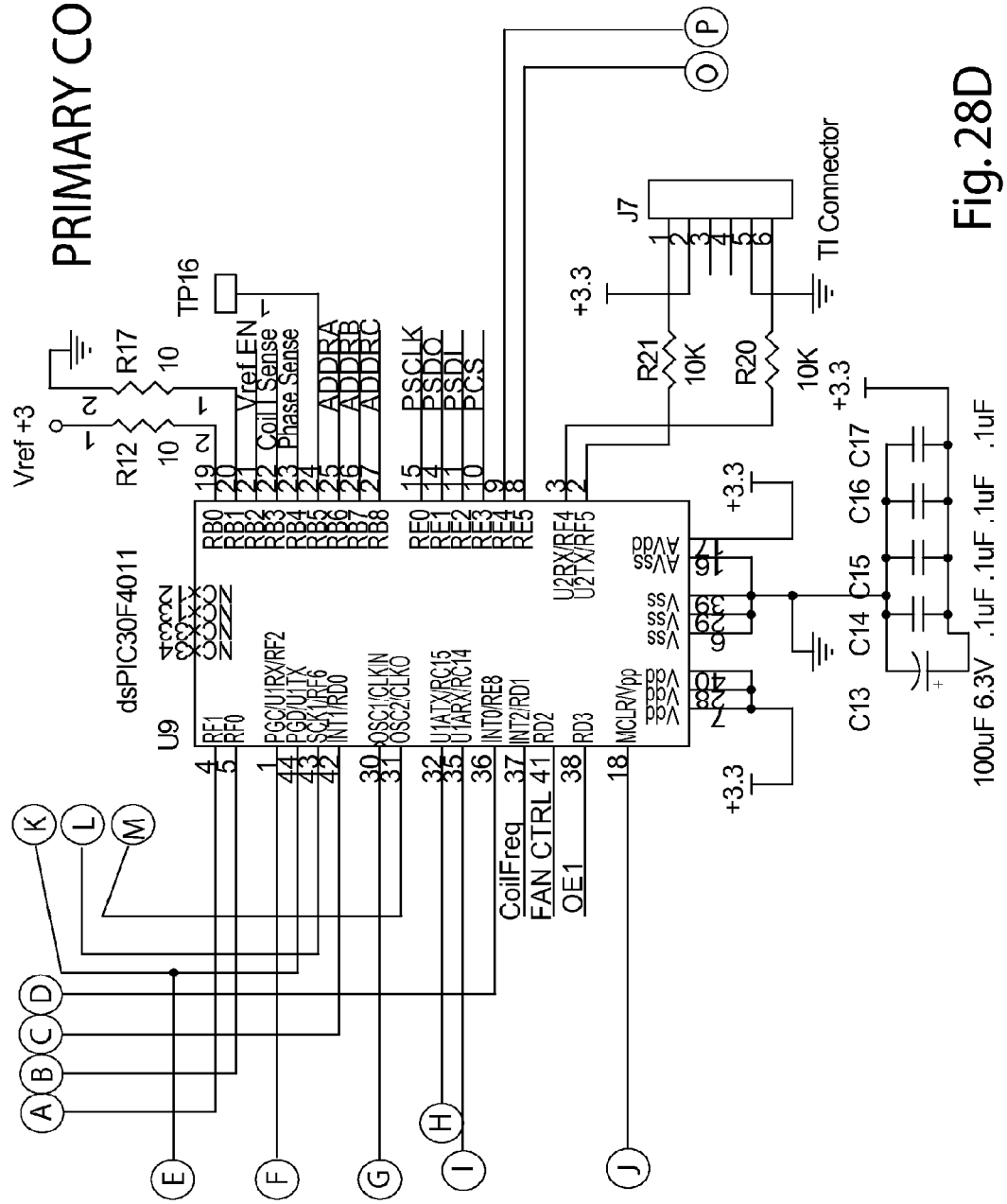
FIG. 28D is a fourth part of a circuit diagram of a primary controller.
Figure 28E:
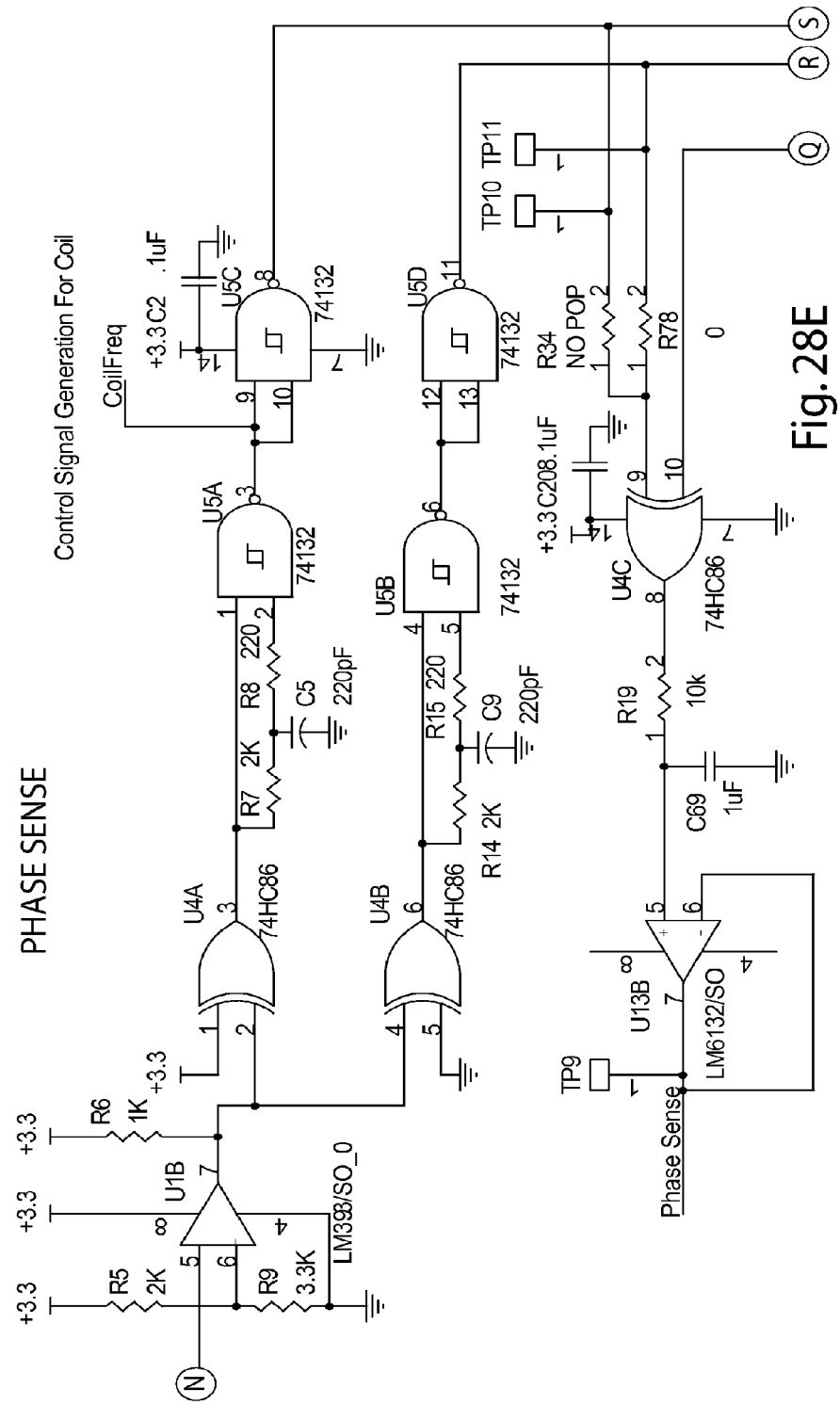
FIG. 28E is a fifth part of a circuit diagram of a primary controller.
Figure 28F:
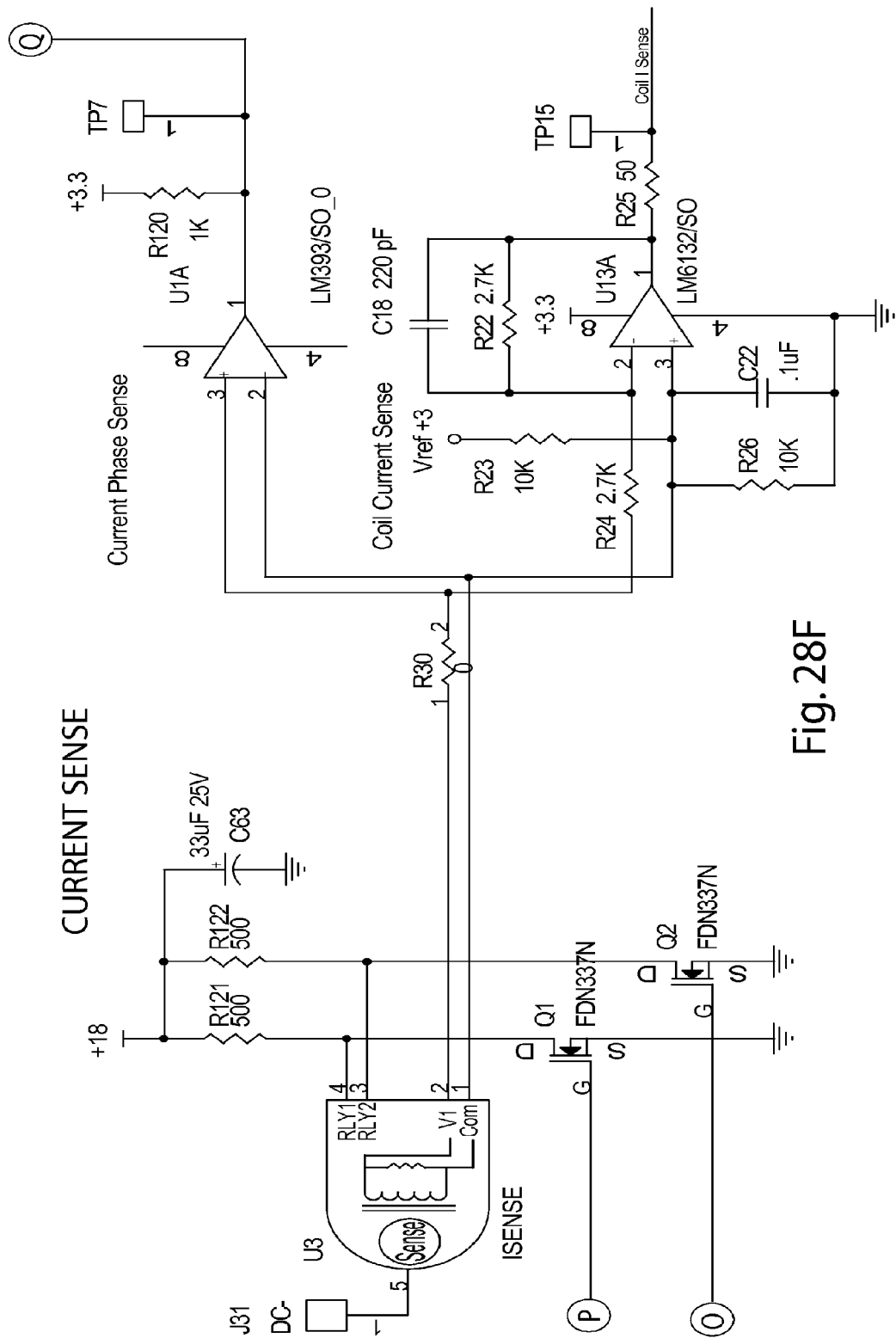
FIG. 28F is a sixth part of a circuit diagram of a primary controller.
Figure 28G:
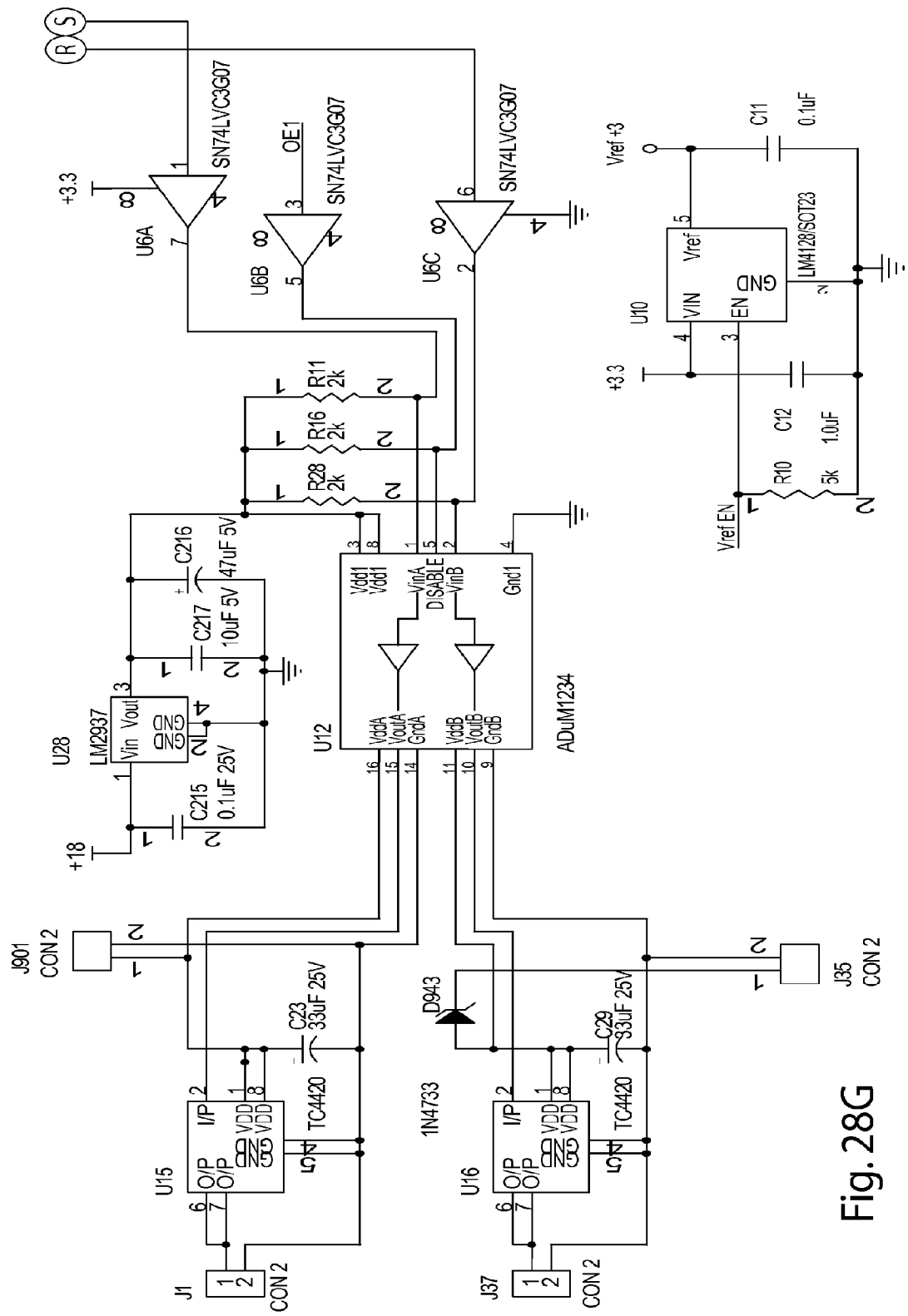
FIG. 28G is a seventh part of a circuit diagram of a primary controller.
Figure 28H:
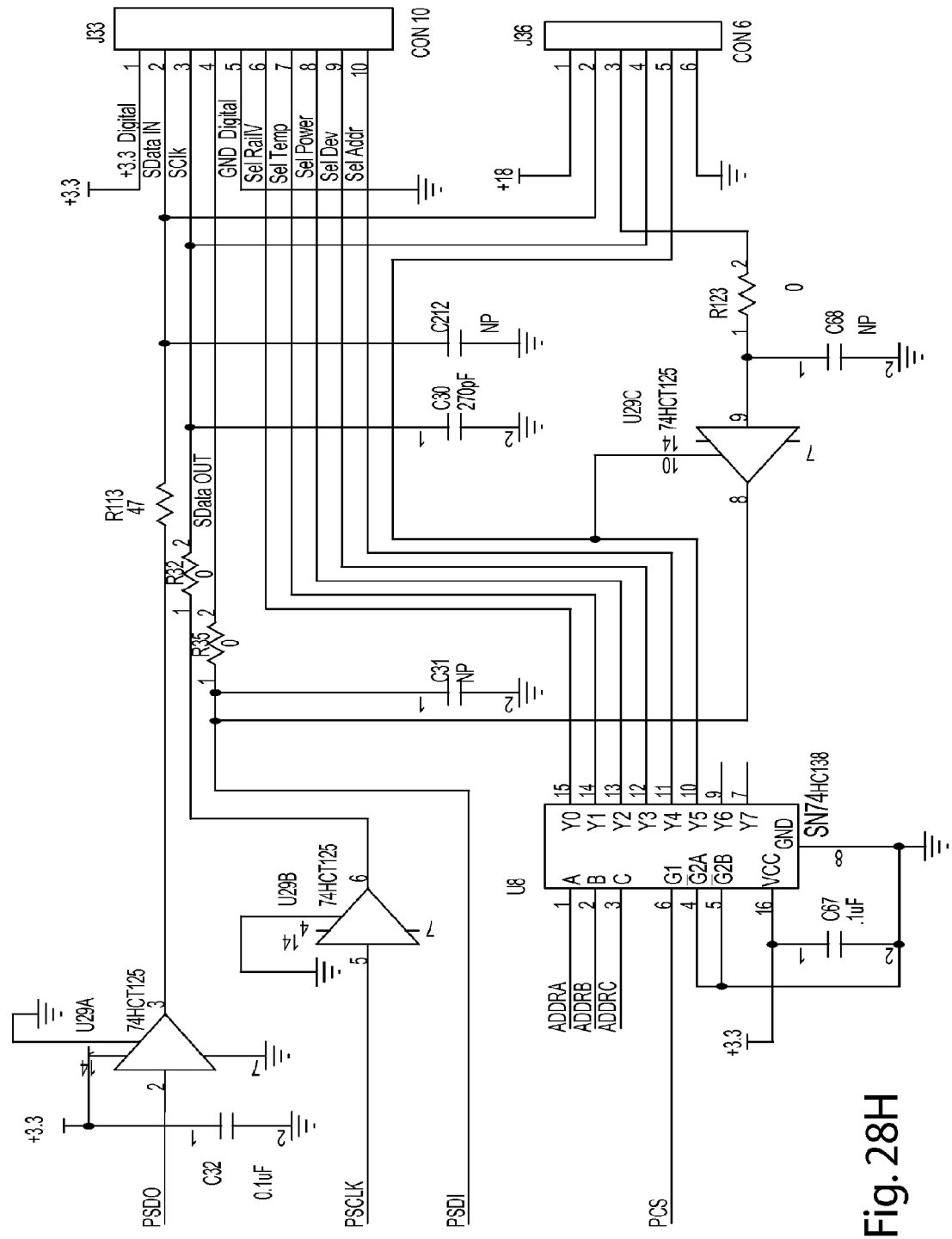
FIG. 28H is an eighth part of a circuit diagram of a primary controller.
Figure 28I:
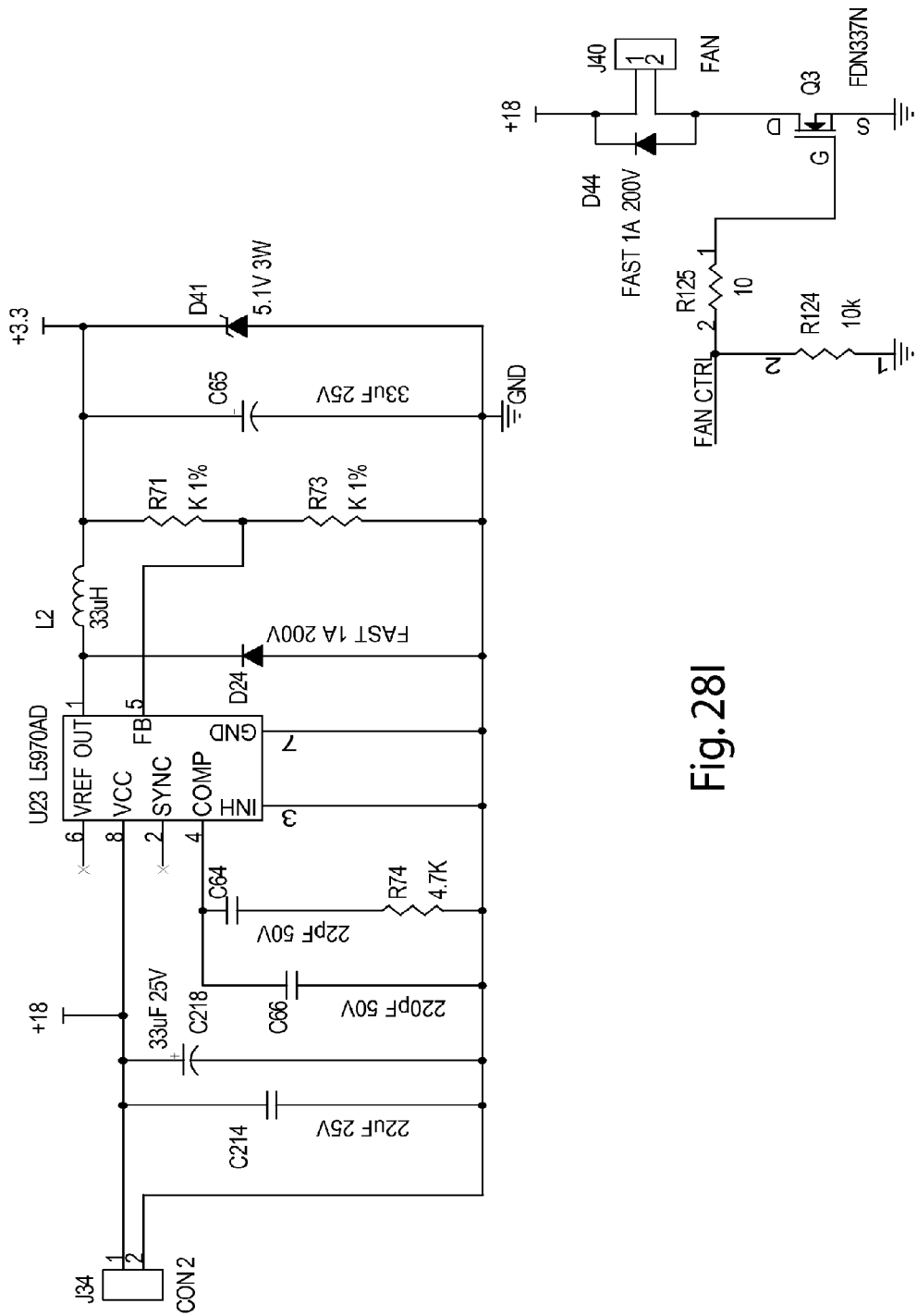
FIG. 28I is a ninth part of a circuit diagram of a primary controller.
Figure 33:
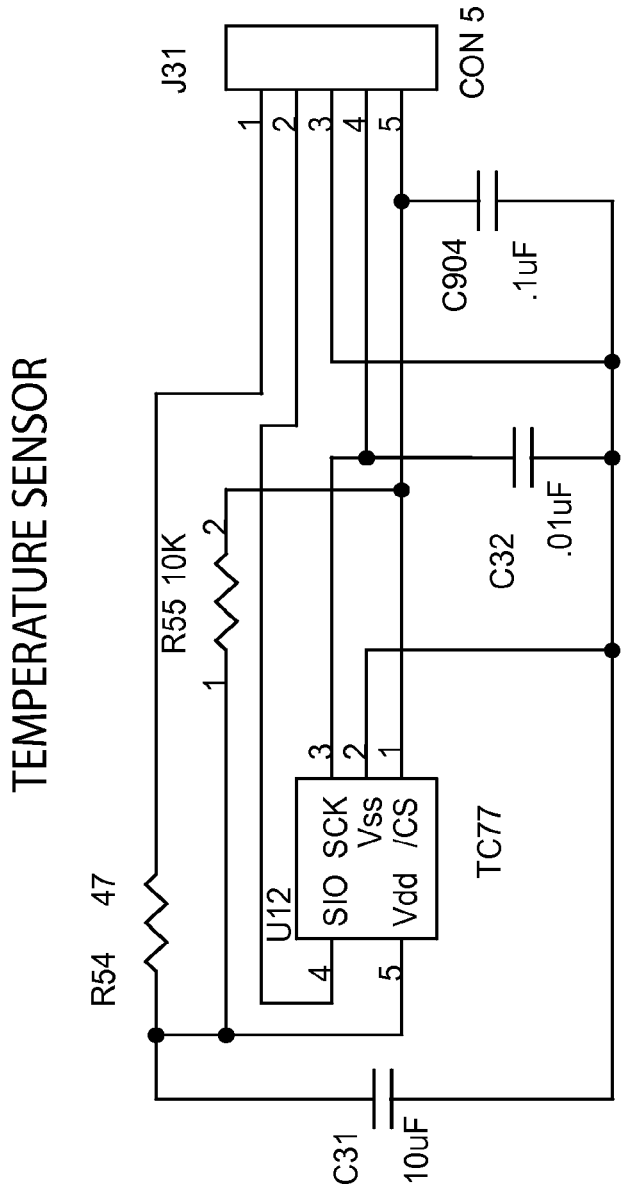
FIG. 33 is a circuit diagram of a temperature circuit.

The secondary coil 540 receives inductive power from the primary coil 530. An example of the circuitry associated with the secondary coil 540 is shown in FIG. 26A-E. The secondary coil 540 may be connected to a rectifier and lowpass filter circuit 820 that rectifies the variable high frequency AC voltage to DC voltage that can, if desired, be used to directly charge a battery or supply a DC load. The rectifier circuit 820 may be connected to an inverter circuit 822 to convert the DC voltage back to a fixed, low frequency AC, if desired, to replace the need for a plug. Examples of a fixed, low frequency AC include but are not limited to 50, 60 and 400 Hertz. An example of a secondary inverter circuit is shown in FIGS. 27A-B. This configuration allows for a system that may operate with or without a plug connection. For example, the vehicle may include a plug or a secondary coil for charging. A monitoring, feedback and control circuit 824 may monitor the voltage, phase and frequency of the input to the secondary coil 540, including monitoring the inner secondary receiver coil 542 and the outer secondary free resonating coil 544. The monitoring, feedback and control circuit 824 measures the input to the inverter circuit 822 and switches between AC and DC, depending on the source needed. The monitoring, feedback and control circuit 824 prevents the system from attempting to supply multiple AC voltages simultaneously. This monitor can also allow multiple power sources or one connection at a time, depending on whether it is safe for multiple sources. Isolating the wireless source in this manner may enhance the safety of the system. A temperature monitoring circuit 826 may monitor the temperature of the secondary coil 540 and a high voltage sensor may monitor the voltage of the secondary coil 540, including the inner secondary receiver coil 542, the outer secondary free resonating coil 544 and associated circuitry. An example of a secondary temperature board circuit is shown in FIGS. 25A-C and an example of a circuit for a temperature sensor is shown in FIG. 33. The monitoring circuitry associated with the secondary coil 540 may provide feedback to the primary coil 530 for proper operation, for example, through the monitoring, feedback and control circuit 824.

Figure 19:
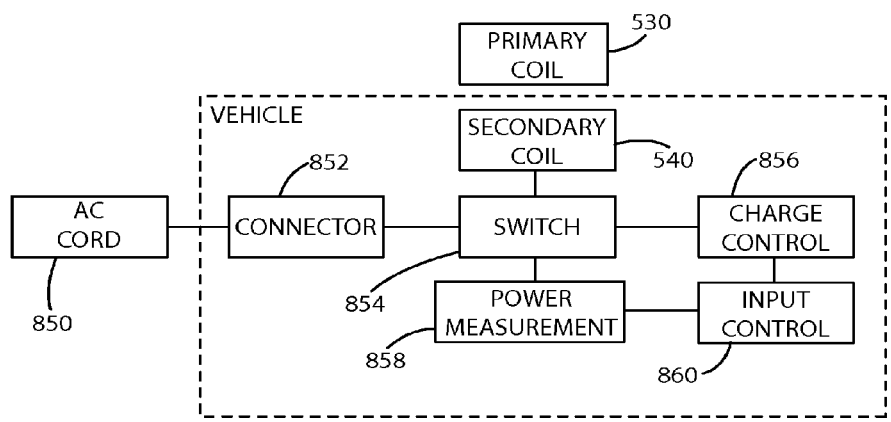
FIG. 19 is a schematic diagram of a monitoring system.

FIG. 19 shows a monitoring system for input voltage and current in which the vehicle is adapted to receive both wired and wireless power. The system includes two power sources, a primary coil 530 and an AC cord 850. The primary coil 530 may inductively transfer power to the vehicle through the secondary coil 540 as discussed above. If AC power is available through an AC cord 850, the AC cord 850 may be connected to connector 852. Both secondary coil 540 and connector 852 are connected to switch 854. A power measurement circuit 858 and a charge control circuit 856 may monitor the input conditions and activate switch 854 to switch between power from the secondary coil 540 and power from the AC cord 850. Selecting which power to use may depend on a variety of factors, including the voltage available from each source. The power is transmitted to input control 860. In this manner, the system monitors the input conditions and switches the power input to the best possible conditions for charging.

Figure 21:
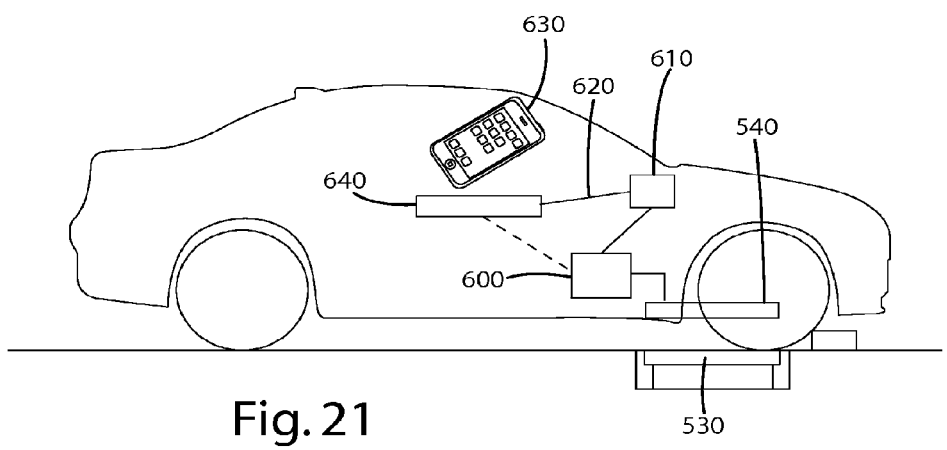
FIGS. 21 and 22 are schematic diagrams of a vehicle network and a charging network.
Figure 22:
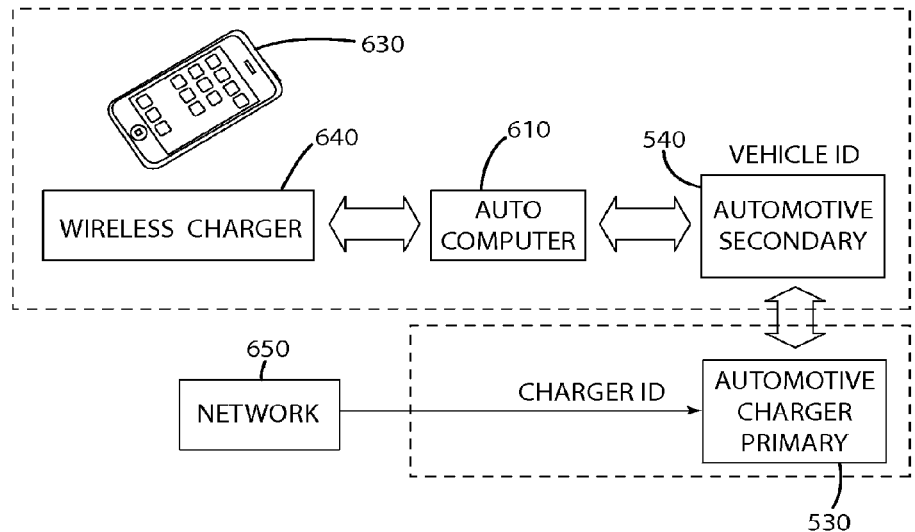

FIGS. 21-22 show a vehicle network and a charging network that may be used with any embodiment of the invention. As shown in FIG. 21, secondary coil 540 is connected to wireless supply interface 600. Wireless supply interface 600 is connected to the automotive computer 610 and/or the wireless power supply 640. The automotive computer may be connected to the wireless power supply 640 through automotive bus 620. Each of these devices may be in communication with one another. As shown in FIG. 22, a network 650 may communicate with the automobile, the mobile device 630 and the charger to retrieve their unique identification codes. This may be useful to track charging time, charging location and cost. The network may also communicate with the mobile device 630 to obtain approval to begin charging. If the automotive identification code is pre-approved, approval through the mobile device 630 may not be required.

Figure 23:
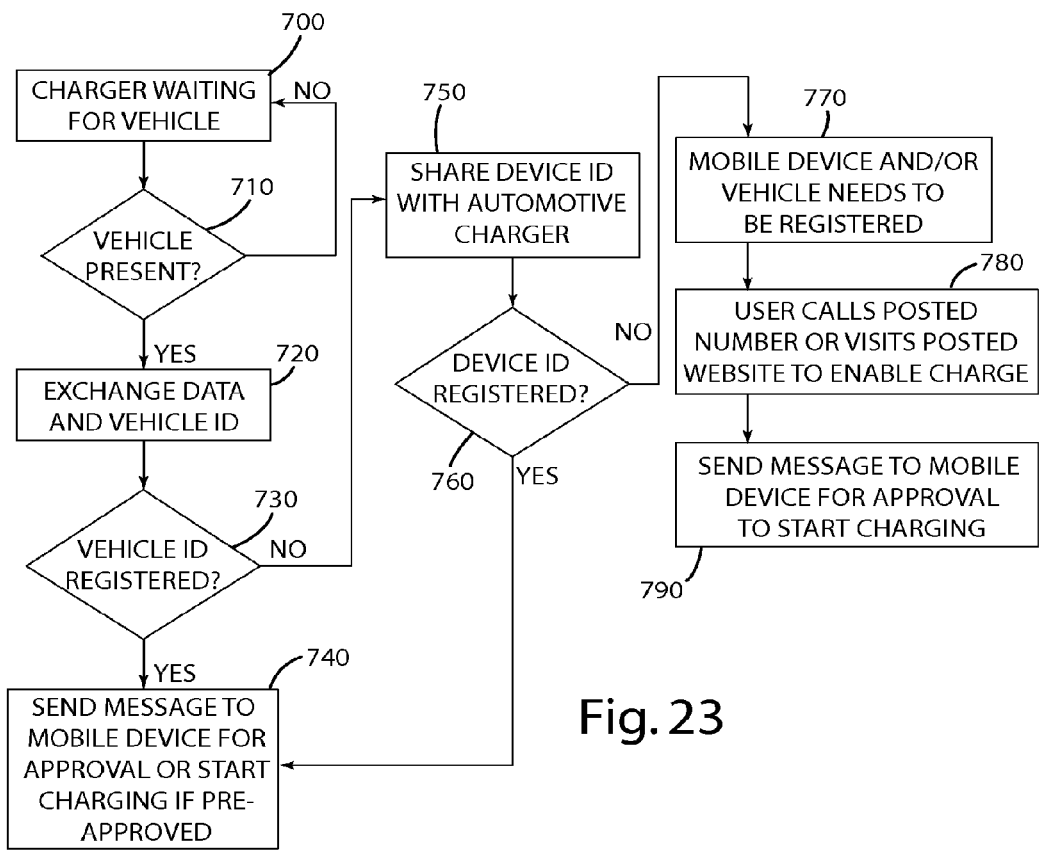
FIG. 23 is a flow chart showing the authorization and charging process.

FIG. 23 shows a flow chart displaying the process for using the vehicle network and the charging network described above. The charger waits for a vehicle 700 in a dormant, low-energy mode and monitors whether a vehicle is present 710. If a vehicle is present, the vehicle identification code is provided to the charging network 720. If the vehicle identification code is registered, a message is sent to the mobile device 740 for approval, or charging commences if the vehicle identification code is pre-approved. If the vehicle identification code is not registered, the mobile device identification code is shared with the charging network 750 and it is determined whether the device identification code is registered 760. If the device identification code is registered, a message is sent to the mobile device for approval 740. If the device identification code is not registered, the mobile device and/or vehicle will need to be registered 770. To register the mobile device and/or vehicle, a user may call a number or visit a website posted by the charging area to enable charging 780. A message is then sent to the mobile device for approval to start charging 790 unless the vehicle and user are already registered for payment services.

Reference is made to co-pending U.S. application Ser. No. 12/349,355, entitled "Metered Delivery of Wireless Power" filed Jan. 6 2009, now U.S. Pat. No. 8,069,100, which is incorporated by reference. It is noted that the "charge for a charge" concepts of the referenced application may be incorporated into any of the embodiments described in the present application.

The above descriptions are those of current embodiments of the invention. Various alterations and changes can be made without departing from the spirit and broader aspects of the invention as defined in the appended claims, which are to be interpreted in accordance with the principles of patent law including the doctrine of equivalents. It is noted that any element from any of the above embodiments may be combined or interchanged with another of the above embodiments. Any references to claim elements in the singular, for example, using the articles "a," "an," "the," or "said," is not to be construed as limiting the element to the singular.

The invention claimed is:

1. A motion detection system of a vehicle charging system for detecting an object moving in a space between a primary coil and a secondary coil, the motion detection system comprising:

a sensor, separate from power transmission circuitry, configured to measure a characteristic for detecting movement of the object;

a charging circuit electrically connected to the sensor and operable to prevent activation of the primary coil from a non-energized state in response to the movement of the object being detected by the sensor in the space between the primary coil and the secondary coil;

at least one of an alarm and a vibration for encouraging the object to vacate the space between the primary coil and the secondary coil, wherein the sensor will trigger the at least one of an alarm and a vibration when an object is detected by the sensor.

2. The motion detection system of claim 1 wherein the presence of the object between the primary coil and the secondary coil would otherwise degrade the efficiency of an inductive coupling between the primary coil and the secondary coil.

3. The motion detection system of claim 1 wherein the sensor is a passive infrared sensor.

4. The motion detection system of claim 1 wherein the sensor is an ultrasonic sensor.

5. The motion detection system of claim 1 wherein the sensor is a microwave sensor.

6. An inductive charging system for a vehicle including a secondary coil, the inductive charging system comprising:

a primary coil to provide wireless power to the secondary coil, the primary coil being spaced apart from the secondary coil;

a motion sensor, separate from power transmission circuitry, configured to measure a characteristic to detect movement of an object between the primary coil and the secondary coil; and a charging circuit electrically coupled to the primary coil and the motion sensor, the charging circuit being adapted to prevent the transfer of power from the primary coil from a non-energized state to the secondary coil in response to movement of the object being detected between the primary coil and the secondary coil by the motion sensor, wherein the presence of the object between the primary coil and the secondary coil would otherwise degrade the transfer of wireless power from the primary coil to the secondary coil.

7. The inductive charging system of claim 6 wherein motion sensor is a passive infrared sensor.

8. The inductive charging system of claim 6 wherein motion sensor is an ultrasonic sensor.

9. The inductive charging system of claim 6 wherein motion sensor is a microwave sensor.

10. The inductive charging system of claim 6 further including an alarm to encourage the object to vacate the space between the primary coil and the secondary coil.

11. The inductive charging system of claim 6 further including a vibration unit for generating a vibration in a space between the primary coil and the secondary coil to encourage the object to vacate the space between the primary coil and the secondary coil.

12. A method comprising:

providing a vehicle charging system including a primary coil adapted to transfer power to a secondary coil associated with a vehicle;

providing a motion sensor, separate from power transmission circuitry, configured to measure a characteristic to monitor a charging area between the primary coil and the secondary coil;

in response to the motion sensor detecting movement of an object in the charging area between the primary coil and the secondary coil, preventing activation of the primary coil from a non-energized state and initiating an alarm or a vibration to encourage the object to vacate the charging area, wherein the presence of the object in the charging area would otherwise degrade the transfer of power from the primary coil to the secondary coil.

13. The method according to claim 12 wherein the motion sensor includes a passive infrared sensor, an ultrasound sensor, or a microwave sensor.

\* \* \* \* \*